(12) United States Patent
Murakami et al.

(10) Patent No.: US 10,096,795 B2
(45) Date of Patent: Oct. 9, 2018

(54) DISPLAY DEVICE AND METHOD FOR MANUFACTURING THE DISPLAY DEVICE

(71) Applicant: SEMICONDUCTOR ENERGY LABORATORY CO., LTD., Atsugi-shi, Kanagawa-ken (JP)

(72) Inventors: Satoshi Murakami, Kanagawa (JP); Hisashi Ohtani, Tochigi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/262,629

(22) Filed: Sep. 12, 2016

(65) Prior Publication Data

US 2017/0069872 A1    Mar. 9, 2017

Related U.S. Application Data

(63) Continuation of application No. 13/731,129, filed on Dec. 31, 2012, now Pat. No. 9,444,069, which is a
(Continued)

(30) Foreign Application Priority Data

Sep. 17, 2004   (JP) ................................ 2004-272628

(51) Int. Cl.
*H01L 51/52*        (2006.01)
*H01L 27/32*        (2006.01)
(Continued)

(52) U.S. Cl.
CPC ...... *H01L 51/5246* (2013.01); *H01L 27/3225* (2013.01); *H01L 27/3246* (2013.01);
(Continued)

(58) Field of Classification Search
CPC ............. H01L 51/5246; H01L 51/3225; H01L 51/3246; H01L 51/3276; H01L 51/5203;
(Continued)

(56) References Cited

U.S. PATENT DOCUMENTS 4,653,864 A   3/1987 Baron et al.
4,678,282 A   7/1987 Yaniv et al.
(Continued)

FOREIGN PATENT DOCUMENTS

CN   001428869 A   7/2003
CN   001434668 A   8/2003
(Continued)

OTHER PUBLICATIONS

Chinese Office Action (Application No. 200510104144.2) dated Jun. 20, 2008.
(Continued)

*Primary Examiner* — Elmito Breval
(74) *Attorney, Agent, or Firm* — Nixon Peabody LLP; Jeffrey L. Costellia

(57) ABSTRACT

It is an object of the present invention to provide a technology for manufacturing a highly reliable display device at a low cost with high yield. In the present invention, a spacer is formed over a pixel electrode, thereby protecting the pixel electrode layer from a mask in formation of an electroluminescent layer. In addition, since a layer that includes an organic material that has water permeability is sealed in a display device with a sealing material and the sealing material and the layer that includes the organic material are not in contact, deterioration of a light-emitting element due to a contaminant such as water can be prevented. The sealing material is formed in a portion of a driver circuit region in the display device, and thus, the narrower frame margin of the display device can also be accomplished.

16 Claims, 23 Drawing Sheets

Related U.S. Application Data continuation of application No. 11/222,759, filed on Sep. 12, 2005, now Pat. No. 8,350,466.

(51) Int. Cl.
*H01L 51/00* (2006.01)
*H01L 51/56* (2006.01)

(52) U.S. Cl.
CPC ...... H01L 27/3276 (2013.01); H01L 51/5203 (2013.01); H01L 51/525 (2013.01); H01L 51/5237 (2013.01); H01L 51/5253 (2013.01); H01L 27/3244 (2013.01); H01L 27/3295 (2013.01); H01L 27/3297 (2013.01); H01L 51/0005 (2013.01); H01L 51/56 (2013.01); H01L 2251/5323 (2013.01)

(58) Field of Classification Search
CPC .............. H01L 51/5253; H01L 27/3244; H01L 27/3295; H01L 27/3297; H01L 51/0005
See application file for complete search history.

(56) References Cited

U.S. PATENT DOCUMENTS

| | | | |
|---|---|---|---|
| 4,759,610 A | 7/1988 | Yanagisawa | |
| 5,119,156 A | 6/1992 | Kawahara et al. | |
| 6,067,134 A | 5/2000 | Akiyama et al. | |
| 6,175,345 B1 | 1/2001 | Kuribayashi et al. | |
| 6,373,453 B1 | 4/2002 | Yudasaka | |
| 6,392,722 B1 | 5/2002 | Sekime et al. | |
| 6,465,268 B2 | 10/2002 | Hirakata et al. | |
| 6,469,439 B2 | 10/2002 | Himeshima et al. | |
| 6,559,594 B2 | 5/2003 | Fukunaga et al. | |
| 6,592,933 B2 | 7/2003 | Himeshima et al. | |
| 6,597,121 B2 | 7/2003 | Imura | |
| 6,638,781 B1 | 10/2003 | Hirakata et al. | |
| 6,720,198 B2 | 4/2004 | Yamagata et al. | |
| 6,743,650 B2 | 6/2004 | Hirakata et al. | |
| 6,768,257 B1 | 7/2004 | Yamada et al. | |
| 6,781,162 B2 | 8/2004 | Yamazaki et al. | |
| 6,787,407 B2 | 9/2004 | Nakamura et al. | |
| 6,798,132 B2 | 9/2004 | Satake | |
| 6,815,723 B2 | 11/2004 | Yamazaki et al. | |
| 6,821,827 B2 | 11/2004 | Nakamura et al. | |
| 6,822,264 B2 | 11/2004 | Yamazaki et al. | |
| 6,828,726 B2 | 12/2004 | Sakurai et al. | |
| 6,833,560 B2 | 12/2004 | Konuma et al. | |
| 6,836,069 B2 | 12/2004 | Iga | |
| 6,852,997 B2 | 2/2005 | Yamazaki et al. | |
| 6,882,102 B2 | 4/2005 | Yamazaki | |
| 6,897,087 B2 | 5/2005 | Yanagawa et al. | |
| 6,911,688 B2 | 6/2005 | Yamazaki et al. | |
| 6,946,361 B2 | 9/2005 | Takayama et al. | |
| 6,952,020 B1 | 10/2005 | Yamazaki et al. | |
| 6,992,439 B2 | 1/2006 | Yamazaki et al. | |
| 7,015,503 B2 | 3/2006 | Seki et al. | |
| 7,021,983 B2 | 4/2006 | Shigeno | |
| 7,038,377 B2 | 5/2006 | Kobayashi et al. | |
| 7,042,149 B2 | 5/2006 | Shigeno | |
| 7,045,861 B2 | 5/2006 | Takayama et al. | |
| 7,049,744 B2 | 5/2006 | Nishikawa et al. | |
| 7,057,209 B2 | 6/2006 | Yamazaki et al. | |
| 7,081,704 B2 | 7/2006 | Yamazaki et al. | |
| 7,094,684 B2 | 8/2006 | Yamazaki et al. | |
| 7,112,115 B1 | 9/2006 | Yamazaki et al. | |
| 7,129,523 B2 | 10/2006 | Yamazaki et al. | |
| 7,132,693 B2 | 11/2006 | Konuma et al. | |
| 7,148,510 B2 | 12/2006 | Yamazaki et al. | |
| 7,169,461 B2 | 1/2007 | Hiruma et al. | |
| 7,190,116 B2 | 3/2007 | Kobayashi et al. | |
| 7,199,516 B2 | 4/2007 | Seo et al. | |
| 7,214,959 B2 | 5/2007 | Seki et al. | |
| 7,265,391 B2 | 9/2007 | Yamazaki et al. | |
| 7,273,801 B2 | 9/2007 | Seki et al. | |
| 7,329,985 B2 | 2/2008 | Yamazaki et al. | |
| 7,361,573 B2 | 4/2008 | Takayama et al. | |
| 7,375,376 B2 | 5/2008 | Yamazaki et al. | |
| 7,384,860 B2 | 6/2008 | Nakamura et al. | |
| 7,420,210 B2 | 9/2008 | Yamazaki et al. | |
| 7,423,293 B2 | 9/2008 | Yamagata et al. | |
| 7,442,955 B2 | 10/2008 | Seki et al. | |
| 7,585,761 B2 | 9/2009 | Yamazaki et al. | |
| 7,629,617 B2 | 12/2009 | Yamazaki et al. | |
| 7,671,369 B2 | 3/2010 | Yamazaki et al. | |
| 7,719,014 B2 | 5/2010 | Yamazaki et al. | |
| 7,728,513 B2 | 6/2010 | Seo et al. | |
| 7,732,824 B2 | 6/2010 | Konuma et al. | |
| RE42,215 E | 3/2011 | Kobayashi et al. | |
| 7,935,967 B2 | 5/2011 | Takayama et al. | |
| 7,964,874 B2 | 6/2011 | Yamazaki et al. | |
| 8,004,183 B2 | 8/2011 | Seo et al. | |
| 8,008,666 B2 | 8/2011 | Yamazaki et al. | |
| 8,040,059 B2 | 10/2011 | Imai et al. | |
| 8,115,210 B2 | 2/2012 | Yamazaki et al. | |
| 8,158,992 B2 | 4/2012 | Konuma et al. | |
| RE43,738 E | 10/2012 | Kobayashi et al. | |
| 8,293,552 B2 | 10/2012 | Takayama et al. | |
| 8,415,669 B2 | 4/2013 | Yamazaki et al. | |
| 8,643,021 B2 | 2/2014 | Yamazaki et al. | |
| 2001/0004469 A1 | 6/2001 | Himeshima et al. | |
| 2001/0017517 A1 | 8/2001 | Yamazaki | |
| 2001/0019133 A1 | 9/2001 | Konuma et al. | |
| 2002/0034930 A1 | 3/2002 | Yamazaki et al. | |
| 2002/0047514 A1 | 4/2002 | Sakurai et al. | |
| 2002/0151252 A1 | 10/2002 | Kawase et al. | |
| 2002/0158570 A1 | 10/2002 | Yamada et al. | |
| 2002/0180371 A1 | 12/2002 | Yamazaki et al. | |
| 2003/0047280 A1 | 3/2003 | Takayama et al. | |
| 2003/0057422 A1 | 3/2003 | Yamazaki et al. | |
| 2003/0122140 A1 | 7/2003 | Yamazaki et al. | |
| 2003/0137325 A1 | 7/2003 | Yamazaki et al. | |
| 2003/0143794 A1 | 7/2003 | Nakamura et al. | |
| 2003/0146439 A1 | 8/2003 | Yamazaki et al. | |
| 2003/0173567 A1 | 9/2003 | Kokubo et al. | |
| 2003/0189400 A1 | 10/2003 | Nishio et al. | |
| 2004/0061118 A1 | 4/2004 | Yamazaki et al. | |
| 2004/0084673 A1 | 5/2004 | Hirakata et al. | |
| 2004/0137142 A1 | 7/2004 | Nishikawa | |
| 2004/0207789 A1 | 10/2004 | Hirakata et al. | |
| 2004/0218112 A1 | 11/2004 | Hirakata et al. | |
| 2005/0067617 A1 | 3/2005 | Yamazaki et al. | |
| 2005/0140291 A1 | 6/2005 | Hirakata et al. | |
| 2006/0081844 A1 | 4/2006 | Hirosue et al. | |
| 2006/0199461 A1 | 9/2006 | Yamazaki et al. | |
| 2007/0015430 A1 | 1/2007 | Nishio et al. | |
| 2007/0036955 A1 | 2/2007 | Hiruma et al. | |
| 2007/0114921 A1 | 5/2007 | Yamazaki et al. | |
| 2007/0146333 A1 | 6/2007 | Yamazaki | |
| 2008/0018229 A1 | 1/2008 | Yamazaki | |
| 2009/0020751 A1 | 1/2009 | Seki et al. | |
| 2010/0295052 A1 | 11/2010 | Yamazaki et al. | |
| 2012/0032178 A1 | 2/2012 | Imai et al. | |
| 2012/0199853 A1 | 8/2012 | Konuma et al. | |
| 2012/0205631 A1 | 8/2012 | Seo et al. | |
| 2013/0001571 A1 | 1/2013 | Yamazaki et al. | |

FOREIGN PATENT DOCUMENTS

| | | |
|---|---|---|
| EP | 0989778 A | 3/2000 |
| EP | 1128436 A | 8/2001 |
| EP | 1331666 A | 7/2003 |
| EP | 1331667 A | 7/2003 |
| EP | 1349208 A | 10/2003 |
| EP | 1376713 A | 1/2004 |
| EP | 1450334 A | 8/2004 |
| EP | 1793650 A | 6/2007 |
| JP | 05-045677 A | 2/1993 |
| JP | 11-339958 A | 12/1999 |
| JP | 2000-105391 A | 4/2000 |
| JP | 2000-129419 A | 5/2000 |
| JP | 2000-353594 A | 12/2000 |
| JP | 2001-203076 A | 7/2001 |
| JP | 2001-250777 A | 9/2001 |

(56) References Cited

FOREIGN PATENT DOCUMENTS

| | | |
|---|---|---|
| JP | 2001-307874 A | 11/2001 |
| JP | 2001-312223 A | 11/2001 |
| JP | 2002-031854 A | 1/2002 |
| JP | 2002-151252 A | 5/2002 |
| JP | 2002-216570 A | 8/2002 |
| JP | 2002-318546 A | 10/2002 |
| JP | 2003-059671 A | 2/2003 |
| JP | 2003-100449 A | 4/2003 |
| JP | 2003-123969 A | 4/2003 |
| JP | 2003-163337 A | 6/2003 |
| JP | 2003-229250 A | 8/2003 |
| JP | 2003-243171 A | 8/2003 |
| JP | 2003-257650 A | 9/2003 |
| JP | 2003-302917 A | 10/2003 |
| JP | 2003-308027 A | 10/2003 |
| JP | 2003-347044 A | 12/2003 |
| JP | 2004-004663 A | 1/2004 |
| JP | 2004-070308 A | 3/2004 |
| JP | 2004-083650 A | 3/2004 |
| JP | 2004-094236 A | 3/2004 |
| JP | 2004-103534 A | 4/2004 |
| JP | 2004-105391 A | 4/2004 |
| JP | 2004-134788 A | 4/2004 |
| JP | 2004-145244 A | 5/2004 |
| JP | 2004-158442 A | 6/2004 |
| JP | 2004-165068 A | 6/2004 |
| JP | 2004-355014 A | 12/2004 |
| JP | 2005-100979 A | 4/2005 |
| JP | 5728559 | 6/2015 |
| JP | 5918834 | 5/2016 |
| WO | WO-2003/060858 | 7/2003 |
| WO | WO-2005/022496 | 3/2005 |

OTHER PUBLICATIONS

Chinese Office Action (Application No. 200910170467.X) dated Jan. 12, 2011.

Pending Claims (U.S. Appl. No. 13/615,805) dated Apr. 14, 2014.

FIG. 20
(A)
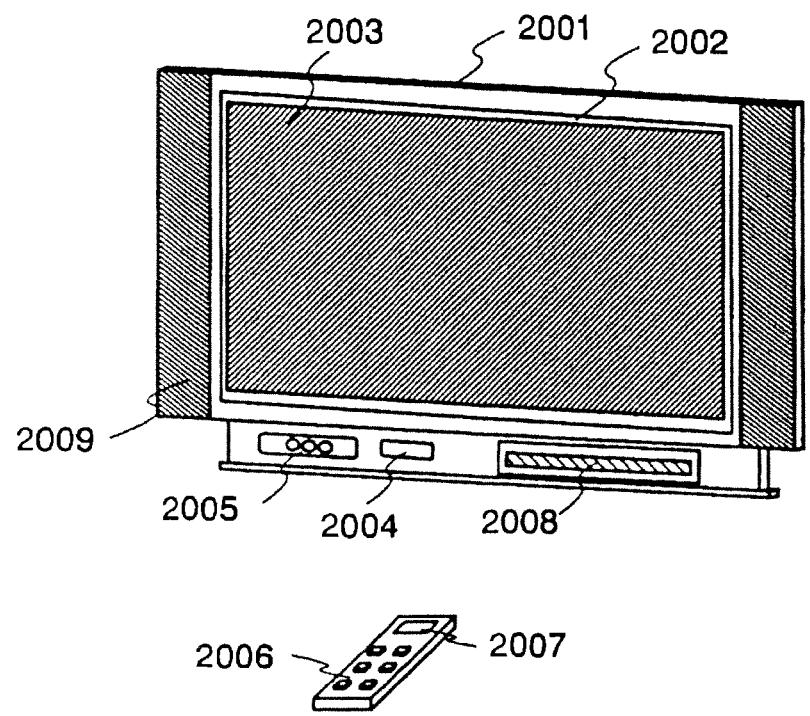
(B)
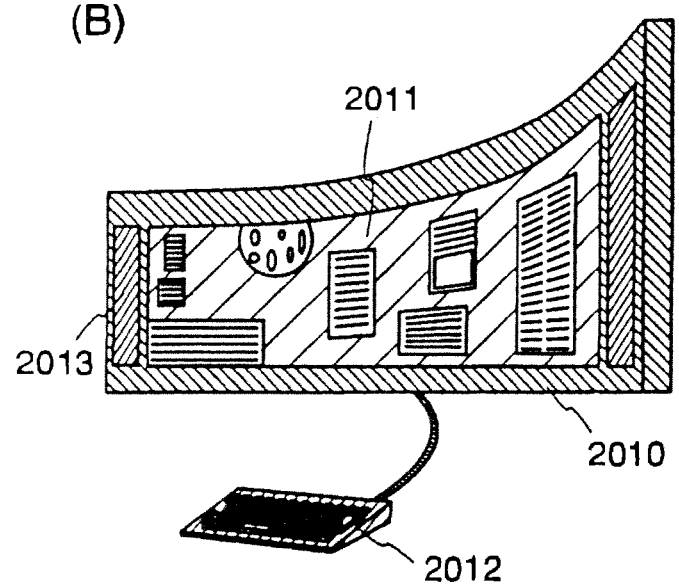

FIG. 21
(A)
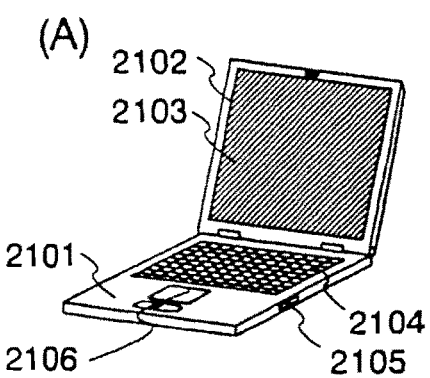
(B)
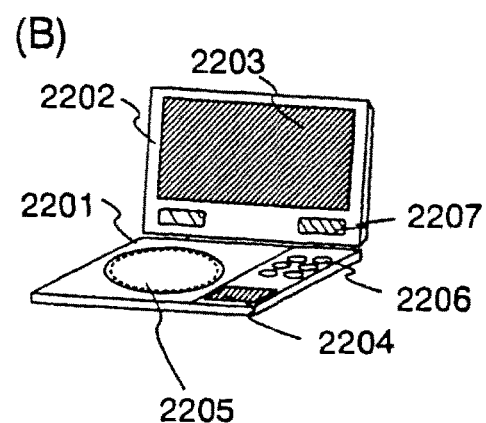
(C)
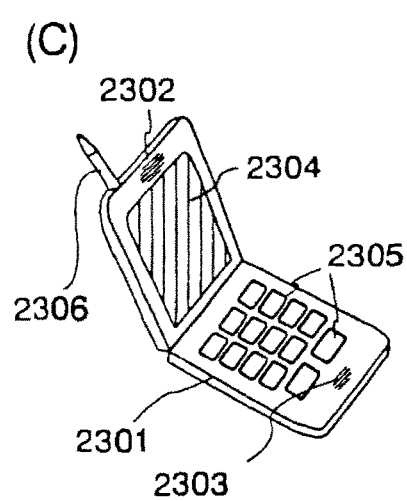
(D)
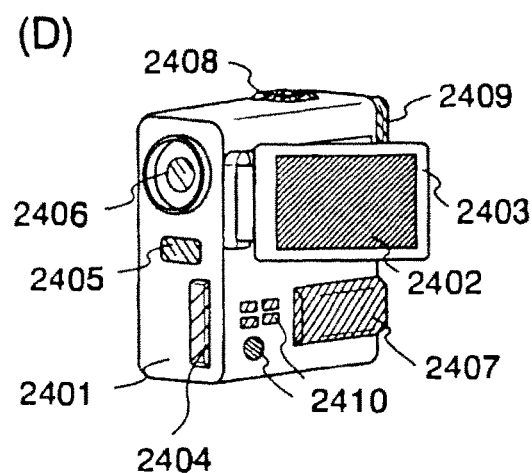

DISPLAY DEVICE AND METHOD FOR MANUFACTURING THE DISPLAY DEVICE

TECHNICAL FIELD

The present invention relates to a display device and a method for manufacturing the display device.

BACKGROUND ART

An EL element has a problem that a luminance property such as luminance or evenness of luminance significantly deteriorates as compared with the beginning when it is driven for a certain period. This low reliability is a factor in the limited practical application.

As one factor of worsening reliability, water, oxygen or the like which enters into the EL element from outside is given.

Development of a display device that has a structure for preventing the deterioration of the EL element has been conducted. In addition, there is also a method by which a sealing material is formed over an insulator provided with an EL element, and an enclosed space surrounded by a covering material and the sealing material is filled with a filler composed of a resin or the like with the use of the sealing material so that the EL element is blocked off from outside (for example, refer to Patent Document 1)

Patent Document 1

Japanese Patent Application Laid-Open No. 2001-203076

DISCLOSURE OF THE INVENTION

Problems to be Solved by the Invention

In the present invention, it is an object to provide a technology for manufacturing a display device that has high reliability, and has superior electric characteristics at a low cost with high yield without complicating a process and an apparatus.

Means for Solving the Problems

The present invention covers a step of an opening with an insulating layer in a contact so that the step is smoothed and forms a gentle shape. A wiring or the like is formed to come in contact with the insulating layer, and thus, the coverage of the wiring is enhanced. In addition, since a layer including an organic material that has water permeability (that can permeate water) is sealed in a display device by a sealing material and the sealing material and the layer including the organic material are not in contact, deterioration of a light-emitting element due to a contaminant such as water can be prevented. The sealing material is formed in a portion of a driver circuit region in the display device, and thus, the narrower frame margin of the display device can also be accomplished.

As for a display device to which the present invention can be applied, there is a light-emitting display device in which a light-emitting element and a TFT are connected; the light-emitting element includes a layer that has an organic material that generates light-emission called electroluminescence (hereinafter also referred to as EL) or a mixture of an organic material and an inorganic material between electrodes.

One of a display device of the present invention includes a pixel region; a connection region; a semiconductor layer that includes an impurity region in the pixel region; a gate insulating layer over the semiconductor layer; a gate electrode layer over the gate insulating layer; a first interlayer insulating layer over the gate electrode layer, where the gate insulating layer and the first interlayer insulating layer have a first opening that reaches the impurity region; a source electrode layer or drain electrode layer in the opening, where the source electrode layer or drain electrode layer covers a portion of the gate electrode layer with the first interlayer insulating layer therebetween; a second interlayer insulating layer over the source electrode layer or drain electrode layer and the first interlayer insulating layer, where the second interlayer insulating layer has a second opening that reaches the source electrode layer or drain electrode layer, where the second opening is provided in the source electrode layer or drain electrode layer that covers the portion of the gate electrode layer with the first interlayer insulating layer therebetween; a first electrode layer that has a spacer in the second opening; a wiring layer provided over the first interlayer insulating layer in the connection region; a second interlayer insulating layer provided over the wiring layer with a third opening that reaches the wiring layer, where an upper edge portion of the third opening is covered with an insulating layer; and a second electrode layer in the third opening in contact with the insulating layer.

One of a display device of the present invention includes a pixel region; a connection region; a semiconductor layer that includes an impurity region in the pixel region; a gate insulating layer over the semiconductor layer; a gate electrode layer over the gate insulating layer; a first interlayer insulating layer over the gate electrode layer, where the gate insulating layer and the first interlayer insulating layer have a first opening that reaches the impurity region; a source electrode layer or drain electrode layer in the opening, where the source electrode layer or drain electrode layer covers a portion of the gate electrode layer with the first interlayer insulating layer therebetween; a second interlayer insulating layer over the source electrode layer or drain electrode layer and the first interlayer insulating layer, where the second interlayer insulating layer has a second opening that reaches the source electrode layer or drain electrode layer, where the second opening is provided in the source electrode layer or drain electrode layer that covers the portion of the gate electrode layer with the first interlayer insulating layer therebetween; a first electrode layer that has a spacer in the second opening; a wiring layer provided over the first interlayer insulating layer in the connection region; a second interlayer insulating layer provided over the wiring layer with a third opening that reaches the wiring layer, where an upper edge portion of the third opening is covered with an insulating layer; and a second electrode layer in the third opening in contact with the insulating layer, where the sealing material is not in contact with the insulating layer.

In the constitution as described above, the spacer and the insulating layer may be separated as shown in FIG. 18, or provided to be connected continuously as shown in FIG. 22. The spacer serves as a spacer for a mask that is used when an electroluminescent layer is formed over the first electrode layer that serves as a pixel electrode layer, but also as a spacer for preventing a display device from being damaged and deformed due to a pressure or impact from the outside after forming the electroluminescent layer and conducting sealing by using a sealing substrate to complete a display device.

One of a display device of the present invention includes a pixel region; a connection region; a semiconductor layer that includes an impurity region in the pixel region; a gate insulating layer over the semiconductor layer, a gate electrode layer over the gate insulating layer; a first interlayer insulating layer over the gate electrode layer, where the gate insulating layer and the first interlayer insulating layer have a first opening that reaches the impurity region; a source electrode layer or drain electrode layer in the opening, where the source electrode layer or drain electrode layer covers a portion of the gate electrode layer with the first interlayer insulating layer therebetween; a second interlayer insulating layer over the source electrode layer or drain electrode layer and the first interlayer insulating layer, where the second interlayer insulating layer has a second opening that reaches the source electrode layer or drain electrode layer, where the second opening is provided in the source electrode layer or drain electrode layer that covers the portion of the gate electrode layer with the first interlayer insulating layer therebetween; a first electrode layer in the second opening; a wiring layer provided over the first interlayer insulating layer in the connection region; a second interlayer insulating layer provided over the wiring layer with a third opening that reaches the wiring layer, where an upper edge portion of the third opening is covered with an insulating layer; and a second electrode layer in the third opening in contact with the insulating layer where the sealing material is not in contact with the insulating layer.

One of a manufacturing method of a display device of the present invention is: a semiconductor layer that includes an impurity region in a pixel region is formed; a gate insulating layer is formed in a connection region and over the semiconductor layer; a gate electrode layer and a conductive layer are formed over the gate insulating layer; a first interlayer insulating layer is formed over the gate electrode layer and the conductive layer, where the gate insulating layer and the first interlayer insulating layer have a first opening that reaches the impurity region; a source electrode layer or drain electrode layer is formed to cover the first opening and a portion of the gate electrode layer; a wiring layer is formed over the first interlayer insulating layer to cover the conductive layer; a second interlayer insulating layer is formed over the first interlayer insulating layer, the wiring layer, the source electrode layer or drain electrode layer; a second opening that reaches the source electrode layer or drain electrode layer and a third opening that reaches the wiring layer are formed, in the second interlayer insulating layer; a first electrode layer is formed in the second opening; an insulating layer is formed to cover an upper edge portion of the third opening in the second interlayer insulating layer and a portion of the first electrode layer; a spacer is formed over the first electrode layer; and a second electrode layer is formed in the third opening in contact with the insulating layer.

One of a manufacturing method of a display device of the present invention is: a semiconductor layer that includes an impurity region in a pixel region is formed; a gate insulating layer is formed in a connection region and over the semiconductor layer; a gate electrode layer and a conductive layer are formed over the gate insulating layer; a first interlayer insulating layer is formed over the gate electrode layer and the conductive layer, where the gate insulating layer and the first interlayer insulating layer have a first opening that reaches the impurity region; a source electrode layer or drain electrode layer is formed to cover the first opening and a portion of the gate electrode layer; a wiring layer is formed over the first interlayer insulating layer to cover the conductive layer; a second interlayer insulating layer is formed over the first interlayer insulating layer, the wiring layer, and the source electrode layer or drain electrode layer; a second opening that reaches the source electrode layer or drain electrode layer and a third opening that reaches the wiring layer are formed, in the second interlayer insulating layer; a first electrode layer is formed in the second opening; an insulating layer is formed to cover an upper edge portion of the third opening in the second interlayer insulating layer and a portion of the first electrode layer; a spacer is formed over the first electrode layer; a second electrode layer is formed in the third opening in contact with the insulating layer; and a sealing material is formed over the first interlayer insulating layer so as not to be in contact with the insulating layer.

One aspect of a manufacturing method of a display device according to the present invention is: a semiconductor layer that includes an impurity region in a pixel region is formed; a gate insulating layer is formed in a connection region and over the semiconductor layer; a gate electrode layer and a conductive layer are formed over the gate insulating layer; a first interlayer insulating layer is formed over the gate electrode layer and the conductive layer, where the gate insulating layer and the first interlayer insulating layer have a first opening that reaches the impurity region; a source electrode layer or drain electrode layer is formed to cover the first opening and a portion of the gate electrode layer; a wiring layer is formed over the first interlayer insulating layer to cover the conductive layer; a second interlayer insulating layer is formed over the first interlayer insulating layer, the wiring layer, the source electrode layer or drain electrode layer; a second opening that reaches the source electrode layer or drain electrode layer and a third opening that reaches the wiring layer are formed, in the second interlayer insulating layer; a first electrode layer is formed in the second opening; an insulating layer is formed to cover an upper edge portion of the third opening in the second interlayer insulating layer and a portion of the first electrode layer; a second electrode layer is formed in the third opening in contact with the insulating layer; and a sealing material is formed over the first interlayer insulating layer so as not to be in contact with the insulating layer.

In the constitution as described above, the spacer and the insulating layer may be formed in other processes, or formed by using the same material and in the same process.

Effect of the Invention

By using the present invention, a highly reliable display device can be manufactured through a simplified process. Therefore, a display device that exhibits high-precision and high-quality images can be manufactured at a low cost with high yield.

BEST MODE FOR CARRYING OUT THE INVENTION

Embodiment Modes of the present invention will be described in detail with reference to drawings. The present invention is not limited the following description, and it is easily understood by those skilled in the art that modes and details can be modified in various ways without departing from the spirit and the scope of the invention. Therefore, the present invention should not be interpreted as being limited to what is described in the embodiment modes to be given below. It is to be noted that the same reference numerals are used in common for the same portions and portions with the same function in different drawings, and the description thereof is omitted in the structure of the present invention to be described below.

Embodiment Mode 1

A method for manufacturing a thin film transistor in the present embodiment mode will be described in detail by using to FIG. 1 to FIG. 3.

FIG. 16(A) is a top view that illustrates a structure of a display panel relating to the present invention. A pixel portion 2701 in which pixels 2702 are arranged over a matrix, a scanning line input terminal 2703, and a signal line input terminal 2704 are formed over a substrate 2700 that has an insulating surface. The number of pixels may be provided depending on various standards, and the number may be 1024×768×3 (RGB) in XGA, 1600×1200×3 (RGB) in UXGA, and 1920×1080×3 (RGB) in order to be ready for a full-speck high vision.

The pixels 2702 are arranged in a matrix by crossing a scanning line extended from the scanning line input terminal 2703 and a signal line extended from the signal line input terminal 2704. Each of the pixels 2702 is provided with a switching element and a pixel electrode layer connected thereto. A typical example of the switching element is a TFT, and a gate electrode layer side of a TFT is connected to the scanning line, and a source or drain side thereof is connected to the signal line; therefore, each pixel can be independently controlled by a signal inputted from outside.

As main components of a TFT, a semiconductor layer, a gate insulating layer, and a gate electrode layer are given, and a wiring layer connected to source and drain regions which are formed in the semiconductor layer accompanies thereto. In terms of a structure, a top gate type in which a semiconductor layer, a gate insulating layer and a gate electrode layer are provided from the substrate side; a bottom gate type in which a gate electrode layer, a gate insulating layer and a semiconductor layer are provided from the substrate side; and the like are typically known. Any of the structures may be applied to the present invention.

FIG. 16(A) shows a structure of a display panel which controls a signal to be inputted into the scanning line and the signal line by an external driver circuit. As shown in FIG. 17(A), a driver IC 2751 may be mounted over a substrate 2700 by a COG (Chip on Glass) method. As another mounting mode, a TAB (Tape Automated Bonding) method may also be employed as shown in FIG. 17(B). The driver IC may be the one formed over a single crystalline semiconductor substrate, or may be the one in which a circuit is formed by using a TFT over a glass substrate. In FIG. 17, the driver IC 2751 is connected to an FPC (flexible printed circuit) 2750.

When a TFT to be provided in a pixel is formed by using a semiconductor that has crystallinity, a scanning line driver circuit 3702 may be formed over a substrate 3700 to be integrated as shown in FIG. 16(B). In FIG. 16(B), a pixel portion 3701 is controlled by an external driver circuit connected to a signal line input terminal 3704 in the same manner as FIG. 16(A). In the case where a TFT to be provided in a pixel is formed by using a polycrystalline (microcrystalline) semiconductor, a single crystalline semiconductor or the like that have high mobility, a pixel portion 4701, a scanning line driver circuit 4702 and a signal line driver circuit 4704 can also be formed over a substrate 4700 to be integrated as in FIG. 16(C).

As shown in FIG. 2, on a substrate 100 that has an insulating surface, a base film 101a of 10 to 200 nm (preferably, 50 to 100 nm) is formed by using a silicon nitride oxide (SiNO) film, and a base film 101b of 50 to 200 nm (preferably, 100 to 150 nm) is stacked thereon by using a silicon oxynitride (SiON) film as a base film with the use of a sputtering method, a PVD (Physical Vapor Deposition) method, a CVD (Chemical Vapor Deposition) method such as a low-pressure CVD (LPCVD) method or a plasma CVD method, or the like. In the present embodiment mode, a plasma CVD method is used to form the base film 101a and the base film 101b. As the substrate 100, a glass substrate, a quartz substrate, a silicon substrate, a metal substrate such as an SUS substrate, or a stainless substrate on the surface of which an insulating film is formed, may be used. Further, a plastic substrate that has heat-resistance which can withstand a process temperature of the present embodiment mode, or a flexible substrate such as a film may also be used. As the plastic substrate, substrates composed of PET (polyethylene terephthalate), PEN (polyethylene naphthalate) or PES (polyester sulfide) can be used, and a synthetic resin such as acrylic can be used as the flexible substrate.

As the base film, silicon oxide, silicon nitride, silicon oxynitride, silicon nitride oxide or the like can be employed, and a single layer, or a two-layer or three-layer stacked structure may be adopted. It is to be noted that, in the present specification, silicon oxynitride is a substance in which the composition ratio of oxygen is higher than the composition ratio of nitrogen, and can be called a silicon oxide that contains nitrogen. Similarly, silicon nitride oxide is a substance in which the composition ratio of nitrogen is higher than the composition ratio of oxygen, and can be called a silicon nitride that contains oxygen. In the present embodiment mode, a silicon nitride oxide film is formed to have a film thickness of 50 nm by using $SiH_4$, $NH_3$, $N_2O$, $N_2$ and $H_2$ as a reactive gas, and a silicon oxynitride film is formed to have a film thickness of 100 nm by using $SiH_4$ and $N_2O$ as a reactive gas on a substrate. Furthermore, the film thickness of the silicon nitride oxide film may be 140 nm, and the film thickness of the silicon oxynitride film to be stacked thereon may be 100 nm.

Subsequently, a semiconductor film is formed on the base film. The semiconductor film may be formed to have a thickness of 25 to 200 nm (preferably, 30 to 150 nm) by a known method (a sputtering method, an LPCVD method, a plasma CVD method, or the like). In the present embodiment mode, it is preferable to use a crystalline semiconductor film that is obtained by conducting laser crystallization to an amorphous semiconductor film.

As a material for forming a semiconductor film, an amorphous semiconductor (hereinafter also referred to as "AS") manufactured by using a semiconductor material gas typified by silane or germane with the use of a vapor phase growth method or a sputtering method; a polycrystalline semiconductor that is formed by crystallizing the amorphous semiconductor with the use of light energy or thermal energy; a semi-amorphous (also referred to as microcrystalline, and hereinafter also referred to as "SAS") semiconductor; or the like can be used.

SAS is a semiconductor which has an intermediate structure between amorphous and crystal structures (including a single crystal and a polycrystal); a third condition that is stable in terms of free energy; and includes a crystalline region that has a short range order and lattice distortion. A crystalline region of 0.5 to 20 nm can be observed at least in part of region in the film. In the case where silicon is a main component, Raman spectrum is shifted to a wave number side lower than 520 cm$^{-1}$. Diffraction peaks of (111) and (220) that are said to be caused due to a crystal lattice of silicon are observed in X-ray diffraction. At least 1 atomic % or more of hydrogen or halogen is contained to terminate a dangling bond (dangling bond). SAS is formed by grow discharge decomposition (plasma CVD) of a silicide gas. As the silicide gas, $SiH_4$, and $Si_2H_6$, $SiH_2Cl_2$, $SiHCl_3$, $SiCl_4$, $SiF_4$ or the like can be used. Moreover, $F_2$, $GeF_4$ may be mixed therein. This silicide gas may be diluted with $H_2$, or $H_2$ and one or more of the rare gas elements of He, Ar, Kr, and Ne. A dilution factor ranges from 2- to 1000-fold. Pressure ranges approximately from 0.1 Pa to 133 Pa, and a power frequency ranges from 1 MHz to 120 MHz, preferably from 13 MHz to 60 MHz. A substrate heating temperature is preferably 300° C. or less, and it can also be formed at a substrate heating temperature of 100 to 200° C. It is desirable that, as for an impurity element that is taken in mainly in film formation, an impurity from an atmospheric constituent such as oxygen, nitrogen, or carbon be $1\times10^{20}$ cm$^3$ or less, specifically, an oxygen concentration be $5\times10^{19}$ cm$^{-3}$ or less, preferably $1\times10^{19}$ cm$^{-3}$ or less. Further, a rare gas element such as helium, argon, krypton or neon is included to promote lattice distortion so that stability is enhanced and a favorable SAS can be obtained. In addition, an SAS layer formed by using a silicide gas that contains hydrogen may be stacked on an SAS layer formed by using a silicide gas that contains fluorine as the semiconductor film.

As an amorphous semiconductor, hydrogenated amorphous silicon is typically given, and as a crystalline semiconductor, polysilicon is typically given. Polysilicon (polycrystalline silicon) includes so-called high temperature polysilicon that uses polysilicon which is formed at a process temperature of 800° C. or higher as a main material; so-called low temperature polysilicon that uses polysilicon which is formed at a process temperature of 600° C. or lower as a main material; polysilicon crystallized by being added with an element which promotes crystallization or the like; and the like. Obviously, as described above, a semiamorphous semiconductor or a semiconductor which contains a crystal phase in a portion of the semiconductor film can also be used.

In the case where a crystalline semiconductor film is used as the semiconductor film, a known method (a laser crystallization method, a thermal crystallization method, a thermal crystallization method that uses an element for promoting crystallization of nickel or the like) may be employed as a method for manufacturing a crystalline semiconductor film. In addition, in order to enhance crystallinity, a microcrystalline semiconductor that is an SAS can be crystallized by laser irradiation. In the case where an element for promoting crystallization is not introduced, hydrogen is released until the hydrogen concentration included in an amorphous semiconductor film becomes $1\times10^{20}$ atoms/cm$^3$ or less by heating for one hour at a temperature of 500° C. in a nitrogen atmosphere before irradiating the amorphous semiconductor film with laser light. This is because an amorphous semiconductor film is destroyed when the amorphous semiconductor film that contains much hydrogen is irradiated with laser light. As a heat treatment for crystallization, a heating furnace, laser irradiation, irradiation of light emitted from a lamp (also referred to as lamp-annealing) and the like can be employed. As the heating method, there are RTA methods such as a GRTA (Gas Rapid Thermal Anneal) method or an LRTA (Lamp Rapid Thermal Anneal) method.

A method for introducing a metal element into the amorphous semiconductor film is not particularly limited as long as the method is capable of making the metal element exist on the surface of or inside the amorphous semiconductor film. For example, a sputtering method, a CVD method, a plasma treatment method (including a plasma CVD method), an adsorption method, or a method for applying a metal salt solution can be employed. Among them, the method that uses a solution is simple and advantageous in terms of easy concentration adjustment of the metal element. It is desirable to form an oxide film by UV light irradiation in an oxygen atmosphere, a thermal oxidation method, a treatment with ozone water that includes a hydroxyl radical or hydrogen peroxide, or the like in order to improve wettability of the surface of the amorphous semiconductor film and to spread the aqueous solution over the entire surface of the amorphous semiconductor film.

A crystal that has a large grain size can be obtained by using a continuous wave solid-state laser for irradiation of laser light that has the second harmonic to the forth harmonic of the fundamental wave. For example, it is preferable to use the second harmonic (532 nm) or the third harmonic (355 nm) of an Nd:YVO$_4$ laser (fundamental wave: 1064 nm), typically. Specifically, laser light emitted from a continuous wave YVO$_4$ laser is converted into the harmonic by a non-linear optical element to obtain laser light that has an output of several W or more. Then, rectangular or elliptical laser light is preferably shaped on an irradiated surface by an optical system to irradiate the semiconductor film. The power density at this point needs to be approximately 0.001 to 100 MW/cm$^2$ (preferably, 0.1 to 10 MW/cm$^2$). Then, the scanning speed is made to be approximately 0.5 to 2000 cm/sec (preferably, 10 to 200 cm/sec) for irradiation.

It is preferable that the shape of the laser beam be linear. As a result, the throughput can be improved. Further, the laser is preferably emitted with an incident angel θ (0°<θ<90°) with respect to the semiconductor film. This is because interference of a laser can be prevented.

Laser irradiation can be conducted by scan of the semiconductor film relatively to this laser. In laser irradiation, a marker can be formed so as to overlap beams with good accuracy or control the starting position of laser irradiation and finishing position of laser irradiation. The marker may be formed over the substrate at the same time as the amorphous semiconductor film.

As the laser, a continuous wave or pulsed gas laser, solid-state laser, copper vapor laser or gold vapor laser can be used. As the gas laser, there are an excimer laser, an Ar laser, a Kr laser, a He—Cd laser and the like. As the solid-state laser, there are a YAG laser, a YVO$_4$ laser, a YLF laser, a YAlO$_3$ laser, a Y$_2$O$_3$ laser, a glass laser, a ruby laser, an alexandrite laser, a Ti: Sapphire laser, and the like.

Moreover, at the repetition frequency of pulsed laser light of 0.5 MHz or more, a frequency band that is extremely higher than a frequency band of several ten Hz to several hundred Hz, which is usually used, may be used to conduct laser crystallization. It is said that it takes several ten nsec to several hundred nsec to completely solidify a semiconductor film after the semiconductor film is irradiated with the pulsed laser light. Therefore, by using the frequency band as described above, next pulsed laser light irradiation is possible after the semiconductor film is melted by the laser light and before the semiconductor film is solidified. Thus, since the solid-liquid interface can be continuously moved in the semiconductor film, a semiconductor film that has a crystal grain continuously grown toward the scanning direction is formed. Specifically, it is possible to form a crystal grain aggregation in which the included crystal grains have a width of 10 to 30 μm in the scanning direction and a width of approximately 1 to 5 μm in a direction perpendicular to the scanning direction. It is also possible to form a semiconductor film that has almost no crystal grain boundaries at least in the channel direction of a thin film transistor by forming a single-crystal grain long extended along the scanning direction.

In addition, laser light irradiation may be conducted in an inert gas atmosphere such as a rare gas or nitrogen. This can suppress the roughness of a semiconductor surface by the laser light irradiation and can reduce variations in threshold value, which are caused due to variations in interface state density.

The crystallization of the amorphous semiconductor film may be conducted by combining crystallizations with a heat treatment and laser light irradiation, alternatively, the heat treatment or the laser light irradiation may be separately performed plural times.

In the present embodiment mode, an amorphous semiconductor film is formed on the base film 101b, and the amorphous semiconductor film is crystallized to form a crystalline semiconductor film. As the amorphous semiconductor film, amorphous silicon formed by using $SiH_4$ and $H_2$ as a reactive gas is used. In the present embodiment mode, the base film 101a, the base film 101b and the amorphous semiconductor film are continuously formed by changing reactive gases without breaking vacuum (while keeping the vacuum) in the same chamber at the same temperature of 330° C.

An oxide film formed on the amorphous semiconductor film is removed. Then, an oxide film is formed to be 10 to 50 Å nm by UV light irradiation in an oxygen atmosphere, a thermal oxidation method, a treatment using ozone water that includes hydroxyl radical or hydrogen peroxide, or the like. In the present embodiment mode, Ni is used as the element for promoting crystallization. An aqueous solution that includes Ni acetate of 10 ppm is applied by a spin coating method.

In the present embodiment mode, a heat treatment is conducted at 650° C. for six minutes by an RTA method. Thereafter, an oxide film formed on the semiconductor film is removed and the semiconductor film is irradiated with laser light. The amorphous semiconductor film is formed as a crystalline semiconductor film by the crystallization treatment as described above.

When crystallization using a metal element is conducted, a gettering process is conducted so as to reduce or remove the metal element. In the present embodiment mode, an amorphous semiconductor film is used as a gettering sink to getter the metal element. First, an oxide film is formed on the crystalline semiconductor film by UV light irradiation in an oxygen atmosphere, a thermal oxidation method, a treatment using ozone water that includes hydroxyl radical or hydrogen peroxide, or the like. The oxide film is preferably made thick by a heat treatment. In the present embodiment mode, after the oxide film is formed, the oxide film is made thick by a thermal treatment at 650° C. for six minutes with the use of an RTA method. Thereafter, an amorphous semiconductor film of 30 nm thick is formed by a plasma CVD method (the condition is 350 W and 35 Pa in the present embodiment mode).

After that, a heat treatment at 650° C. for six minutes is conducted by an RTA method to reduce or remove the metal element. The heat treatment may be conducted in a nitrogen atmosphere. The amorphous semiconductor film that has served as a gettering sink and the oxide film formed on the amorphous semiconductor film are removed with hydrofluoric acid or the like, thereby obtaining a crystalline semiconductor film 102 in which the metal element is reduced or removed (refer to FIG. 2(A)). In the present embodiment mode, TMAH (tetramethyl ammonium hydroxide) is used for removing the amorphous semiconductor film that has served as a gettering sink.

The semiconductor film that is thus obtained may be doped with a minute amount of an impurity element (boron or phosphorus) in order to control a threshold value of a thin film transistor. This doping of an impurity element may be conducted to the amorphous semiconductor film before a crystallization process. When doping of an impurity element is conducted to a state of the amorphous semiconductor film, the impurity element can also be activated by a subsequent heat treatment for crystallization. In addition, defects or the like generated in doping can also be improved.

Next, the crystalline semiconductor film 102 is patterned by using a mask. In the present embodiment mode, an oxide film formed on the crystalline semiconductor film 102 is removed, and then, a new oxide film is formed. Then, a photo mask is formed, and a semiconductor layer 103, a semiconductor layer 104, a semiconductor layer 105 and a semiconductor layer 106 are formed by a patterning treatment using a photolithography method.

As an etching process in patterning, either plasma etching (dry etching) or wet etching may be employed; however, the plasma etching is suitable for processing a large area substrate. A gas that contains fluorine such as $CF_4$ and $NF_3$, or a gas that contains chlorine such as $Cl_2$ and $BCl_3$ is used as the etching gas, and an inert gas such as He or Ar may be appropriately added. In addition, when an etching process using atmospheric pressure discharge is applied, local discharge processing is also possible and a mask layer is not required to be formed over an entire surface of the substrate.

In the present invention, a conductive layer for forming a wiring layer or an electrode layer, a mask layer for forming a predetermined pattern, or the like may be formed by a method by which a pattern can be selectively formed, such as a droplet discharging method. By the droplet discharging (jetting) method (also referred to as an inkjet method depending on the system thereof), a predetermined pattern (a conductive layer, an insulating layer or the like) can be formed by selectively discharging (jetting) droplets of a composition prepared for a specific purpose. In this case, a treatment for controlling wettability or adhesion may be performed in a formation region. In addition, a method for transferring or drawing a pattern, for example, a printing method (a method for forming a pattern, e.g., a screen printing or an offset printing) or the like can also be used.

In the present embodiment mode, as a mask to be used, a resin material such as an epoxy resin, an acrylic resin, a phenol resin, a novolac resin, a melamine resin, or an urethane resin is used. Alternatively, an organic material such as benzocyclobutene, parylene, flare and polyimide that has transmitting property; a compound material formed by polymerization of a siloxane polymer or the like; a composition material that contains a water-soluble homopolymer and a water-soluble copolymer; or the like can also be used. In addition, a commercially available resist material that contains a photosensitive agent may also be used. For example, it is possible to use a resist that includes a novolac resin and a naphthoquinonediazide compound that is a photosensitive agent, which is a typical positive resist; or a resist that includes a base resin, diphenylsilanediol, an acid generating material and the like, which is a negative resist.

When a droplet discharging method is used, with the use of any material, the surface tension and the viscosity thereof are appropriately adjusted by controlling the solvent concentration, adding a surfactant, or the like.

The oxide film on the semiconductor layer is removed, and then, a gate insulating layer 107 that covers the semiconductor layer 103, the semiconductor layer 104, the semiconductor layer 105 and the semiconductor layer 106 is formed. An insulating film that contains silicon is formed to be 10 to 150 µm thick by a plasma CVD method or a sputtering method to form the gate insulating layer 107. As the gate insulating layer 107, a known material, e.g., an oxide material or a nitride material of silicon typified by silicon nitride, silicon oxide, silicon oxynitride or silicon nitride oxide, may be used, and either a stacked-layer structure or a single layer structure may be employed. In the present embodiment mode, a three-layer stacked structure of a silicon nitride film, a silicon oxide film and a silicon nitride film is used as the gate insulating layer. In addition to that, a single layer of a silicon oxynitride film or a two-layer stacked structure may be employed. It is preferable to use a silicon nitride film that has dense film quality. Moreover, a silicon oxide film that has a thin thickness, namely, 1 to 100 nm thick, preferably 1 to 10 nm thick, more preferably 2 to 5 nm, may be formed between the semiconductor layer and the gate insulating layer. As the method for forming a thin silicon oxide film, a thermal oxide film is formed by oxidizing a surface of the semiconductor region by a GRTA method, an LRTA method or the like so that the silicon oxide film that has a thin film thickness can be formed. It is to be noted that a rare gas element such as argon may be contained in a reactive gas and mixed in an insulating film to be formed in order to form a dense insulating film with less gate-leak current at a low film-formation temperature.

Then, a first conductive film 108 of 20 to 100 nm thick and a second conductive film 109 of 100 to 400 nm thick are formed to be stacked as a gate electrode layer over the gate insulating layer 107 (refer to FIG. 2(B)). The first conductive film 108 and the second conductive film 109 can be formed by a known method such as a sputtering method, an evaporation method and a CVD method. The first conductive film 108 and the second conductive film 109 may be formed by an element selected from tantalum (Ta), tungsten (W), titanium (Ti), molybdenum (Mo), aluminum (Al), copper (Cu), chrome (Cr) and neodymium (Nd), or an alloy material or a compound material mainly containing the elements. In addition, as the first conductive film 108 and the second conductive film 109, a semiconductor film typified by a polycrystalline silicon film doped with an impurity element such as phosphorus or an AgPdCu alloy may be used. In addition, a three-layer structure may be employed without being limited to the two-layer structure, in which, for example, a tungsten film of 50 nm thick as the first conductive film, a aluminum-silicon (Al—Si) alloy film of 500 nm as the second conductive film, and a titanium nitride film of 30 nm thick as the third conductive film are stacked sequentially. In the case of the three-layer structure, tungsten nitride may be used instead of tungsten as the first conductive film, an aluminum-titanium (Al—Ti) alloy film may be used instead of the aluminum-silicon (Al—Si) alloy film as the second conductive film, or a titanium film may be used instead of the titanium nitride film as the third conductive film. Alternatively, a single layer structure may be adopted. In the present embodiment mode, tantalum nitride (TaN) of 30 nm thick is formed as the first conductive film 108, and tungsten (W) of 370 nm thick is formed as the second conductive film 109.

Then, a mask 110a, a mask 110b, a mask 110c, a mask 110d and a mask 110f are formed by using resist by a photolithography method, and the first conductive film 108 and the second conductive film 109 are patterned to form a first gate electrode layer 121, a first gate electrode layer 122, a conductive layer 123, a first gate electrode layer 124, a first gate electrode layer 125, a first gate electrode layer 126, and a conductive layer 111, a conductive layer 112, a conductive layer 113, a conductive layer 114, a conductive layer 115 and a conductive layer 116 (refer to FIG. 2(C)). The first gate electrode layer 121, the first gate electrode layer 122, the conductive layer 123, the first gate electrode layers 124, the first gate electrode layer 125, the first gate electrode layer 126, and the conductive layer 111, the conductive layer 112, the conductive layer 113, the conductive layer 114, the conductive layer 115 and the conductive layer 116 can be etched to have a desired tapered shape by appropriately adjusting an etching condition (the amount of electric power applied to a coil-shaped electrode layer, the amount of electric power applied to an electrode layer on a substrate side, electrode temperature on a substrate side, or the like) with the use of an ICP (Inductively Coupled Plasma) etching method. As for the tapered shape, the angle or the like can be controlled depending on the shape of the mask 110a, the mask 110b, the mask 110c, the mask 110d and the mask 110f. As the etching gas, a chlorine-based gas typified by $Cl_2$, $BCl_3$, $SiCl_4$, $CCl_4$, or the like, a fluorine-based gas typified by $CF_4$, $CF_5$, $SF_6$, $NF_3$, or the like, or $O_2$ can be appropriately used. In the present embodiment mode, the second conductive film 109 is etched by using an etching gas that includes $CF_5$, $Cl_2$ and $O_2$, and the first conductive film 108 is etched continuously by using an etching gas that includes $CF_5$ and $Cl_2$.

Next, the conductive layer 111, the conductive layer 112, the conductive layer 113, the conductive layer 114, the conductive layer 115 and the conductive layer 116 are patterned by using the mask 110a, the mask 110b, the mask 110 c, the mask 110d and the mask 110f. At this time, the conductive layers are etched under the condition where the selectivity of the second conductive film 109 that forms the conductive layer and the first conductive film 108 that forms the first gate electrode layer is high. By this etching, the conductive layer 111, the conductive layer 112, the conductive layer 113, the conductive layer 114, the conductive layer 115 and the conductive layer 116 are etched to form a second gate electrode layer 131, a second gate electrode layer 132, a conductive layer 133, a second gate electrode layer 134, a second gate electrode layer 135 and a second gate electrode layer 136. In the present embodiment mode, the third conductive layer also has a tapered shape, and the taper angle thereof is larger than the taper angles of the first gate electrode layer 121, the first gate electrode layer 122, the conductive layer 123, the first gate electrode layer 124, the first gate electrode layer 125 and the first gate electrode layer 126. It is to be noted that the taper angle is an angle of a side face with respect to the surfaces of the first gate electrode layer, the second gate electrode layer and the conductive layer. Therefore, when the taper angle is made large to be 90 degrees, the conductive layer has a vertical side face and the tapered shape is lost. In the present embodiment mode, $Cl_2$, $SF_6$ and $O_2$ are used as an etching gas for forming the second gate electrode layer.

In the present embodiment mode, the first gate electrode layers, the conductive layers and the second gate electrode layers are formed to have tapered shapes, and thus, both of the two gate electrode layers have tapered shapes. However, the present invention is not limited thereto, and only one layer of the gate electrode layers may have a tapered shape, and the other thereof may have a perpendicular side face formed by anisotropic etching. As in the present embodiment mode, the taper angels may be different between the gate electrode layers that are stacked, or may be the same. The coverage of a film to be stacked thereover is enhanced by having the tapered shape, and defects are reduced, thereby enhancing reliability.

Through the above mentioned process, a gate electrode layer 117 that includes the first gate electrode layer 121 and the second gate electrode layer 131, and a gate electrode layer 118 that includes the first gate electrode layer 122 and the second gate electrode layer 132 can be formed in a peripheral driver circuit region 204; a gate electrode layer 127 that includes the first gate electrode layer 124 and the second gate electrode layer 134, a gate electrode layer 128 that includes the first gate electrode layer 125 and the second gate electrode layer 135, and a gate electrode layer 129 that includes the first gate electrode layer 126 and the second gate electrode layer 136 can be formed in a pixel region 206; a conductive layer 130 that includes the conductive layer 123 and the conductive layer 133 can be formed in a connection region 205 (refer to FIG. 2(D)). In the present embodiment mode, the gate electrode layer is formed by dry etching; however, wet etching may also be employed.

The gate insulating layer 107 is etched to some extent by the etching process for forming the gate electrode layer, and thus, the film thickness may be reduced (made thinner, so called reduced-film).

In forming the gate electrode layer, a thin film transistor that can operate at high speed can be formed by narrowing the width of the gate electrode layer. Two methods for making the width in the channel direction of the gate electrode layer thinner are shown hereinafter.

In the first method, a mask for the gate electrode layer is formed, and then, the mask is slimed in the width direction by etching, ashing or the like to form a mask that has a much thinner width. The gate electrode layer can be formed to have a thin shape by using a mask that has been formed in advance to have a thin shape.

Then, in the second method, a normal mask is formed, and the gate electrode layer is formed by using the mask. Then, the obtained gate electrode layer is further side-etched in the width direction to be thinned. Thus, the gate electrode layer that has a thin width can be formed finally. Through the above-described process, a thin film transistor that has a short channel length can be formed later, and a thin film transistor that can operate at high speed can be manufactured.

Next, by using the gate electrode layer 117, the gate electrode layer 118, the gate electrode layer 127, the gate electrode layer 128, the gate electrode layer 129 and the conductive layer 130 as masks, an impurity element 151 that imparts n-type conductivity is added to form a first n-type impurity region 140a, a first n-type impurity region 140b, a first n-type impurity region 141a, a first n-type impurity region 141b, a first n-type impurity region 142a, a first n-type impurity region 142b, a first n-type impurity region 142c, a first n-type impurity region 143a and a first n-type impurity region 143b (refer to FIG. 3(A)). In the present embodiment mode, phosphine (PH$_3$) (the composition ratio of P is 5%) is used as a doping gas that contains an impurity element, and the doping is conducted under the conditions of gas flow rate of 80 sccm, beam current of 54 μA/cm, accelerating voltage of 50 kV, and an added dose amount of $7.0 \times 10^{13}$ ions/cm$^2$. Here, the first n-type impurity region 140a, the first n-type impurity region 140b, the first n-type impurity region 141a, the first n-type impurity region 141b, the first n-type impurity region 142a, the first n-type impurity region 142b, the first n-type impurity region 142c, the first n-type impurity region 143a and the first n-type impurity region 143b are doped with the impurity element that imparts n-type conductivity such that the impurity element is included at the concentration of about $1 \times 10^{17}$ to $5 \times 10^{18}$/cm$^3$. In the present embodiment mode, phosphorus (P) is used as the impurity element that imparts n-type conductivity.

In the present embodiment mode, a region in which the impurity region overlaps with the gate electrode layer with the gate insulating layer therebetween is referred to as Lov region, whereas a region in which the impurity region does not overlap with the gate electrode layer with the gate insulating layer therebetween is referred to as Loff region. In FIG. 3, hatching and a white background are used to show this in the impurity region. This does not mean that the portion with the white background is not doped with the impurity element, but this is made for instinctively understanding that the concentration distribution of the impurity element in the regions reflects masks or doping conditions. It is to be noted that this also applies to the other drawings in the present specification.

Next, a mask 153a, a mask 153b, a mask 153c and a mask 153d each of which covers the semiconductor layer 103, a portion of the semiconductor layer 105 and the semiconductor layer 106 are formed. An impurity element 152 that imparts n-type conductivity is added by using the mask 153a, the mask 153b, the mask 153c, the mask 153d and the gate electrode layer 132 as masks to form a second n-type impurity region 144a, a second n-type impurity region 144b, a third n-type impurity region 145a, a third n-type impurity region 145b, a second n-type impurity region 147a, a second n-type impurity region 147b, a second n-type impurity region 147c, a third n-type impurity region 148a, a third n-type impurity region 148b, a third n-type impurity region 148c and a third n-type impurity region 148d. In the present embodiment mode, PH$_3$ (the composition ratio of P is 5%) is used as a doping gas that contains an impurity element, and the doping is conducted under the conditions of gas flow rate of 80 sccm, beam current of 540 μA/cm, accelerating voltage of 70 kV, and an added dose amount of $5.0 \times 10^{15}$ ions/cm$^2$. Here, the second n-type impurity region 144a and the second n-type impurity region 144b are doped with the impurity element that imparts n-type conductivity such that the impurity element is included at the concentration of about $5 \times 10^{19}$ to $5 \times 10^{20}$/cm$^3$. The third impurity region 145a and the third impurity region 145b are formed to include the impurity element that imparts n-type conductivity at the concentration equal to or slightly higher than those of the third n-type impurity region 148a, the third n-type impurity region 148b, the third n-type impurity region 148c and the third n-type impurity region 148d. In addition, a channel forming region 146 is formed in the semiconductor layer 104, and a channel forming region 149a and a channel forming region 149b are formed in the semiconductor layer 105.

The second n-type impurity region 144a, the second n-type impurity region 144b, the second n-type impurity region 147a, the second n-type impurity region 147b and the second n-type impurity region 147c are a high concentration n-type impurity region and serve as a source or a drain. On the other hand, the third n-type impurity region 145a, the third n-type impurity region 145b, the third n-type impurity region 148a, the third n-type impurity region 148b, the third n-type impurity region 148c and the third n-type impurity region 148*d* are a low concentration impurity region, and serve as an LDD (Lightly Doped Drain) region. The n-type impurity region 145*a* and the n-type impurity region 145*b* are covered with the first gate electrode layer 122 with the gate insulating layer 107 therebetween, and thus, it is Lov region, which relieves an electric field in the vicinity of a drain and can suppress deterioration of on-current due to hot carriers. As a result, a thin film transistor that can operate at high speed can be formed. On the other hand, the third n-type impurity region 148*a*, the third n-type impurity region 148*b*, the third n-type impurity region 148*c* and the third n-type impurity region 148*d* are formed in Loff region not covered with the gate electrode layer 127 and the gate electrode layer 128, and thus, the regions relieve an electric field in the vicinity of a drain, and can prevent deterioration due to hot carrier injection and can reduce off-current. As a result, a highly reliable semiconductor device that consumes less power can be manufactured.

Then, the mask 153*a*, the mask 153*b*, the mask 153*c* and the mask 153*d* are removed, and a mask 155*a*, a mask 155*b* which cover the semiconductor layer 103 and the semiconductor layer 105 are formed. An impurity element 154 that imparts p-type conductivity is added by using the mask 155*a*, the mask 155*b*, the gate electrode layer 117 and the gate electrode layer 129 as masks to form a first p-type impurity region 160*a*, a first p-type impurity region 160*b*, a first p-type impurity region 163*a*, a first p-type impurity region 163*b*, a second p-type impurity region 161*a*, a second p-type impurity region 161*b*, a second p-type impurity region 164*a*, and a second p-type impurity region 164*b*. In the present embodiment mode, boron (B) is used as the impurity element. Therefore, diborane ($B_2H_6$) (the composition ratio of B is 15%) is used as a doping gas that contains an impurity element, and the doping is conducted under the conditions of gas flow rate of 70 sccm, beam current of 180 µA/cm, accelerating voltage of 80 kV, and an added dose amount of $2.0 \times 10^{15}$ ions/cm$^2$. Here, the first p-type impurity region 160*a*, the first p-type impurity region 160*b*, the first p-type impurity region 163*a*, the first p-type impurity region 163*b*, the second p-type impurity region 161*a*, the second p-type impurity region 161*b*, the second p-type impurity region 164*a* and the second p-type impurity region 164*b* are doped with the impurity element that imparts p-type conductivity such that the impurity element is included at the concentration of about $1 \times 10^{20}$ to $5 \times 10^{21}$/cm$^3$. In the present embodiment mode, the second p-type impurity region 161*a*, the second p-type impurity region 161*b*, the second p-type impurity region 164*a* and the second p-type impurity region 164*b* are formed to have a concentration lower than those of the first p-type impurity region 160*a*, the first p-type impurity region 160*b*, the first p-type impurity region 163*a* and the first p-type impurity region 163*b* in a self-alignment manner depending on the shapes of the gate electrode layer 117 and the gate electrode layer 129. A channel forming region 162 is formed in the semiconductor layer 103, and a channel forming region 165 is formed in the semiconductor layer 106.

The second n-type impurity region 144*a*, the second n-type impurity region 144*b*, the second n-type impurity region 147*a*, the second n-type impurity region 147*b* and the second n-type impurity region 147*c* are a high concentration n-type impurity region and serve as a source or a drain. On the other hand, the second p-type impurity region 161*a*, the second p-type impurity region 161*b*, the second p-type impurity region 164*a* and the second p-type impurity region 164*b* are a low concentration impurity region, and serve as an LDD (Lightly Doped Drain) region. The second p-type impurity region 161*a*, the second p-type impurity region 161*b*, the second p-type impurity region 164*a* and the second p-type impurity region 164*b* are covered with the first gate electrode layer 121 and the first gate electrode layer 126 with the gate insulating layer 107 therebetween, and thus, it is Lov region, which relieves an electric field in the vicinity of a drain and can suppress deterioration of on-current due to hot carriers.

The mask 155*a* and the mask 155*b* are removed by $O_2$ ashing or using a resist peeling solution and the oxide film is also removed. After that, an insulating film, namely, a so-called sidewall may be formed to cover the side face of the gate electrode layer. The sidewall can be formed by using an insulating film that contains silicon by a plasma CVD method or a low pressure CVD (LPCVD) method.

A heat treatment, intense light irradiation or laser light irradiation may be conducted to activate the impurity element. Plasma damage to the gate insulating layer or plasma damage to an interface between the gate insulating layer and the semiconductor layer may be recovered at the same time as the activation.

Thereafter, an interlayer insulating layer is formed to cover the gate electrode layer and the gate insulating layer. In the present embodiment mode, a stacked structure of an insulating film 167 and an insulating film 168 is employed (refer to FIG. 4(A)). A silicon nitride oxide film of 200 nm thick is formed as the insulating film 167, and a silicon oxynitride film of 800 nm thick is formed as the insulating film 168 to provide a stacked structure. In addition, a three-layer stacked structure may be employed, in which a silicon oxynitride film of 30 nm thick, a silicon nitride oxide film of 140 nm thick and a silicon oxynitride film of 800 nm thick are formed to cover the gate electrode layer and the gate insulating layer. In the present embodiment mode, the insulating film 167 and the insulating film 168 are formed continuously by a plasma CVD method in the same way as the base film. The insulating film 108 is not limited to a silicon nitride film, and may be formed by using a silicon oxynitride film, a silicon oxide nitride film or a silicon oxide film formed by a sputtering method or a plasma CVD method, or may have a single layer of another insulating film that contains silicon or a stacked structure of three or more layers.

Further, a process for hydrogenating the semiconductor layer is performed by a heat treatment at 300 to 550° C. for 1 to 12 hours in a nitrogen atmosphere. This process is preferably performed at 400 to 500° C. This process is a process for terminating a dangling bond of the semiconductor layer by hydrogen contained in the insulating film 167 that is the interlayer insulating layer. In the present embodiment mode, the heat treatment is conducted at 410° C.

The insulating film 167 and the insulating film 168 can be formed by using a material selected from aluminum nitride (AlN), aluminum oxynitride (AlON), aluminum nitride oxide that has more nitrogen content than oxygen content (AlNO), aluminum oxide, diamond like carbon (DLC), a nitrogen-containing carbon (CN) film and other substances that contains an inorganic insulating material. Further, a siloxane resin may also be employed. The siloxane resin is a resin that contains Si—O—Si bond. Siloxane has a skeleton structure formed by the bond of silicon (Si) and oxygen (O). An organic group that contains at least hydrogen (such as an alkyl group or aromatic hydrocarbon) is used as a substituent. A fluoro group may also be used as the substituent. Further, an organic group that contains at least hydrogen and a fluoro group may be used as the substituent. An organic insulating material may also be employed, and polyimide, acrylic, polyamide, polyimide amide, resist, or benzocyclobutene or polysilazane can be used as an organic material. A coated film formed by a coating method with favorable flatness may also be used.

Thereafter, contact holes (apertures) that reach the semiconductor layer are formed in the insulating film 167, the insulating film 168 and the gate insulating layer 107 by using a mask composed of resist. Etching may be conducted once or plural times depending on the selectivity of a material that is used. In the present embodiment mode, first etching is conducted to remove the insulating film 168, under a condition where the selectivity of the insulating film 168 that is a silicon oxynitride film, the insulating film 167 that is a silicon nitride oxide film and the gate insulating layer 107 can be obtained. Next, the insulating film 167 and the gate insulating layer 107 are removed by second etching to form apertures (also referred to as openings) that reach the first p-type impurity region 160a, the first p-type impurity region 160b, the first p-type impurity region 163a, the first p-type impurity region 163b, the second n-type impurity region 144a, the second n-type impurity region 144b, the second n-type impurity region 147a and the second n-type impurity region 147b, which are a source region or a drain region. In the present embodiment mode, the first etching is conducted by wet etching and the second etching is conducted by dry etching. As an etchant for wet etching, a hydrofluoric acid based solution such as a mixed solution that contains ammonium hydrogen fluoride and ammonium fluoride may be used. As an etching gas, a gas that contains chlorine typified by $Cl_2$, $BCl_3$, $SiCl_4$, $CCl_4$ or the like, a gas that contains fluorine typified by $CF_4$, $SF_6$, $NF_3$ or the like, or $O_2$ can be appropriately used. An inert gas may be added into the etching gas that is used. As the inert element to be added, one or a plurality of elements selected from He, Ne, Ar, Kr, and Xe can be used.

A conductive film is formed to cover the openings, and then, the conductive film is etched to form a source electrode layer or drain electrode layer 169a, a source electrode layer or drain electrode layer 169b, a source electrode layer or drain electrode layer 170a, a source electrode layer or drain electrode layer 170b, a source electrode layer or drain electrode layer 171a, a source electrode layer or drain electrode layer 171b, a source electrode layer or drain electrode layer 172a and a source electrode layer or drain electrode layer 172b, which are electrically connected to a portion of each source region or drain region, and a wiring 156. These source electrode layers or drain electrode layers can be formed by forming a conductive film by a PVD method, a CVD method, an evaporation method or the like, and etching the conductive film into a desired shape. In addition, the conductive layer can be formed selectively in a predetermined position by a droplet discharging method, a printing method, an electroplating method, or the like. Moreover, a reflow method or a damascene method can be used. As a material for the source electrode layer or the drain electrode layer, a metal such as Ag, Au, Cu, Ni, Pt, Pd, Ir, Rh, W, Al, Ta, Mo, Cd, Zn, Fe, Ti, Si, Ge, Zr, or Ba; an alloy of the metal; or a metal nitride thereof is used. In addition, a stacked structure of materials selected from them may also be adopted. In the present embodiment mode, titanium (Ti) of 100 nm thick, an aluminum-silicon (AL-Si) alloy of 700 nm thick, and titanium (Ti) of 200 nm thick are formed and patterned into a desired shape.

Through the above described process, an active matrix substrate can be manufactured, in which a p-channel thin film transistor 173 that has a p-type impurity region in the Lov region and an n-channel thin film transistor 174 that has an n-channel impurity region in the Lov region are formed in the peripheral driver circuit region 204; a conductive layer 177 is formed in the connection region; a multi channel type n-channel thin film transistor 175 that has an n-type impurity region in the Loff region and a p-channel thin film transistor 176 that has a p-type impurity region in the Lov region are formed in the pixel region 206 (refer to FIG. 4(B)).

The active matrix substrate can be used for a light-emitting device that has a self light-emitting element, a liquid crystal display device that has a liquid crystal element, and other display devices. In addition, the active matrix substrate can also be used for various processors typified by CPU (central processing unit), and a semiconductor device such as a card that has an ID chip.

The thin film transistor may have a single-gate structure in which one channel forming region is formed, a double-gate structure in which two channel forming regions are formed or a triple-gate structure in which three channel forming regions are formed without being limited to the present embodiment mode. The thin film transistor in the peripheral driver circuit region may also have a single-gate structure, a double-gate structure or a triple-gate structure.

It is not limited to the method for manufacturing a thin film transistor shown in the present embodiment mode, and can be applied to a top-gate type (planar type), a bottom-gate type (inversely staggered type), a dual-gate type that has two gate electrode layers arranged above and below of a channel region with gate insulating films interposed therebetween, or other structures.

Next, an insulating film 180 and an insulating film 181 are formed as a second interlayer insulating layer (refer to FIG. 5(A)). FIG. 5 shows a manufacturing process of a display device, and there are a region 201 to be cut out for being cut out by scribing, an external terminal connection region 202 that is a portion to which an FPC is attached, a wiring region 203 that is a leading wiring region of the peripheral portion, a peripheral driver circuit region 204, a connection region 205, and a pixel region 260. A wiring 179a and a wiring 179b are provided in the wiring region 203, and a terminal electrode layer 178 to be connected to an external terminal is provided in the external terminal connection region 202.

The insulating film 180 and the insulating film 181 can be formed by using a material selected from silicon oxide, silicon nitride, silicon oxynitride, silicon nitride oxide, aluminum nitride (AlN), aluminum oxynitride (AlON), aluminum nitride oxide that has more nitrogen content than oxygen content (AlNO) or aluminum oxide, diamond like carbon (DLC), a nitrogen-containing carbon (CN) film, a PSG (phosphorus glass), a BPSG (boron phosphorus glass), an alumina film and other substances that contain an inorganic insulating material. Further, a siloxane resin may be employed. Moreover, an organic insulating material may be used, and as an organic material, a photosensitive or non-photosensitive one may be employed, and polyimide, acrylic, polyamide, polyimide amide, resist or benzocyclobutene, polysilazane, or a Low-k material that has low dielectric can be used.

In the present embodiment mode, a silicon oxynitride film of 200 nm thick is formed as the insulating film 180 by a CVD method. As a method for forming the insulating film 181, a coating method typified by a spin coating method may be preferably used, because an interlayer insulating layer that is superior in heat-resistance, insulative property and planarity is required as an interlayer insulating layer for planarizing.

In the present embodiment mode, a coated film using a siloxane resin material is used as the material of the insulating film 181. The film after baking can be referred to as a silicon oxide film that contains an alkyl group (SiOx) (x, y=1, 2 . . . ). This silicon oxide film that contains an alkyl group can withstand a heat treatment of 300° C. or more.

Dip, spraying coating, a doctor knife, a roll coater, a curtain coater, a knife coater, a CVD method, an evaporation method or the like can be used for forming the insulating film 180 and the insulating film 181. The insulating film 180 and the insulating film 181 may be formed by a droplet discharging method. A material solution can be saved when the droplet discharging method is adopted. A method capable of transferring or drawing a pattern like the droplet discharging method, for example, a printing method (a method by which a pattern is formed, such as screen printing or offset printing), or the like can also be used.

Next, as shown in FIG. 5(B), openings are formed in the insulating film 180 and the insulating film 181 that serve as the second interlayer insulating layer. The insulating film 180 and the insulating film 181 are required to be etched widely in the connection region 205, the wiring region 203, the external terminal connection region 202, the region 201 to be cut out and the like. However, the area of the opening in the pixel region 206 is much smaller than the area of the opening in the connection region 205 or the like, and becomes minute. Therefore, a margin of etching condition can be widened by conducting a photolithography process for forming the opening in the pixel region and a photolithography process for forming the opening in the connection region. Consequently, the yield can be improved. Furthermore, a contact hole formed in the pixel region can be formed with high accuracy by widening the margin of the etching condition.

Specifically, openings that have large area are formed in the insulating film 180 and the insulating film 181 formed in the connection region 205, the wiring region 203, the external terminal connection region 202, the region 201 to be cut out and a portion of the peripheral driver circuit region 204. Thus, masks are formed to cover the insulating film 180 and the insulating film 181 in the pixel region 206, and in a portion of the connection region 205, a portion of the peripheral driver circuit region 204. A parallel-plate RIE system or an ICP etching system can be used for etching. It is to be noted that the time for etching may be set such that the wiring layer or the first interlayer insulating layer is over etched. Variation in film thickness within the substrate and variation in etching rate can be reduced by setting such that the first interlayer insulating layer is over etched. In this way, an opening 182 is formed in the connection region 205, and an opening 183 is formed in the external terminal connection region 202, respectively.

After that, as shown in FIG. 5(B), a minute opening, namely, a contact hole, is formed in the insulating film 180 and the insulating film 181 in the pixel region 206 (refer to FIG. 5(C)). At this time, a mask is formed to cover the pixel region 206, a portion of the connection region 205, a portion of the peripheral driver circuit region 204 and the pixel region 206. The mask is a mask for forming an opening in the pixel region 206, and is provided with a minute opening in a predetermined position thereof. For example, a resist mask can be used as the mask.

Then, the insulating film 180 and the insulating film 181 are etched with the use of a parallel-plate RIE system. It is to be noted that the time for etching may be set such that the wiring layer or the first interlayer insulating layer is over etched. Variation in film thickness within the substrate and variation in etching rate can be reduced by setting such that the wiring layer or the first interlayer insulating layer is over etched.

An ICP system may be used as the etching system. Through the above described process, an opening 184 that reaches the source electrode or drain electrode 172a is formed in the pixel region 206. In the present invention, the source electrode or drain electrode 172a is formed to cover the gate electrode layer 126, which has a large total thickness in which a large number of thin films are stacked in the thin film transistor 176, with the insulating film 167 and the insulating film 168 interposed therebetween. Thus, since the opening 184 is not required to be opened to have a deep thickness, the process for forming the opening can be shortened, and thus, the controllability can be enhanced. In addition, an electrode layer formed in the opening does not need to widely cover the opening that has a large angle; therefore, the electrode layer can be formed with favorable coverage and reliability can be enhanced.

The present embodiment mode describes the case in which the insulating film 180 and the insulating film 181 are etched by using the mask that covers the connection region 205, the wiring region 203, a portion of the external terminal connection region 202, the region 201 to be cut out, and the peripheral driver circuit region 204, and has a predetermined opening in the pixel region 206. However, the present invention is not limited thereto. For example, the opening in the connection region 204 has a large area, and thus, the etching amount is large. Alternatively, the opening that has a large area may be etched plural times. In the case where an opening that is deeper than other opening is formed, etching may be conducted plural times similarly. Therefore, the insulating film 180 and the insulating film 181 may be etched by using a mask that covers only the insulating film 180 and the insulating film 181 in the wiring region 203, the external terminal connection region 202, the region 201 to be cut out and a portion of the peripheral driver circuit 204, and has a predetermined opening in the connection region 205 and the pixel region 206. In the case where etching is conducted by using the mask as described, the insulating film 180 and the insulating film 181 in the connection region 205 are etched so that deepness is increased, and are etched until the insulating film 168 is exposed.

In the present embodiment mode, the formation of the openings in the insulating film 180 and the insulating film 181 are conducted plural times as shown in FIGS. 5(B) and (C); however, they may be formed by one-time etching process. In this case, an ICP system is used to conduct etching with ICP power of 7000 W, bias power of 1000 W, pressure of 0.8 pascal (Pa), with the use of $CF_4$ of 240 sccm and $O_2$ of 160 sccm as the etching gas. The bias power is preferably 1000 to 4000 W. An advantageous effect that the process can be simplified is obtained, because the openings are formed by one-time etching process.

Then, a first electrode layer 185 (also referred to as a pixel electrode layer) is formed to come in contact with the source electrode layer or drain electrode layer 172a. The first electrode layer serves as an anode or a cathode, and may be formed by using a film composed of an element selected from Ti, Ni, W, Cr, Pt, Zn, Sn, In or Mo, or TiN, $TiSi_xN_y$, $WSi_x$, $WN_x$, $WSi_xN_y$, NbN, or an alloy material or a compound material that mainly contains the element; or a stacked film of those films in a total film thickness range of 100 nm to 800 nm.

In the present embodiment mode, a light-emitting element is used as a display element, and the first electrode layer 185 has light-transmitting property because of a structure in which light from the light-emitting element is extracted from the first electrode layer 185 side. As the first electrode layer 185, a transparent conductive film is formed and etched into a desired shape, thereby forming the first electrode layer 185. Oxidized indium tin that contains silicon oxide (also referred to as Indium tin oxide that contains silicon oxide, hereinafter "ITSO"), zinc oxide, tin oxide, indium oxide or the like may be used for the first electrode layer 185 used in the present invention. In addition, a transparent conductive film such as an alloy of indium oxide and zinc oxide in which indium oxide is mixed with zinc oxide (ZnO) of 2 to 20% can also be used. A titanium nitride film or a titanium film may be used for the first electrode layer 185 in addition to the transparent conductive films as described above. In this case, after the transparent conductive film is formed, a titanium nitride film or a titanium film is formed to have such a film thickness that can transmit light (preferably about 5 nm to 30 nm thick). In the present embodiment mode, ITSO that contains oxidized indium tin and silicon oxide is used as the first electrode layer 185. In the present embodiment mode, the ITSO film is formed to have a film thickness of 185 μm by a sputtering method using a target in which indium tin oxide is mixed with silicon oxide ($SiO_2$) of 1 to 10[%] under the condition where the flow rate of Ar gas is 120 sccm; the flow rate of $O_2$ gas is 5 sccm; pressure is 0.25 Pa; and electric power is 3.2 kW. The first electrode layer 185 may be cleaned and polished by a CMP method or by using a polyvinyl alcohol-based porous material so that the surface thereof is planarized. In addition, after polishing with a CMP method, ultraviolet ray irradiation, an oxygen plasma treatment, or the like may be carried out on the surface of the first electrode layer 185.

A heat treatment may be performed after forming the first electrode layer 185. With the heat treatment, water included in the first electrode layer 185 is released. Accordingly, degasification or the like is not generated from the first electrode layer 185. Thus, even when a luminescent material which is easily deteriorated by water is formed over the first electrode layer, the luminescent material is not deteriorated; therefore, a highly reliable display device can be manufactured. In the present embodiment mode, ITSO is used for the first electrode layer 185, and it is not crystallized even when baking is performed, unlike ITO (an alloy of indium oxide and tin oxide), and remains in an amorphous state. Hence, ITSO has higher planarity than ITO, and short-circuit with a cathode is not easily generated even when a layer that contains an organic compound is thin.

Next, an insulator (an insulating layer) 186 (also, referred to as a bank, a partition wall, a wall, an embankment or the like) that covers an edge portion of the first electrode layer 185 and the source electrode layer or drain electrode layer is formed (refer to FIG. 6(B)). In addition, an insulator 187a and an insulator 187b are formed in the external terminal connection region 202 in the same process.

When an electroluminescent layer is formed over the first electrode layer, each electroluminescent layer that produces luminescence of RGB is required to be formed separately in order to perform full-color display. Accordingly, when an electroluminescent layer for the other color is formed, the pixel electrode layer thereof (the first electrode layer) is covered with a mask. For the mask, a film-state composed of a metal material or the like can be used. At this time, the mask is provided over the insulator 186 that serves as a partition wall and supported, but can come in contact with the pixel electrode layer due to distortion or kink so that the pixel electrode layer is damaged. A defect in shape caused by damage of the pixel electrode layer causes a defect in luminescence and a defect in display, resulting in lowered image quality, and thus, the reliability and performance are also lowered.

In the present invention, a spacer 199 is formed on the first electrode layer 185 that serves as the pixel electrode layer to have the same film thickness as the insulator 186. Since the mask is supported by this spacer 199, the mask does not come in contact with the first electrode layer. Therefore, a defect in shape of the first electrode layer due to the mask is prevented so that a high-definition display device with high reliability can be provided without causing a defect in luminescence and a defect in display due to the first electrode layer. The spacer serves not only as a spacer for a mask that is used when an electroluminescent layer is formed over the first electrode layer that serves as the pixel electrode layer, but also as a spacer for preventing a display device from being damaged or deformed due to a pressure or impact from the outside after forming the electroluminescent layer and conducting sealing by using a sealing substrate to complete a display device.

In the present embodiment mode, the spacer 199 is formed by using the same material and in the same process as the insulator 186 that serves as a partition wall. However, the spacer may also be formed in another process. The shape and size of the spacer is not limited, and may be set considering the size, the aperture ratio and the like of the pixel region. In the present embodiment mode, the spacer has a columnar-shape with a round upper portion like a hemisphere as shown in FIG. 6(B), and the size thereof is 1 μm to 2 μm (preferably 1.5 μm or more and 2 μm or less).

Examples of the shape of the spacer will be described with reference to FIG. 22. FIGS. 22 (A1), (B1) and (C1) are top views of the pixel region, and FIGS. 22 (A2), (B2) and (C2) are cross-sectional views of FIGS. 22 (A1), (B1) and (C1) along X1-Y1, X2-Y2, X3-Y3. In FIGS. 22(A1) and (A2), a first electrode layer 607 that serves as a pixel electrode layer is formed over a substrate 600, a base film 601a, a base film 601b, a gate insulating layer 602, an insulating film 603, an insulating film 604, an insulating film 605 and an insulating film 606. An insulator 608 that serves as a partition wall is formed to cover an edge portion of the first electrode layer 607, and a spacer 609 is formed by using the same material and in the same process as the insulator 608. The spacer may be formed to be connected to the insulating layer that serves as a partition wall as shown in FIG. 22.

In FIGS. 22(A1) and (A2), the spacer 609 is formed to be in contact with the insulator 608, and formed continuously to cross the first electrode layer 609 diagonally over the first electrode layer. When the spacer 609 is formed continuously in this way, a mask is always supported by the spacer 609 while it is moved, and thus, is prevented from coming in contact with the first electrode layer 607 and causing a defect in shape of the first electrode layer 607.

In FIGS. 22(B1) and (B2), a first electrode layer 617 that serves as a pixel electrode layer is formed over a substrate 610, a base film 611a, a base film 611b, a gate insulating layer 612, an insulating film 613, an insulating film 614, an insulating film 615 and an insulating film 616. An insulator 618 that serves as a partition wall is formed to cover an edge portion of the first electrode layer 617, and a spacer 619 is formed by using the same material and in the same process as the insulator 618.

In FIGS. 22(B1) and (B2), the spacer 619 is formed to be connected to the insulator 618, and formed continuously in two positions to cross the first electrode layer 619 in a narrow side direction over the first electrode layer. When the spacer 619 is formed continuously in plural positions in this way, a mask is always supported by the spacer 619 while it is moved, and thus, is prevented from coming in contact with the first electrode layer 617 and causing a defect in shape of the first electrode layer 617.

In FIGS. 22(C1) and (C2), a first electrode layer 627 that serves as a pixel electrode layer is formed over a substrate 620, a base film 621a, a base film 621b, a gate insulating layer 622, an insulating film 623, an insulating film 624, an insulating film 625 and an insulating film 626. An insulator 628 that serves as a partition wall is formed to cover an edge portion of the first electrode layer 627, and a spacer 629 is formed by using the same material and in the same process as the insulator 628.

In FIGS. 22(C1) and (C2), the spacer 629 is formed to be in contact with the insulator 628, and formed continuously in a lattice to cross the first electrode layer 629 in a long side direction and a narrow side direction over the first electrode layer. When the spacer 629 is formed continuously in a lattice in this way, a mask is always supported by the spacer 629 while it is moved, and thus, is prevented from coming in contact with the first electrode layer 627 and causing a defect in shape of the first electrode layer 627. As shown in FIG. 22(C2), the spacer 629 has a tapered shape. As described above, the spacer may have a roughly rectangular solid shape as shown in FIG. 22(A2), additionally, various shapes such as a column, a prism or a tapered shape can be used.

In FIG. 22, the spacer is formed in contact with the insulator that serves as a partition wall; however, may be formed away without contact.

The spacer can be formed by using silicon oxide, silicon nitride, silicon oxynitride, aluminum oxide, aluminum nitride, aluminum oxynitride or other inorganic insulating material; or acrylic acid, methacrylic acid and derivatives thereof; or a heat resistant polymer such as polyimide (polyimide), aromatic polyamide and polybenzimidazole (polybenzimidazole); or a siloxane resin. In the present embodiment mode, acrylic is used for the spacer 199.

In the present embodiment mode, acrylic is used for the insulator 186. When the insulator 186 is formed by using the same material and in the same process as the insulator 181, the manufacturing cost can be reduced. In addition, the cost can further be reduced by commonly using apparatuses such as a coating deposition apparatus or an etching apparatus.

The insulator 186 can be formed by using silicon oxide, silicon nitride, silicon oxynitride, aluminum oxide, aluminum nitride, aluminum oxynitride or other inorganic insulating material, or acrylic acid, methacrylic acid, and a derivative thereof, or a heat resistant polymer such as polyimide(polyimide), an aromatic polyamide, or polybenzimidazole (polybenzimidazole) or a siloxane resin. A photosensitive or nonphotosensitive material such as acrylic or polyimide may also be used. The insulator 186 preferably has a shape in which a radius of curvature changes continuously so that the coverage of an electroluminescent layer 188 and a second electrode layer 189 which are formed thereover is enhanced.

In the connection region 205; the insulator 186 is formed to cover edge portions of the insulating film 180 and the insulating film 181 on the side face of the opening 182. The edge portions of the insulating film 180 and the insulating film 181 that have been processed to have a step by patterning have a rapid step so that the coverage of the second electrode layer 189 that is stacked thereover is bad. Therefore, as in the present invention, the step in the periphery of the opening is covered with the insulator 186 to smooth the step, thereby enhancing the coverage of the second electrode layer 189 to be stacked thereover. In the connection region 205, a wiring layer that is formed in the same process and by using the same material as the second electrode layer is electrically connected to the wiring layer 156. In the present embodiment mode, the second electrode layer 189 comes directly in contact with the wiring layer 156 to be electrically connected; however, may also be electrically connected via another wiring.

In addition, in order to further improve reliability, it is preferable to perform deaeration by carrying out vacuum heating before forming the electroluminescent layer (a layer that includes an organic compound) 188. For example, it is desirable to perform a heat treatment at 200 to 400° C., preferably, 250 to 350° C. in a low pressure atmosphere or inert atmosphere before evaporating an organic compound material in order to eliminate the gas contained in the substrate. Furthermore, it is preferable to form the electroluminescent layer 188 by a vacuum evaporation method or a droplet discharging method in a low pressure without being exposed to the atmosphere. By the heat treatment, water contained in or attached to a conductive film, which is to be the first electrode layer, or the insulating layer (partition wall) can be released. The heat treatment can serve as the above-mentioned heat treatment when vacuum is not broken and the substrate can be transferred within a vacuum chamber, and the above-mentioned heat treatment may be performed once after forming the insulating layer (partition wall). Here, when the interlayer insulating film and the insulator (partition wall) are formed by using a substance that has high heat resistance, a heat treatment process for enhancing reliability can be sufficiently performed.

The electroluminescent layer 188 is formed over the first electrode layer 185. It is to be noted that, although only one pixel is shown in FIG. 1, field electrode layers corresponding to each color of R (red), G (green) and B (blue) are separately formed in the present embodiment mode. In the present embodiment mode, FIG. 23 shows that each of materials which show luminescence of color of red (R), green (G) and blue (B) is selectively formed as the electroluminescent layer 188 by an evaporation method using an evaporation mask.

In FIG. 23, a thin film transistor 651a, a thin film transistor 651b and a thin film transistor 651c are connected to a first electrode layer 652a, a first electrode layer 652b and a first electrode layer 652c which are pixel electrode layers. Edge portions of the first electrode layers are covered with an insulator 653a, an insulator 653b, an spacer 654c and an insulator 653d which serve as a partition wall, respectively, and a spacer 654a, a spacer 654b and a spacer 654c are formed over the first electrode layers. After an electroluminescent layer is formed over the first electrode layer 652a, the first electrode layer 652b and the first electrode layer 652c, an electroluminescent layer is formed over each first electrode layer while a mask 656 is moved in a direction of arrow 655. The mask 656 is supported by the spacer 654a, the spacer 654b and the spacer 654c over the first electrode layer 652a, the first electrode layer 652b and the first electrode layer 652c so that there is no problem that the mask come in contact with the first electrode layer due to distortion or kink, and a defect in shape of the first electrode layer can be prevented. Therefore, the first electrode layer causes no defect in luminescence or defect in shape, and a high definition display device with high reliability can be manufactured.

A material that shows luminescence of red (R), green (G) and blue (B) can also be formed by a droplet discharging method (such as low molecular- or high molecular weight material).

Next, a second electrode layer 189 formed by using a conductive film is provided over the electroluminescent layer 188. As the second electrode layer 189, a material with a low work function (Al, Ag, Li, Ca, or an alloy or compound thereof, such as MgAg, MgIn, AlLi, $CaF_2$, or CaN) may be used. In this manner, a light-emitting element 190 that includes the first electrode layer 185, the electroluminescent layer 188 and the second electrode layer 189 is formed.

In the display device of the present embodiment mode shown in FIG. 1, light emitted from the light emitting element 190 is transmitted and emitted in the direction shown by the arrow in FIG. 1 from the side of the first electrode layer 185.

It is effective to provide a passivation film 191 so as to cover the second electrode layer 189. The passivation film 191 is formed by using an insulating film that contains silicon nitride, silicon oxide, silicon oxynitride (SiON), silicon nitride oxide (SiNO), aluminum nitride (AlN), aluminum oxynitride (AlON), aluminum nitride oxide (AlNO) in which nitrogen content is larger than oxygen content, aluminum oxide, diamond like carbon (DLC), or a nitrogen-containing carbon (CN) film, and a single layer of the insulating film or a stacked layer of the films combined can be used. In addition, a material may be used, in which a skeleton structure is formed by bond of silicon (S) and oxygen (O), and hydrogen is included at least in a substituent. Alternatively, a material may also be used, in which at least one of fluorine, alkyl group or aromatic hydrocarbon is included in a substituent.

In this case, it is preferable to use a film with favorable coverage as the passivation film, and it is effective to use a carbon film, particularly, a DLC film. Since a DLC film can be formed in a temperature range from a room temperature to 100° C. or less, it can be easily formed even over the electroluminescent layer 188 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam evaporation method, a laser evaporation method, or the like. As a reactive gas used for film formation, a hydrogen gas and a hydrocarbon based gas (for example, $CH_4$, $C_2H_2$, $C_6H_6$ or the like) are used and ionized by glow discharge, and then film formation is carried out with accelerative collision of ions to a cathode to which a negative self-bias is applied. In addition, the CN film may be formed by using $C_2H_4$ gas and $N_2$ gas as a reactive gas. A DLC film has high blocking effect to oxygen, and thus, it can suppress oxidation of the electroluminescent layer 188. Therefore, a problem that the electroluminescent layer 188 is oxidized during a subsequent sealing process can be prevented.

FIG. 18 shows a top view of a pixel region of the display device manufactured in the present embodiment mode. In FIG. 18, a pixel 2702 includes a thin film transistor 501, a thin film transistor 502, a capacitor 504, a light-emitting element 190, a gate wiring layer 506, a source and drain wiring layer 505 and a power supply line 507. In FIG. 18, a plurality of spacers 199 are provided on the first electrode layer. One or a plurality of spacers may be provided, and in the case of plural spacers, the same shape is not required. In addition, the spacer is not required to be in contact with the insulator 186 (shown with a dotted line in FIG. 18), unlike the spacer 199, and may be formed separately.

As described above, a substrate 100 that has the light emitting element 190 formed thereover and a sealing substrate 195 are attached to each other by a sealing material 192 to seal the light-emitting element (refer to FIG. 1). In the display device according to the present invention, the sealing material 192 and the insulator 186 are formed separately so as not to be in contact with each other. When the sealing material and the insulator 186 are formed separately as described above, even when an insulating material using a high hygroscopic organic material is used for the insulator 186, water doses not easily enter, therefore, the light emitting element is prevented from deteriorating, which leads to the higher reliability of the display device. As the sealing material 192, typically, a visible light curing, ultraviolet curing or thermosetting resin is preferably used. For example, an epoxy resin such as a bisphenol A liquid resin, a bisphenol A solid resin, a resin that contains bromo-epoxy, a bisphenol F resin, a bisphenol AD resin, a phenol resin, a cresol resin, a novolac resin, a cyclic aliphatic epoxy resin, an epibis epoxy resin, a glycidyl ester resin, a glycidyl amine resin, a heterocyclic epoxy resin, or a modified epoxy resin can be used. It is to be noted that a region surrounded by the sealing material may be filled with a filler 193, and nitrogen or the like may be encapsulated therein by sealing in a nitrogen atmosphere. The filler 193 does not necessarily have light-transmitting property, since a bottom emission type is employed in the present embodiment mode. However, in the case of a structure in which light is extracted through the filler 193, the filler needs to have light-transmitting property. Typically, a visible light curing, ultraviolet curing, or thermosetting epoxy resin may be used. Through the above described process, a display device that has a display function using a light emitting element in accordance with the present embodiment mode is completed. Further, the filler in a liquid state may be dropped and can fill inside the display device.

A dropping injecting method using a dispenser system will be described with reference to FIG. 19. The dropping injecting method in FIG. 19 includes a control device 40, an imaging means 42, a head 43, a filler 33, a marker 35, a marker 45, a barrier layer 34, a sealing material 32, a TFT substrate 30, and an opposite substrate 20. A closed loop is formed by the sealing material 32, and the filler 33 is dropped thereinto once or plural times from the head 43. In the case where the viscosity of the filler material is high, the filler is discharged continuously and attached to a formation region with the filler extended. On the other hand, when the viscosity of the filler material is low, the filler is discharged intermittently and dropped as shown in FIG. 19. At this time, the barrier layer 34 may be provided so as to prevent the sealing material 32 from reacting with the filler 33. Then, the substrates are attached in vacuum, and then cured by ultraviolet rays to be in a state filled with the filler. When a hygroscopic substance such as a drying agent is used as the filler, a further absorption effect of water is obtained and deterioration of an element can be prevented.

A drying agent is provided in an EL display panel so as to prevent deterioration of an element due to water. In the present embodiment mode, the drying agent is provided in a concave portion formed to surround the pixel region in the sealing substrate, so as not to hinder thinning. In addition, a drying agent is also provided in a region corresponding to a gate wiring layer, and the area of water absorption is large, and thus, absorption efficiency is high. Further, since the drying agent is provided over the gate wiring layer that does not emit light directly, light-extraction efficiency is not lowered.

It is to be noted that the present embodiment mode shows the case where a light-emitting element is sealed with a glass substrate. The sealing treatment is a treatment for protecting the light emitting element from water, and any of a method of mechanically sealing with a cover material, a method of sealing with a thermosetting resin or an ultraviolet curing resin, and a method of sealing with a thin film such as oxide or nitride of a metal or the like that has high barrier capabilities, can be used. As for the cover material, glass, ceramics, plastic, or metal can be used. However, in the case where light is emitted to the cover material side, the cover material needs to have light-transmitting property. In addition, the cover material and the substrate, over which the light-emitting element is formed, are attached by using a sealing material such as a thermosetting resin or an ultraviolet curing resin, and the resin is cured with a heat treatment or an ultraviolet irradiation treatment to form an enclosed space. It is also effective to provide a hydroscopic material typified by barium oxide in the enclosed space. The hydroscopic material may be provided on the sealing material to come in contact, or over a partition wall or in the peripheral part thereof so as not to block light emitted from the light emitting element. Further, it is also possible to fill the space formed between the cover material and the substrate, over which the light emitting element is formed, with a thermosetting resin or an ultraviolet curing resin. In this case, it is effective to add a hydroscopic material typified by barium oxide in the thermosetting resin or the ultraviolet curing resin.

In the present embodiment mode, in the external terminal connection region 202, an FPC 194 is connected to the terminal electrode layer 178 by an anisotropic conductive layer 196, so as to provide a structure of an electrical connection to the outside. In addition, as shown in FIG. 1(A) that is a top view of the display device, the display device manufactured in the present embodiment mode is provided with a peripheral driver circuit region 207*a* and a peripheral driver circuit region 207*b* that have a scanning line driver circuit in addition to a peripheral driver circuit region 204 that has a signal line driver circuit.

In the present embodiment mode, it is formed by using the above-mentioned circuit. However, the present invention is not limited thereto. As a peripheral driver circuit, an IC chip may be mounted by a COG method or TAB method mentioned above. Additionally, plural or single gate line driver circuit and source line driver circuit may be used.

In the display device according to the present invention, a method for driving a screen display is not specifically limited, and for example, a dot sequential driving system, a line sequential driving system, a plane sequential driving system, or the like may be employed. Typically, the line sequential driving system is employed, and a time division gray-scale driving system or an area gray-scale driving system may be appropriately utilized. An image signal to be inputted into a source line of the display device may be either an analog signal or a digital signal, and the driver circuit or the like may be designed appropriately corresponding to an image signal.

Further, in a display device using a digital video signal, a video signal that is inputted into a pixel has a constant voltage (CV) or has a constant current (CC). As for a video signal with a constant voltage (CV), a voltage that is applied to a light emitting element is constant (CVCV), or a current that is applied to a light emitting element is constant (CVCC). In addition, as for a video signal with a constant current (CC), a voltage that is applied to a light emitting element is constant (CCCV), or a current that is applied to a light emitting element is constant (CCCC).

By using the present invention, a highly reliable display device can be manufactured through a simplified process. Therefore, a display device that exhibits high-precision and high-quality images can be manufactured at a low cost with high yield.

Embodiment Mode 2

Embodiment Mode of the present invention will be described with reference to FIG. 7 to FIG. 9. The present embodiment mode describes an example in which a second interlayer insulating layer is not formed in the display device manufactured in Embodiment Mode 1. Therefore, the repeated description of the same portions and the portions that has the same function is omitted.

As described in Embodiment Mode 1, a thin film transistor 173, a thin film transistor 174, a thin film transistor 175, a thin film transistor 176, a conductive layer 177, an insulating film 168 and an insulating film 168 are formed over a substrate 100. A source electrode layer or drain electrode layer connected to a source region or drain region of a semiconductor layer is formed in each thin film transistor. A first electrode layer 395 is formed to be in contact with a source electrode layer or drain electrode layer 172*b* in the thin film transistor 176 provided in a pixel region 206 (refer to FIG. 7(A)).

The first electrode layer 395 serves as a pixel electrode, and may be formed by using the same material and in the same process as the first electrode layer 185 in Embodiment Mode 1. In the present embodiment mode, light is extracted through the first electrode layer as in Embodiment Mode 1, and thus, ITSO that is a transparent conductive film is used as the first electrode layer 395 and patterned to be formed.

An insulator 186 is formed to cover an edge portion of the first electrode layer 395 and the thin film transistors (refer to FIG. 7(B)). Acrylic is used for the insulator 186 in the present embodiment mode. An electroluminescent layer 188 is formed over the first electrode layer, and a second electrode layer 189 is stacked thereover to form a light-emitting element 190. The second electrode layer 189 is electrically connected to a wiring layer 156 in a connection region 205. A terminal electrode layer 178 is bonded to an FPC 194 with an anisotropic conductive layer 196 therebetween in an external terminal connection region 202. A passivation film 191 is formed to cover the second electrode layer 189. The substrate 100 is attached to a sealing substrate 195 by a sealing material 192, and a filler 193 fills inside a display device (refer to FIG. 8). In a display device of the present invention, the sealing material 192 and the insulator 186 are formed separately so as not to be in contact with each other. When the sealing material and the insulator 186 are formed separately as described above, even when an insulating material using a high hygroscopic organic material is used for the insulator 186, water doses not easily enter, therefore, the light emitting element is prevented from deteriorating, which leads to the higher reliability of the display device.

In the display device shown in FIG. 9, the first electrode layer 395 can be selectively formed over the insulating film 168 before forming the source electrode layer or drain electrode layer 172*b* connected to the thin film transistor 176. In this case, a structure to connect the source electrode layer or drain electrode layer 172*b* to the first electrode layer 395 is a structure to stack the source electrode layer or drain electrode layer 172*b* on the first electrode layer 395 in the present embodiment mode. When the first electrode layer 395 is formed before forming the source electrode layer or drain electrode layer 172*b*, the first electrode layer 395 can be formed in a flat forming region; therefore, there are advantages of good coverage, good film formation conditions, and that the first electrode layer can be formed with good planarity since it is possible to sufficiently conduct a polishing treatment such as CMP.

In accordance with the present invention, a highly reliable display device can be manufactured through a simplified process. Therefore, a display device that exhibits high-precision and high-quality images can be manufactured at a low cost with high yield.

Embodiment Mode 3

Embodiment Mode of the present invention will be described with reference to FIG. 10. The present embodiment mode describes an example in which a gate electrode layer of a thin film transistor has a different structure in the display device manufactured in Embodiment Mode 1. Therefore, the repeated description of the same portions and the portions that has the same function is omitted.

FIGS. 10(A) to (C) show a display device that is in a manufacturing process and corresponds to the display device shown in FIG. 4(B) described in Embodiment Mode 1.

In FIG. 10(A), a thin film transistor 273 and a thin film transistor 274 are formed in a peripheral driver circuit region 214; a conductive layer 277 is formed in a connection region 215; and a thin film transistor 275 and a thin film transistor 276 are formed in a pixel region 216. A gate electrode layer of a thin film transistor in FIG. 10(A) has a stacked structure of two conductive films, in which an upper gate electrode layer is patterned to have a width narrower than a lower gate electrode layer. The lower gate electrode layer has a tapered shape but the upper gate electrode layer does not have a tapered shape. In this manner, the gate electrode layer may have a tapered shape or the angle of the side face thereof may substantially be perpendicular, namely, the gate electrode layer is not required to have a tapered shape.

In FIG. 10(B), a thin film transistor 373 and a thin film transistor 374 are formed in the peripheral driver circuit region 214; a conductive layer 377 is formed in the connection region 215; and a thin film transistor 375 and a thin film transistor 376 are formed in the pixel region 216. A gate electrode layer of a thin film transistor in FIG. 10(B) also has a stacked structure of two conductive films; however, the upper gate electrode layer and the lower gate electrode layer have a continuous tapered shape.

In FIG. 10(C), a thin film transistor 473 and a thin film transistor 474 are formed in the peripheral driver circuit region 214; a conductive layer 477 is formed in the connection region 215; and a thin film transistor 475 and a thin film transistor 476 are formed in the pixel region 216. A gate electrode layer of a thin film transistor in FIG. 10(C) has a single layer structure and has a tapered shape. As described, the gate electrode layer may also have a single layer structure.

As described above, the gate electrode layer can have various structures depending on the structure and the shape thereof. Thus, the manufactured display device can also have various structures. When an impurity region in a semiconductor layer is formed in a self alignment manner by using a gate electrode layer as a mask, the structure or a concentration distribution of the impurity region is varied depending on the structure of the gate electrode layer. When a thin film transistor is designed in consideration of the above, a thin film transistor that has desired functions can be manufactured.

The present embodiment mode can be freely combined with each of Embodiment Modes 1 and 2.

Embodiment Mode 4

A display device that has a light emitting element can be manufactured by applying the present invention. Light is emitted from the light emitting element in either of bottom emission, top emission, or both-sides emission. In the present embodiment mode, examples of a both-sides emission type and a top emission type will be described with reference to FIG. 11 and FIG. 12.

A display device shown in FIG. 12 includes an element substrate 1300, a thin film transistor 1355, a thin film transistor 1365, a thin film transistor 1375, a first electrode layer 1317, an electroluminescent layer 1319, a second electrode layer 1320, a transparent conductive film 1321, a filler 1322, a sealing material 1325, a gate insulating layer 1310, an insulating film 1311, an insulating film 1312, an insulating film 1313, an insulating film 1309, an insulator 1314, a sealing substrate 1323, a wiring layer 1308, a terminal electrode layer 1381, an anisotropic conductive layer 1382, an FPC 1383, a spacer 1330 and a light-emitting element 1305. The display device includes a region 221 to be cut out, an external terminal connection region 222, a wiring region 223, a peripheral driver circuit region 224 and a pixel region 226. The filler 1322 can be a composition in a liquid state and can be formed by a dropping method as in the case of the dropping method in FIG. 19. The light emitting display device is sealed by attaching the element substrate 1300 provided with the filler by a dropping method to the sealing substrate 1323.

The display device of FIG. 12 is a both-sides emission type, and has a structure in which light is emitted in directions indicated by arrows, namely, from both sides of the element substrate 1300 and the sealing substrate 1323. In the present embodiment mode, a transparent conductive film is formed and etched into a desired shape to form the first electrode layer 1317. A transparent conductive film can be used as the first electrode layer 1317. In addition to the transparent conductive film, a titanium nitride film or a titanium film may be used as the first electrode layer 1317. In this case, a titanium nitride film or a titanium film is formed to have a film thickness so as to transmit light (preferably, approximately 5 nm to 30 nm) after forming the transparent conductive film. In the present embodiment mode, ITSO is used as the first electrode layer 1317.

Then, a second electrode layer 1320 formed by using a conductive film is formed on the electroluminescent layer 1319. As the second electrode layer 1320, a material with a low work function (Al, Ag, Li, Ca; an alloy or compound thereof such as MgAg, MgIn, AlLi, $CaF_2$, or CaN) may be used. In the display device of FIG. 12, a stacked layer of a metal thin film with a thinned film thickness (MgAg: a film thickness of 10 nm) as the second electrode layer 1320, and ITSO that has a film thickness of 100 nm as the transparent conductive film 1321 is used so that light can be transmitted. As the transparent conductive film 1321, the same material as the above-mentioned first electrode layer 1317 can be used.

A display device of FIG. 11 is a one-side emission type, and has a structure in which top emission is performed in a direction indicated by an arrow. The display device shown in FIG. 11 includes an element substrate 1600, a thin film transistor 1655, a thin film transistor 1665, a thin film transistor 1675, a reflective metal layer 1624, a first electrode layer 1617, an electroluminescent film 1619, a second electrode layer 1620, a transparent conductive film 1621, a filler 1622, a sealing material 1625, a gate insulating layer 1610, an insulating film 1611, an insulating film 1612, an insulating film 1613, an insulating film 1609, an insulator 1614, a sealing substrate 1623, a wiring layer 1608, a terminal electrode layer 1681, an anisotropic conductive layer 1682, an FPC 1683, a spacer 1630 and a light-emitting element 1605. In the display device in FIG. 11, the insulating layer stacked over the terminal electrode layer 1681 is removed by etching. In this manner, the structure, in which a moisture permeable insulating layer (which can transmit water) is not provided in the periphery of the terminal electrode layer, can enhance the reliability. In addition, the display device includes a region 231 to be cut out, an external terminal connection region 232, a wiring region 233, a peripheral driver circuit region 234 and a pixel region 236. In this case, in the both-sides emission type display device shown in FIG. 12, a reflective metal layer 1624 is formed under the first electrode layer 1317. A first electrode layer 1617, which function as an anode and is a transparent conductive film, is formed on the reflective metal layer 1624. As the metal layer 1624, it may be at least reflective; therefore, Ta, W, Ti, Mo, Al, Cu or the like may be used. It is preferable to use a substance that has high reflectivity in a visible light range, and in the present embodiment mode, a TiN film is used.

The second electrode layer 1620 formed by using a conductive film is provided on the electroluminescent layer 1619. As the second electrode layer 1620, since it is made function as a cathode, a material with a low work function (Al, Ag, Li, Ca; an alloy or compound thereof such as MgAg, MgIn, AlLi, $CaF_2$, or CaN) may be used. In the present embodiment mode, a stacked layer of a metal thin film with thinned film thickness as the second electrode layer 1620 (MgAg: a film thickness of 10 nm) and ITSO that has a film thickness of 110 nm as the transparent conductive film 1621 is used so that light can be transmitted.

A mode of a light emitting element which can be applied in the present embodiment mode is shown in FIG. 13. The light emitting element has a structure in which an electroluminescent layer 860 is interposed between a first electrode layer 870 and a second electrode layer 850. A material of the first electrode layer and the second electrode layer is required to be selected considering the work functions. The first electrode layer and the second electrode layer can be either an anode or a cathode depending on the pixel structure. In the present embodiment mode, in the case where a driving TFT has p-channel conductivity, the first electrode layer may preferably be an anode and the second electrode layer may be a cathode. In addition, since the driving TFT has N-channel conductivity, the first electrode layer may preferably be a cathode and the second electrode layer may be an anode.

FIGS. 13(A) and (B) show the case where the first electrode layer 870 is an anode and the second electrode layer 850 is a cathode. In the electroluminescent layer 860, an HIL (hole injection layer) HTL (hole transport layer) 804, an EML (light emitting layer) 803, an ETL (electron transport layer) EIL (electron injection layer) 802, and a second electrode layer 850 are preferably stacked in order from the side of the first electrode layer 870. FIG. 13(A) shows a structure in which light is emitted from the first electrode layer 870, and the first electrode layer 870 includes an electrode layer 805 composed of a light-transmitting conductive oxide material, and the second electrode layer includes an electrode layer 801 that contains an alkali metal or an alkaline earth metal such as LiF or MgAg and an electrode layer 800 composed of a metal material such as aluminum from the side of the electroluminescent layer 860. FIG. 13(B) shows a structure in which light is emitted from the second electrode layer 850, and the first electrode layer includes an electrode layer 807 composed of a metal such as aluminum or titanium, or a metal material that contains such a metal and nitrogen of concentration in stoichiometric proportion or less, and a second electrode layer 806 composed of a conductive oxide material that contains silicon oxide at a concentration of 1 to 15 atomic %. The second electrode layer includes an electrode layer 801 that contains an alkali metal or an alkaline earth metal such as LiF or MgAg and an electrode layer 800 composed of a metal material such as aluminum from the side of the electroluminescent layer 860; each layer is formed to have a thickness of 100 nm or less to transmit light; thus, light can be emitted from the second electrode layer 850.

FIGS. 13(C) and (D) show the case where the first electrode layer 870 is a cathode and the second electrode layer 850 is an anode. In the electroluminescent layer 860, an EIL (electron injection layer) ETL (electron transport layer) 802, an EML (light emitting layer) 803, an HTL (hole transport layer) HIL (hole injection layer) 804, and the second electrode layer 850 which is an anode are preferably stacked in order from the cathode side. FIG. 13(C) shows a structure in which light is emitted from the first electrode layer 870. The first electrode layer 870 includes an electrode layer 801 that contains an alkali metal or an alkaline earth metal such as LiF or MgAg and an electrode layer 800 composed of a metal material such as aluminum from the side of the electroluminescent layer 860; each layer is formed to have a thickness of 100 nm or less to transmit light; thus, the light can be emitted from the first electrode layer 870. The second electrode layer includes a second electrode layer 806 composed of a conductive oxide material that contains silicon oxide at a concentration of 1 to 15 atomic % and an electrode layer 807 composed of a metal such as aluminum or titanium, or a metal material that contains such a metal and nitrogen of concentration in stoichiometric proportion or less, from the side of the electroluminescent layer 860. FIG. 13(D) shows a structure in which light is emitted from the second electrode layer 850. The first electrode layer 870 includes an electrode layer 801 that contains an alkali metal or an alkaline earth metal such as LiF or MgAg and an electrode layer 800 composed of a metal material such as aluminum from the side of the electroluminescent layer 860; the film thickness is made thick enough to reflect light produced in the electroluminescent layer 860. The second electrode layer 850 includes an electrode layer 805 composed of a light-transmitting conductive oxide material. The electroluminescent layer may have a single layer structure or a mixed structure in addition to a stacked structure.

As the electroluminescent layer, materials that show luminescence of red (R), green (G), and blue (B) are selectively formed by an evaporation method using an evaporation mask, respectively. The materials (low molecular weight or high molecular weight materials or the like) that show luminescence of red (R), green (G), and blue (B) can be formed by a droplet discharging method in the same manner as a color filter. This case is preferable since RGB can be separately colored without using masks.

In the case of the top emission type, when ITO or ITSO that has light-transmitting property is used for the second electrode layer, BzOs-Li in which Li is added into a benzoxazole derivative (BzOs) or the like can be used. In addition, Alq$_3$ doped with a dopant corresponding to respective luminescent colors of R, G, and B (DCM or the like for R, and DMQD or the like for G) may be used for the EML, for example.

It is to be noted that the electroluminescent layer is not limited to the above-mentioned materials. For example, hole injection property can be enhanced by co-evaporating oxide such as molybdenum oxide (MoOx: x=2 to 3) and α-NPD or rubrene instead of using CuPc or PEDOT. An organic material (including a low molecular weight or a high molecular weight material) or a composite material of an organic material and an inorganic material can be used for the material of the electroluminescent layer. A material that forms a light emitting element will be described below in detail.

As a substance that has high electron transport property among charge injection transport substances, for example, a metal complex that has a quinoline skeleton or a benzoquinoline skeleton such as tris(8-quinolinolato) aluminum (Abbreviation: Alq$_3$), tris(5-methyl-8-quinolinolato) aluminum (Abbreviation: Almq$_3$), bis (10-hydroxybenzo[h]-quinolinato) beryllium (Abbreviation: BeBq$_2$), bis (2-methyl-8-quinolinolato)-4-phenylphenolato-aluminum (Abbreviation: BAlq), and the like can be given. As a substance that has high hole transport property, for example, an aromatic amine compound (namely, which has the bond of benzene ring-nitrogen) such as 4,4'-bis[N-(1-naphthyl)-N-phenyl-amino]-biphenyl (Abbreviation: α-NPD), 4,4'-bis[N-(3-methylphenyl)-N-phenyl-amino]-biphenyl (Abbreviation: TPD), 4,4',4''-tris(N,N-diphenyl-amino)-triphenylamine (Abbreviation: TDATA), or 4,4',4''-tris[N-(3-methylphenyl)-N-phenyl-amino]-triphenylamine (Abbreviation: MTDATA) can be given.

As a substance that has particularly high electron injection property among charge injection transport substances, a compound of an alkali metal or an alkaline earth metal such as lithium fluoride (LiF), cesium fluoride (CsF), or calcium fluoride (CaF$_2$) can be given. In addition to this, it may be a mixture of a substance that has high electron transport property such as Alq$_3$ and an alkaline earth metal such as magnesium (Mg).

As a substance that has high hole injection property among charge injection transport substances, for example, metal oxide such as molybdenum oxide (MoOx), vanadium oxide (VOx), ruthenium oxide (RuOx), tungsten oxide (WOx), or manganese oxide (MnOx) can be given. In addition, phthalocyanine (Abbreviation: H$_2$Pc) or a phtalocyanine-based compound such as copper phthalocyanine (CuPc) can be used.

The light emitting layer may have a structure which performs color display by providing each pixel with a light emitting layer that has a different emission wavelength range. Typically, a light emitting layer corresponding to each color of R (red), G (green), or B (blue) is formed. Also in this case, color purity can be improved and a pixel portion can be prevented from having a mirror surface (reflection) by providing the light emission side of the pixel with a filter which transmits light of the emission wavelength range. By providing a filter, a circularly polarizing plate or the like, which has been conventionally required, can be omitted, and further, the loss of light emitted from the light emitting layer can be eliminated. Moreover, change in hue, which occurs when a pixel portion (display screen) is obliquely seen, can be reduced.

Various materials can be used for a luminescent material. As a low molecular weight organic luminescent material, 4-dicyanomethylene-2-methyl-6-[2-(1,1,7,7-tetramethyl-9-julolidyl)ethenyl]-4H-pyran; (Abbreviation: DCJT); 4-dicyanomethylene-2-t-butyl-6-[2-(1,1,7,7-tetramethyljulolidine-9-yl)ethenyl]-4H-pyran; (Abbreviation: DCJTB); periflanthene; 2,5-dicyano-1,4-bis[2-(10-methoxy-1,1,7,7-tetramethyljulolidine-9-yl)ethenyl]benzene; N,N'-dimethylquinacridon (Abbreviation: DMQd); coumarin6; coumarin545T; tris(8-quinolinolato)aluminum (Abbreviation: Alq$_3$); 9,9'-bianthryl; 9,10-diphenyl anthracene (Abbreviation: DPA); 9,10-bis(2-naphthyl)anthracene (Abbreviation: DNA); and the like can be used. Another substance can also be used.

On the other hand, a high molecular weight organic luminescent material is higher in physical strength than a low molecular weight material and is superior in durability of the element. In addition, film formation by coating is possible; therefore, the element can be relatively manufactured easily. The structure of a light emitting element using a high molecular weight organic luminescent material basically has the same structure as in the case of using a low molecular weight organic luminescent material, that is, a cathode, an organic light emitting layer, and an anode in order. However, it is difficult to form such a stacked structure as in the case of using a low molecular weight organic luminescent material when a light emitting layer using a high molecular weight organic luminescent material is formed, and thus, a two-layer structure is employed in many cases. Specifically, a stacked structure is; a cathode, a light emitting layer, a hole transport layer, and an anode in order.

An emission color is determined depending on a material that forms the light emitting layer; therefore, a light emitting element which shows desired luminescence can be formed by selecting the material. As a high molecular weight electroluminescent material which can be used for forming a light emitting layer, a polyparaphenylene-vinylene-based, a polyparaphenylene-based, a polythiophene-based, or a polyfluorene-based can be used.

As the polyparaphenylene vinylene-based, a derivative of poly(paraphenylenevinylene) [PPV] such as poly(2,5-dialkoxy-1,4-phenylenevinylene) [RO-PPV]; poly(2-(2'-ethyl-hexoxy)-5-methoxy-1,4-phenylenevinylene) [MEH-PPV]; or poly(2-(dialkoxyphenyl)-1,4-phenylenevinylene) [ROPh-PPV] can be given. As the polyparaphenylene-based, a derivative of polyparaphenylene [PPP] such as poly(2,5-dialkoxy-1,4-phenylene) [RO-PPP]; or poly(2,5-dihexoxy-1,4-phenylene) can be given. As the polythiophene-based, a derivative of polythiophene [PT] such as poly(3-alkylthiophene) [PAT]; poly(3-hexylthiophen) [PHT]; poly(3-cyclohexylthiophen) [PCHT]; poly(3-cyclohexyl-4-methylthiophene) [PCHMT]; poly(3,4-di cyclohexylthiophene) [PDCHT]; poly[3-(4-octylphenyl)-thiophene] [POPT]; or poly[3-(4-octylphenyl)-2,2bithiophene] [PTOPT] can be given. As the polyfluorene-based, a derivative of polyfluorene [PF] such as poly(9,9-dialkylfluorene) [PDAF] or poly(9,9-dioctylfluorene) [PDGF] can be given.

When a high molecular weight organic luminescent material that has hole transport property is formed between an anode and a high molecular weight organic luminescent material that has light emitting property, hole injection property from the anode can be enhanced. Generally, it is dissolved in water with an acceptor material and is applied by a spin coating method or the like. In addition, because of being insoluble in an organic solvent, it can be stacked with the above-mentioned organic luminescent material that has light emitting property. As the high molecular weight organic luminescent material that has hole transport property, a mixture of PEDOT and camphor sulfonic acid (CSA) that serves as an acceptor material, a mixture of polyaniline [PANI] and polystyrene sulfonic acid [PSS] that serves as an acceptor material, or the like can be used.

The light emitting layer can be made to have a structure which emits single color or white light. In the case where a luminescent material for white light is used, color display can be made possible as a structure in which a filter (a coloring layer) which transmits light that has a specific wavelength on the light emitting side of a pixel is provided.

In order to form a light emitting layer that emits white light, for example, $Alq_3$, $Alq_3$ partially doped with Nile red that is a red light emitting colorant, $Alq_3$, p-EtTAZ, TPD (aromatic diamine) are stacked in order by an evaporation method to obtain white light. In the case where an EL is formed by a coating method using spin coating, it is preferable to conduct baking by vacuum heating after the coating. For example, an aqueous solution of poly(ethylene dioxythiophene)/poly(styrene sulfonic acid) (PEDOT/PSS) that serves as a hole injection layer may be applied on the entire surface and baked. Then, a polyvinyl carbazole (PVK) solution doped with a luminescent center colorant (1,1,4,4-tetraphenyl-1,3-butadiene (TPB); 4-dicyanomethylene-2-methyl-6-(p-dimethylamino-styryl)-4H-pyran (DCM1); Nile red; coumarin6; or the like) that serves as a light emitting layer may be applied on the entire surface and baked.

The light emitting layer may be formed as a single layer, and a 1,3,4-oxadiazole derivative (PBD) that has electron transport property may be dispersed in polyvinyl carbazole (PVK) that has hole transport property. Further, white light emission can be obtained by dispersing PBD of 30 wt % as an electron transport agent and dispersing an appropriate amount of four kinds of colorants (TPB, coumarin6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, in addition to a singlet excited luminescent material, a triplet excited material that contains a metal complex or the like may be used for the light emitting layer. For example, among a pixel that emits red light, a pixel that emits green light, and a pixel that emits blue light, a pixel that emits red light, in which time to reduce luminance by half is relatively short, is formed by using a triplet excited luminescent material and the rest are formed by using a singlet excited luminescent material. A triplet excited luminescent material has a feature that less power consumption is needed to obtain the same luminance because of good luminous efficiency. In other words, in the case where it is used for a red pixel, it is possible to supply only a small amount of current to a light emitting element. Thus, reliability can be improved. A pixel that emits red light and a pixel that emits green light may be formed by using a triplet excited luminescent material, and a pixel that emits blue light may be formed by using a singlet excited luminescent material to achieve low power consumption. Low power consumption can be further achieved by forming a light emitting element which emits green light that has high visibility for human by using a triplet excited luminescent material.

A metal complex used as a dopant is an example of a triplet excited luminescent material, and a metal complex that has platinum that is a third transition series element as a central metal, a metal complex that has iridium as a central metal, and the like are known. A triplet excited luminescent material is not limited to these compounds, and a compound that has the above described structure and an element that belongs to the Groups 8 to 10 of the periodic table as a central metal can also be used.

The above described substances for forming a light emitting layer are just examples. A light emitting element can be formed by appropriately stacking each functional layer such as a hole injection transport layer, a hole transport layer, an electron injection transport layer, an electron transport layer, a light emitting layer, an electron blocking layer and a hole blocking layer. Further, a mixed layer or a mixed junction in which these layers are combined may also be formed. The layer structure of the light emitting layer can be varied. Instead of providing no specific electron injection region or light emitting region, modification such as providing an electrode layer mainly for this purpose or dispersing a luminescent material to be provided is acceptable as long as it does not deviate from the spirit of the present invention.

A light emitting element formed by using the above described materials emits light by being forward biased. A pixel of a display device formed by using a light emitting element can be driven by a simple matrix mode or an active matrix mode. In any case, each pixel emits light by applying a forward bias thereto at a specific timing; however, the pixel is in a non-light-emitting state for a certain period. The reliability of the light emitting element can be improved by applying a reverse bias in this non-light-emitting time. In the light emitting element, there is deterioration in which emission intensity is decreased under constant driving conditions or a deterioration mode in which a non-light-emitting region is enlarged in the pixel and luminance is apparently lowered. However, the progression of the deterioration can be slowed down by alternating current driving where bias is applied forwardly and reversely. Thus, the reliability of the light emitting device can be improved. Additionally, either of digital driving or analog driving can be applied.

Therefore, a color filter (coloring layer) may be formed over the sealing substrate. The color filter (coloring layer) can be formed by an evaporation method or a droplet discharging method. With the use of the color filter (coloring layer), high-definition display can also be performed. This is because a broad peak can be modified to a sharp peak in light emission spectrum of each RGB by the color filter (coloring layer).

The case of forming a material that shows each luminescence of R, G, and B has been described above; however, full color display can be performed by forming a material that shows a single color light-emission and combining a color filter and a color conversion layer. The color filter (coloring layer) or the color conversion layer is formed over, for example, a second substrate (a sealing substrate) and may be attached to a substrate.

Obviously, display of single color light-emission may also be performed. For example, an area color type display device may be manufactured by using single color light-emission. The area color type is suitable for a passive matrix type display portion, and can mainly display characters and symbols.

In the above-mentioned structure, it is possible to use a material that has a low work function as a cathode, and for example, Ca, Al, CaF, MgAg, AlLi, or the like is desirable. The electroluminescent layer may be any of a single layer type, a stacked layer type, or a mixed type that has no interface between layers. The electroluminescent layer may be formed by using a singlet material, a triplet material, or a mixed material thereof; or by using a charge injection transport substance and a luminescent material that include an organic compound or an inorganic compound, and the electroluminescent layer includes one or plural layers selected from a low molecular weight organic compound, an intermediate molecular weight organic compound (which means an organic compound that has no sublimation property, and the number of molecules is 20 or less, or the length of linked molecules is 10 μm or less), and a high molecular weight organic compound depending on the number of molecules, and may be combined with an electron injection transport or a hole injection transport inorganic compound. The first electrode layer is formed by using a transparent conductive film which transmits light, and for example, a transparent conductive film in which zinc oxide (ZnO) of 2 to 20% is mixed in indium oxide is used in addition to ITO or ITSO. A plasma treatment in an oxygen atmosphere or a heat treatment in a vacuum atmosphere may be performed before forming the first electrode layer. The partition wall (also referred to as a embankment) is formed by using a material that contains silicon, an organic material or a compound material. Additionally, a porous film may be used. It is to be noted that, when a photosensitive or a non-photosensitive material such as acrylic or polyimide is used to form, the side face thereof has a shape in which a radius of curvature changes continuously, and a thin film of an upper layer is formed without causing disconnection (without being broken), which is preferable. The present embodiment mode can be freely combined with the embodiment modes as described above.

By using the present invention, a highly reliable display device can be manufactured through a simplified process. Therefore, a display device that exhibits high-precision and high-quality images can be manufactured at a low cost with high yield.

The present embodiment mode can be freely combined with Embodiment Modes 1 to 3 to be used.

Embodiment Mode 5

One mode in which protective diodes are provided for a scanning line input terminal portion and a signal line input terminal portion will be explained with reference to FIG. 15. In FIG. 15, a TFT 501, a TFT 502, a capacitor element 504, and a light emitting element 503 are provided in a pixel 2702. These TFTs have the same structure as the one in Embodiment Mode 1.

A protective diode 561 and a protective diode 562 are provided for the signal line input terminal portion. These protective diodes are manufactured in the same process as the TFT 501 or the TFT 502 and are operated as diodes by being connected to a gate and one of a drain and a source. FIG. 14 shows an equivalent circuit diagram of the top view shown in FIG. 15.

The protective diode 561 includes a gate electrode layer, a semiconductor layer and a wiring layer. The protective diode 562 has the similar structure. A common potential line 554 and a common potential line 555 connected to the protective diodes are formed in the same layer as the gate electrode layer. Therefore, it is necessary to form a contact hole in the insulating layer to electrically connect them to the wiring layer.

A mask layer may be formed and etching-processed to form a contact hole in the insulating layer. In this case, when an etching process of atmospheric pressure discharge is applied, local discharging process can be performed, and the mask layer is not necessarily formed over the entire surface of the substrate.

A signal wiring layer is formed in the same layer as a source and drain wiring layer 505 in the TFT 501, and has a structure in which the signal wiring layer connected thereto is connected to the source or drain side.

The scanning signal line input terminal portion also has the same structure. The protective diode 563 includes a gate electrode layer, a semiconductor layer and a wiring layer. The protective diode 564 also has the same structure. A common potential line 556 and a common potential line 557 connected to these protective diodes are formed in the same layer as a source and a drain wiring layer. The protective diode provided in an input stage can be formed at the same time. It is to be noted that the position of disposing a protective diode is not limited to the present embodiment mode and can also be provided between the driver circuit and the pixel.

Embodiment Mode 6

A television device can be completed by using a display device formed according to the present invention. A display panel may have any mode: there is a case, where only a pixel portion is formed as a structure shown in FIG. 16(A), and a scanning line driver circuit and a signal line driver circuit are mounted by a TAB method as shown in FIG. 17(B), or mounted by a COG method shown in FIG. 17(A); a case where a TFT is formed by using an SAS as shown in FIG. 16(B) and a pixel portion and a scanning line driver circuit are formed to be integrated over a substrate while a signal line driver circuit is separately mounted as a driver IC; or a pixel portion, a signal line driver circuit and a scanning line driver circuit are formed to be integrated over the substrate as shown in FIG. 16(C); or the like.

Another structure of an external circuit includes an image signal amplifier circuit which amplifies an image signal among signals received by a tuner; an image signal processing circuit which converts a signal outputted therefrom into a chrominance signal corresponding to each color of red, green, and blue; a control circuit which converts the image signal into an input specification of a driver IC; and the like on the input side of the image signal. The control circuit outputs the signal into the scanning line side and the signal line side, respectively. In the case of digital driving, a signal dividing circuit may be provided on the signal line side so that an input digital signal is supplied by being divided into m-pieces.

Among signals received from the tuner, an audio signal is transmitted to an audio signal amplifier circuit, and the output thereof is supplied to a speaker through an audio signal processing circuit. The control circuit receives control information on a receiving station (a receiving frequency) or sound volume from an input portion, and transmits the signal to the tuner or the audio signal processing circuit.

As shown in FIGS. 20(A) and (B), a television device can be completed by incorporating a display module into a chassis. The display panel in which an FPC is attached as shown in FIG. 1 is generally called an EL display module. An EL television device can be completed with the use of the EL display module as in FIG. 1. A main screen 2003 is formed by using the display module, and a speaker unit 2009, operation switches, and the like are provided as other attached equipments. In this way, the television device can be completed in accordance with the present invention.

In addition, reflected light of light entered from outside may be shielded by using a phase difference plate and a polarizing plate. In the case of a top emission display device, an insulating layer which is to be a partition wall may be colored and used as a black matrix. The partition wall can be formed by a droplet discharging method or the like, and a pigment-based black resin, a resin material such as polyimide may be mixed with carbon black or the like, or a stacked layer thereof may also be used. Depending on a droplet discharging method, different materials may be discharged on the same region plural times to form the partition wall. As a phase difference plate and a phase plate, a $\lambda/4$ plate and a $\lambda/2$ plate may be used and designed to be able to control light. As the structure, a TFT element substrate, a light emitting element, a sealing substrate (sealing material), a phase difference plate, a phase difference plate (a $\lambda/4$ plate, a $\lambda/2$ plate) and a polarizing plate are stacked in order, in which light emitted from the light emitting element is emitted outside from the polarizing plate side through the above components. The phase difference plate or polarizing plate may be provided on a side to which light is emitted, or may be provided on the both sides in the case of a dual emission type display device in which light is emitted from the both sides. In addition, an anti-reflective film may be provided on the outer side of the polarizing plate. Consequently, a higher definition and higher accurate image can be displayed.

As shown in FIG. 20(A), a display panel 2002 using a display element is incorporated into a chassis 2001. In addition to reception of general TV broadcast by using a receiver 2005, information communication can also be carried out in one direction (from a transmitter to a receiver) or in the both directions (between a transmitter and a receiver, or between receivers) by connecting to a cable or wireless communication network through a modem 2004. The operation of the television device can be carried out by switches incorporated in the chassis or by a remote control device 2006, which is separated component. A display portion 2007 that displays information to be outputted may also be provided in this remote control device.

In addition, in the television device, a structure for displaying a channel, sound volume or the like may be additionally provided by forming a sub-screen 2008 using a second display panel in addition to the main screen 2003. In this structure, the main screen 2003 is formed by using an EL display panel that is superior in viewing angle, and the sub-screen may be formed by using a liquid crystal display panel capable of displaying with low power consumption. In order to prioritize low power consumption, a structure may also be provided, in which the main screen 2003 is formed by using a liquid crystal display panel, the sub-screen is formed by using an EL display panel, and the sub-screen is able to flash on and off. In accordance with the present invention, a highly reliable display device can be manufactured by using such a large substrate, many TFTs and electronic parts.

FIG. 20(B) is a television device that has a large display portion of, for example, 20 to 80 inches, which includes a chassis 2010, a keyboard portion 2012 which is an operation portion, a display portion 2011, a speaker unit 2013, and the like. The present invention is applied to manufacture the display portion 2011. Since a bendable substance is used for the display portion of FIG. 20(B), a television device that has a curved display portion can be given. Thus, since the shape of the display portion can be freely designed, a television device that has a desired shape can be manufactured.

In accordance with the present invention, a display device can be manufactured through a simplified process, and thus, the cost can also be reduced. Hence, even a television device with a large screen display portion can be formed with low cost by applying the present invention. Accordingly, a high-performance and highly reliable television device can be manufactured with high yield.

Obviously, the present invention is not limited to the television device and is applicable to various usages, namely, as large area display mediums such as an information display board at a train station, an airport or the like, or an advertisement display board on the street as well as a monitor of a personal computer.

Embodiment Mode 7

Various display devices can be manufactured by applying the present invention. In other words, the present invention can be applied to various electronic devices in which these display devices are incorporated into display portions.

As the electronic devices as described above, a camera such as a video camera and a digital camera, a projector, a head mounted display (a goggle type display), a car navigation, a car stereo, a personal computer, a game machine, a portable information terminal (a mobile computer, a cellular phone, an electronic book, or the like), an image reproducing device provided with a recording medium (specifically a device that is capable of reproducing a recording medium such as a Digital Versatile Disc (DVD) and that has a display capable of displaying the image) or the like are given. FIG. 21 shows the examples thereof.

FIG. 21(A) shows a computer, which includes a main body 2101, a chassis 2102, a display portion 2103, a keyboard 2104, an external connection port 2105, a pointing mouse 2106 and the like. By using the present invention, a computer, by which an image with high reliability and high quality can be displayed, can be completed even when the computer is miniaturized and a pixel becomes minute.

FIG. 21(B) shows an image reproducing device provided with a recording medium (specifically a DVD player), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information. By using the present invention, an image reproducing device, by which an image with high reliability and high quality can be displayed, can be completed even when the image reproducing device is miniaturized and a pixel becomes minute.

FIG. 21(C) shows a cellular phone, which includes a main body 2301, an audio output portion 2302, an audio input portion 2303, a display portion 2304, operation switches 2305, an antenna 2306 and the like. By using the present invention, a cellular phone, by which an image with high reliability and high quality can be displayed, can be completed even when the cellular phone is miniaturized and a pixel becomes minute.

FIG. 21(D) shows a video camera, which includes a main body 2401, a display portion 2402, a chassis 2403, an external connection port 2404, a remote control receiving portion 2405, an image receiving portion 2406, a battery 2407, an audio input portion 2408, an eyepiece 2409, operation keys 2410 and the like. In accordance with the present invention, a video camera, by which an image with high reliability and high quality can be displayed, can be completed even when the video camera is miniaturized and a pixel is minute. The present embodiment mode can be freely combined with the above embodiment modes.

Figure 1:
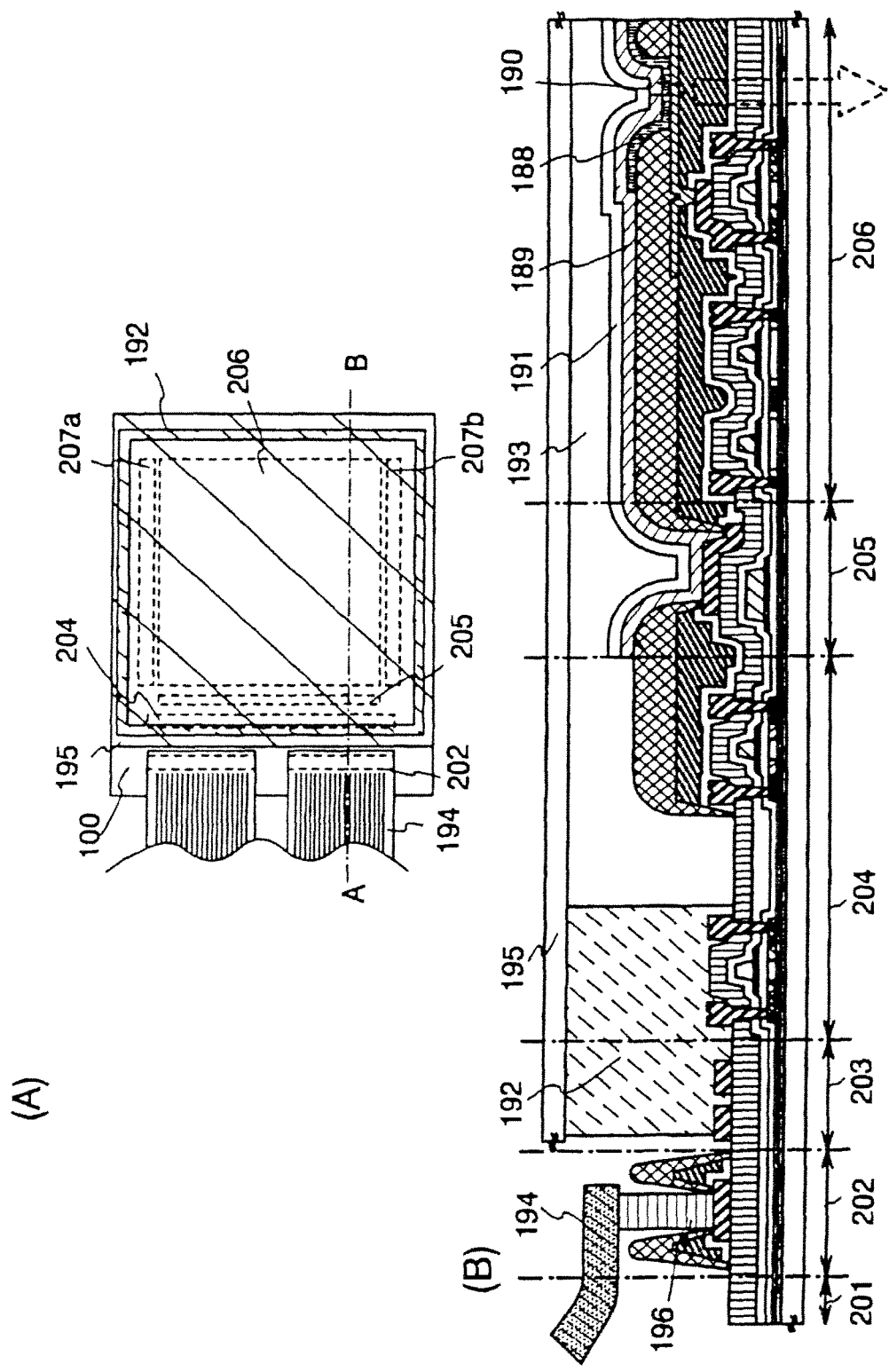
FIG. 1 Diagrams illustrating a display device of the present invention
Figure 2:
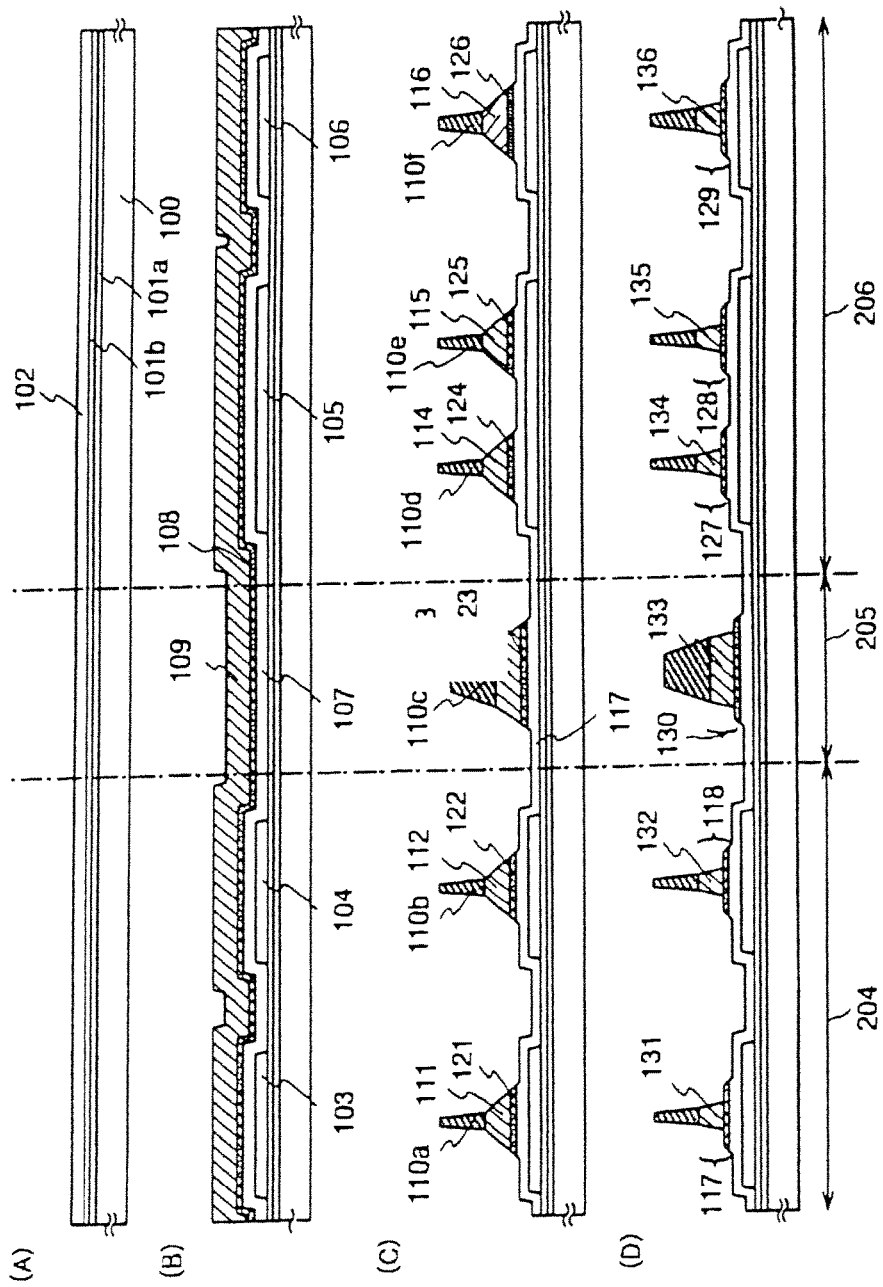
FIG. 2 Diagrams illustrating a manufacturing method of a display device of the present invention FIG. 3 Diagrams illustrating a manufacturing method of a display device of the present invention FIG. 4 Diagrams illustrating a manufacturing method of a display device of the present invention FIG. 5 Diagrams illustrating a manufacturing method of a display device of the present invention FIG. 6 Diagrams illustrating a manufacturing method of a display device of the present invention FIG. 7 Diagrams illustrating a manufacturing method of a display device of the present invention FIG. 8 A diagram illustrating a display device of the present invention FIG. 9 A diagram illustrating a display device of the present invention FIG. 10 Diagrams illustrating a display device of the present invention FIG. 11 A diagram illustrating a display device of the present invention FIG. 12 A diagram illustrating a display device of the present invention FIG. 13 Diagrams illustrating a structure of a light emitting element that can be applied to the present invention FIG. 14 An equivalent circuit diagram of an EL display device that will be described in FIG. 15
Figure 3:
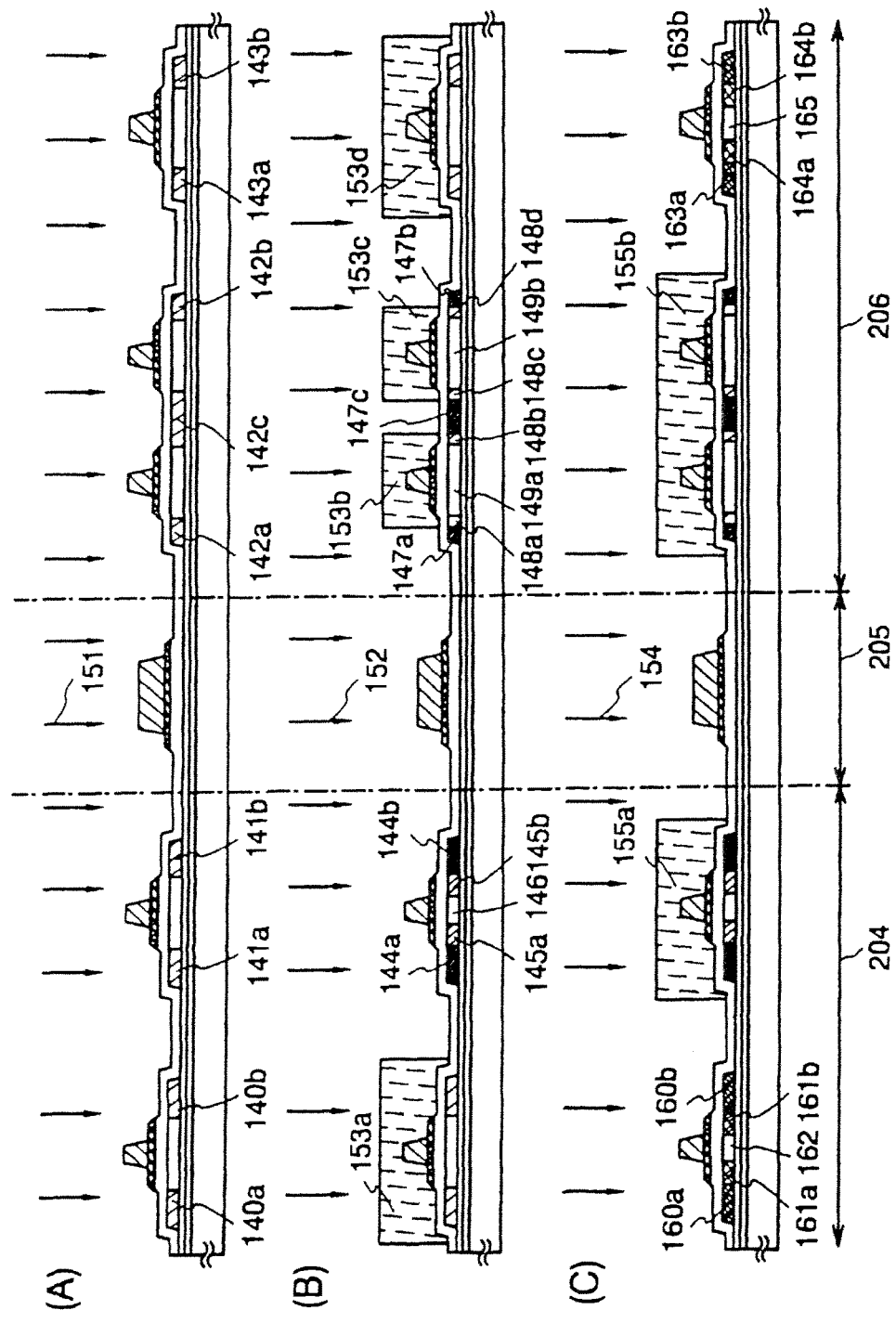
Figure 4:
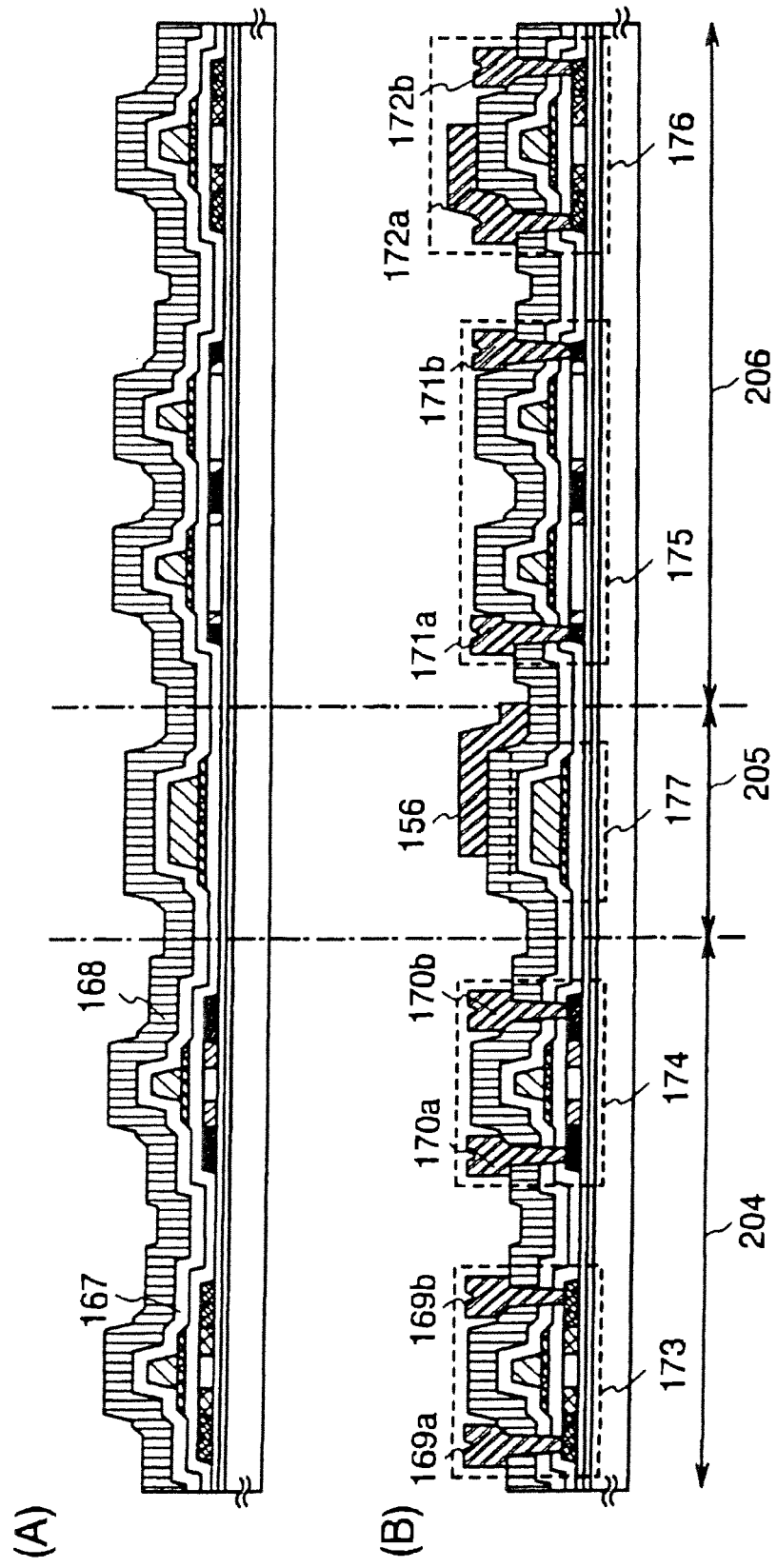
Figure 5:
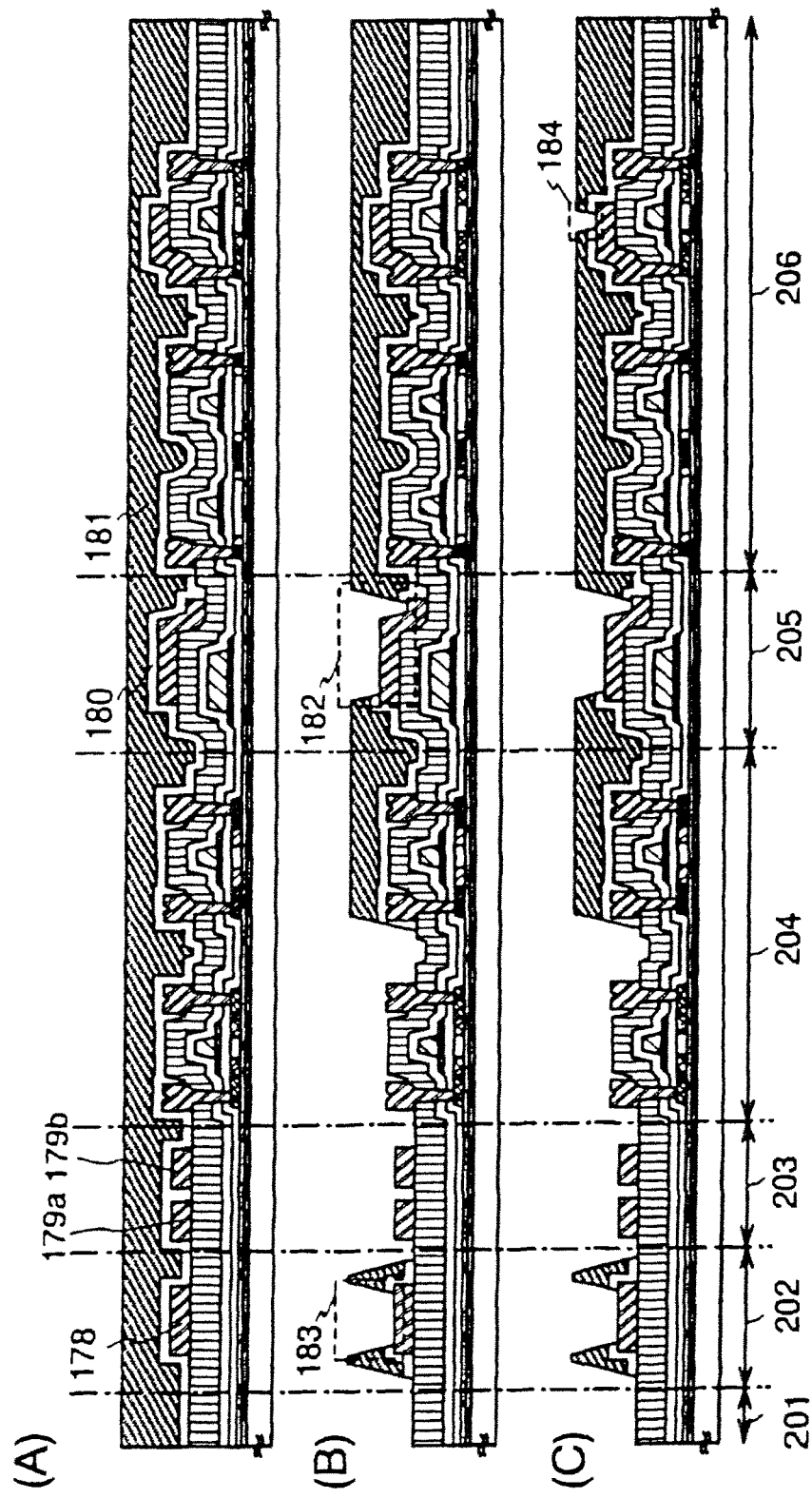
Figure 6:
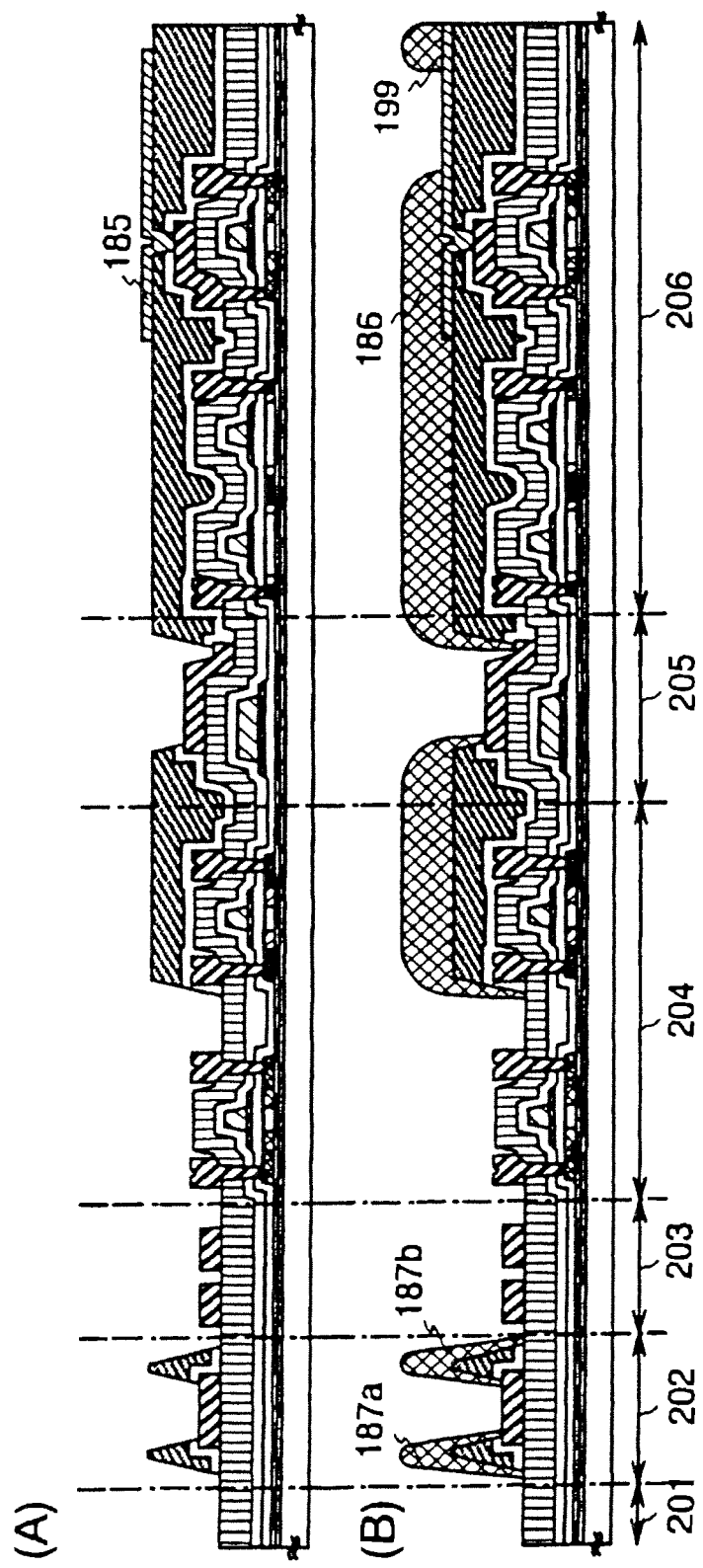
Figure 7:
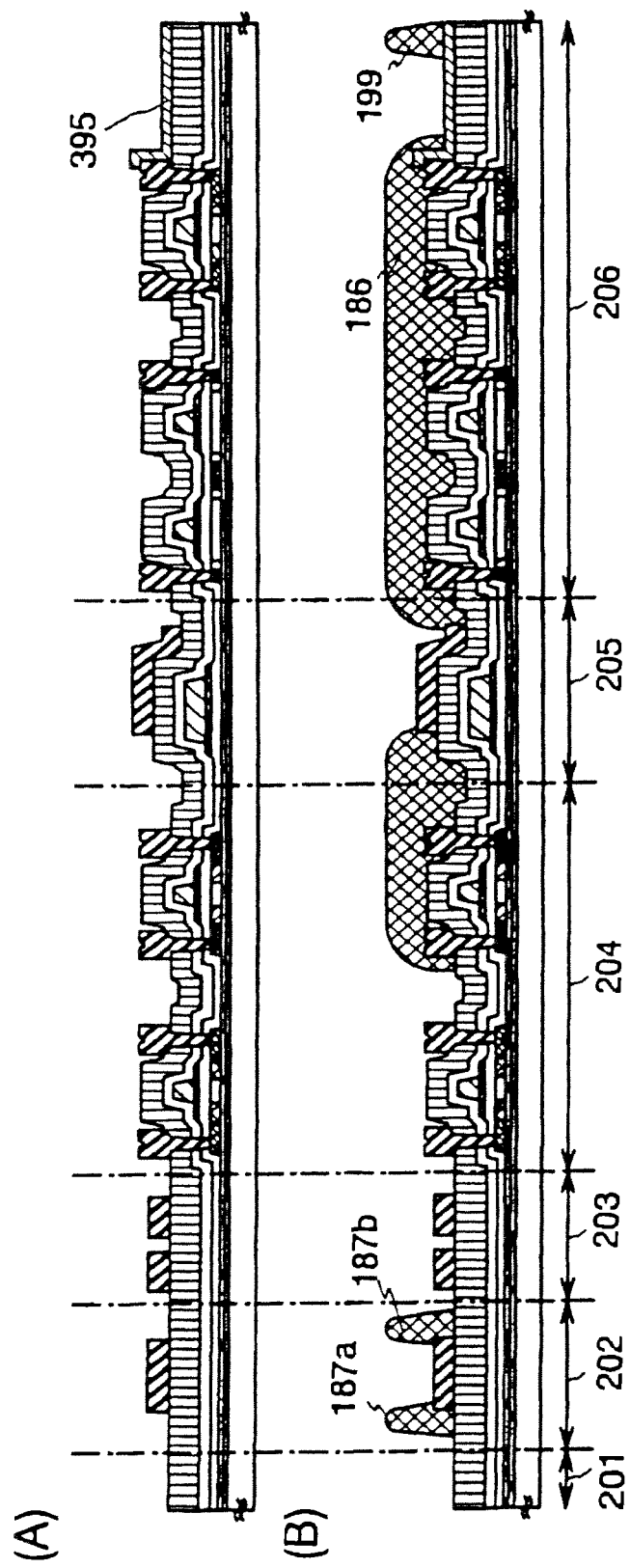
Figure 8:
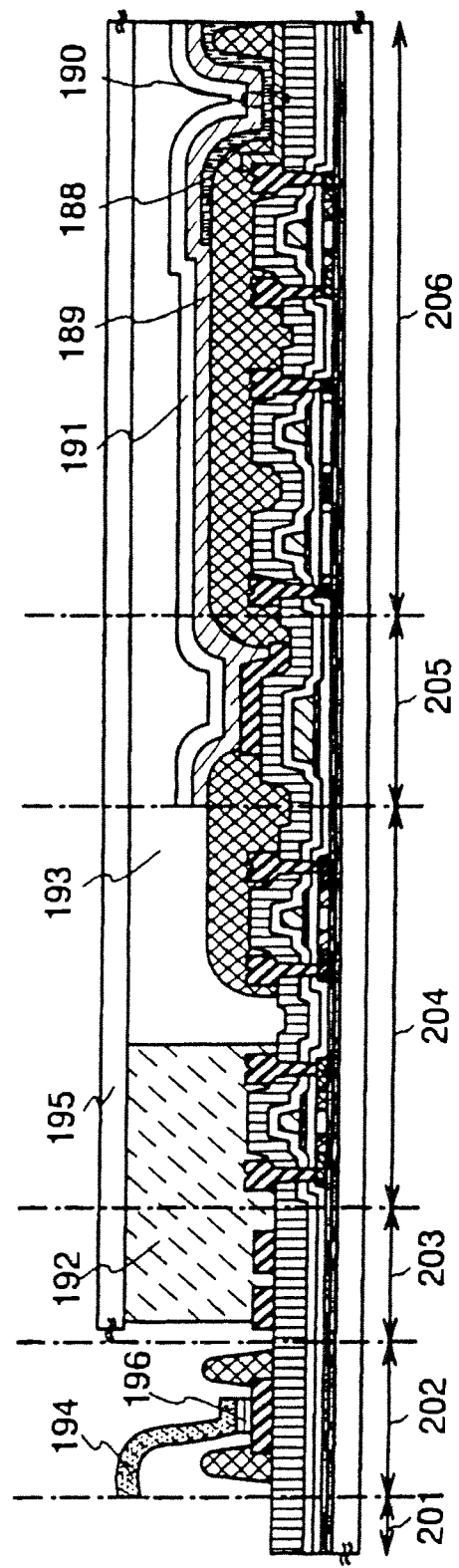
Figure 9:
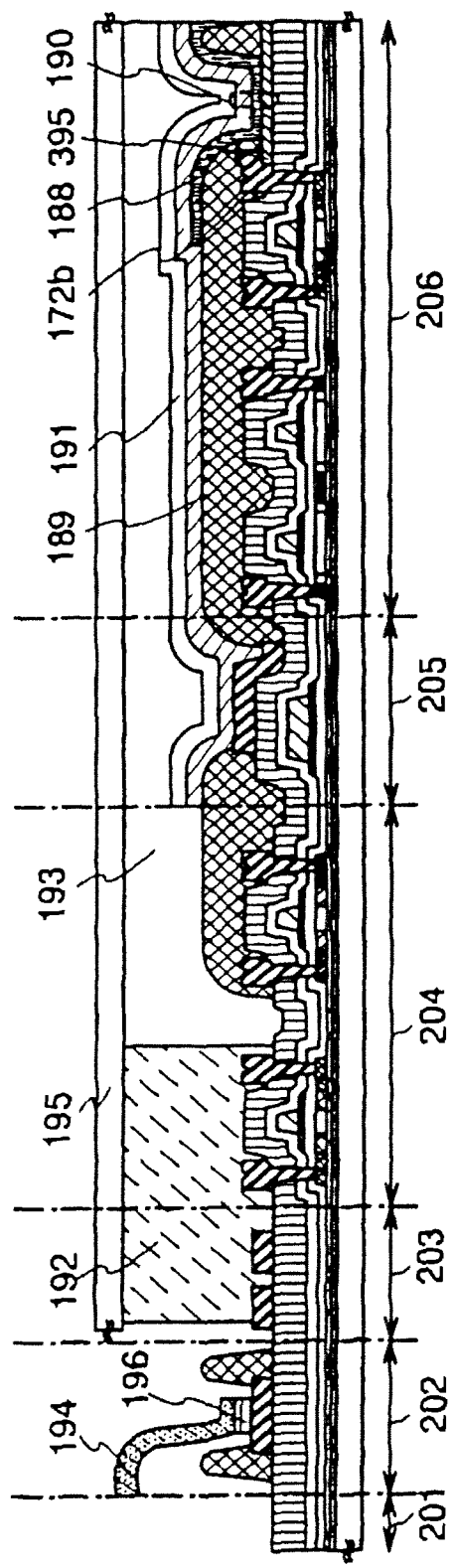
Figure 10:
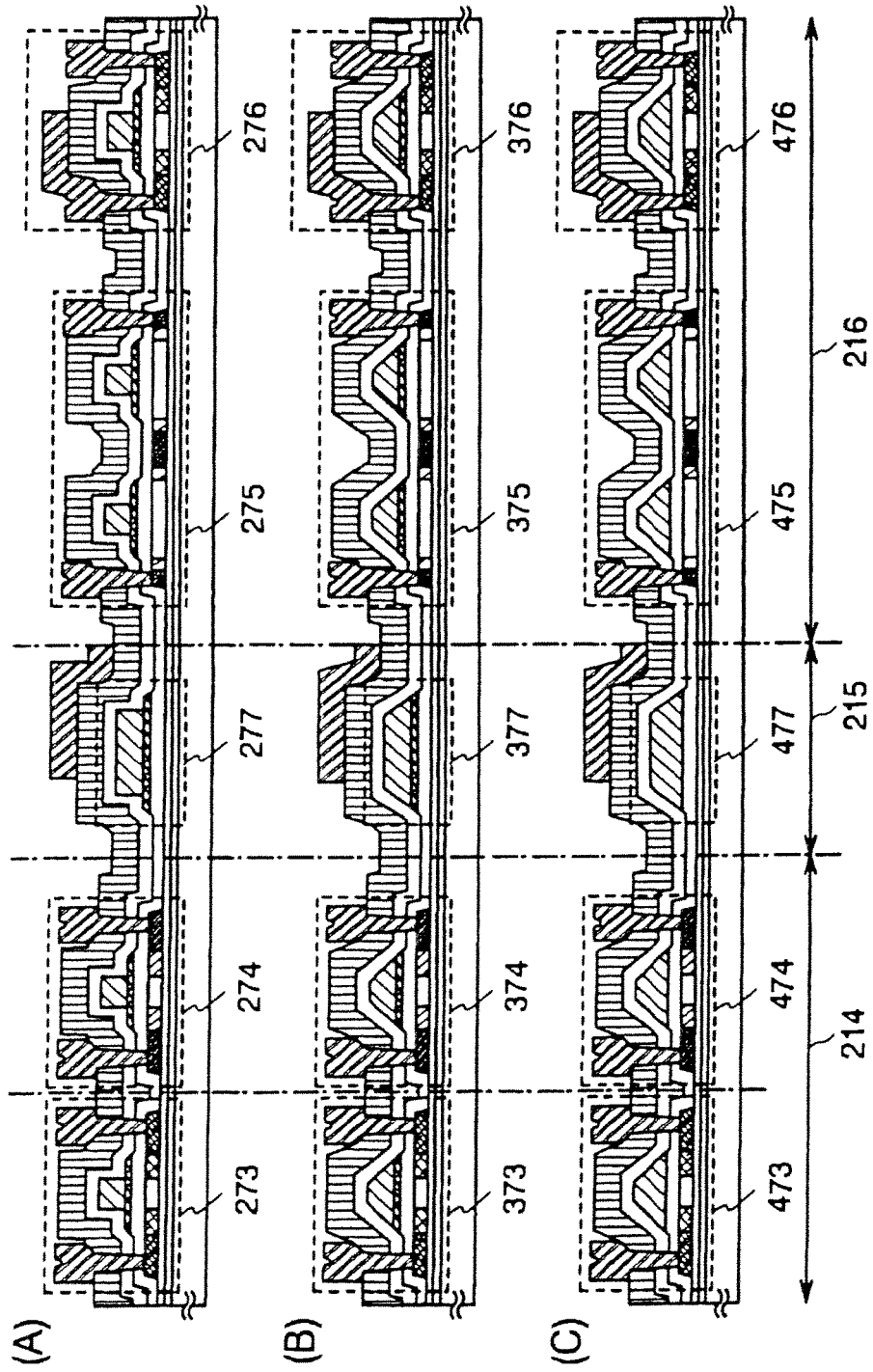
Figure 11:
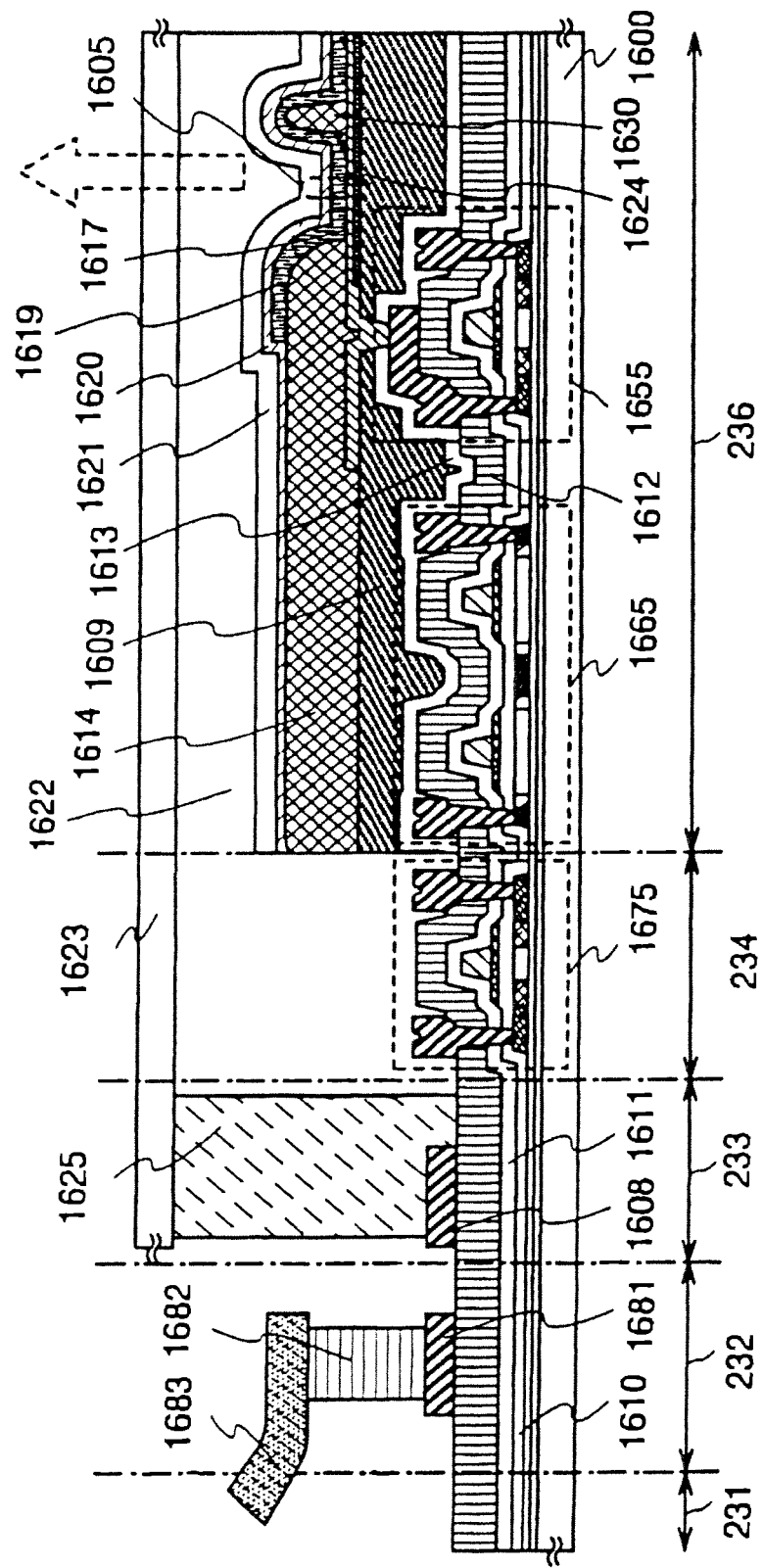
Figure 12:
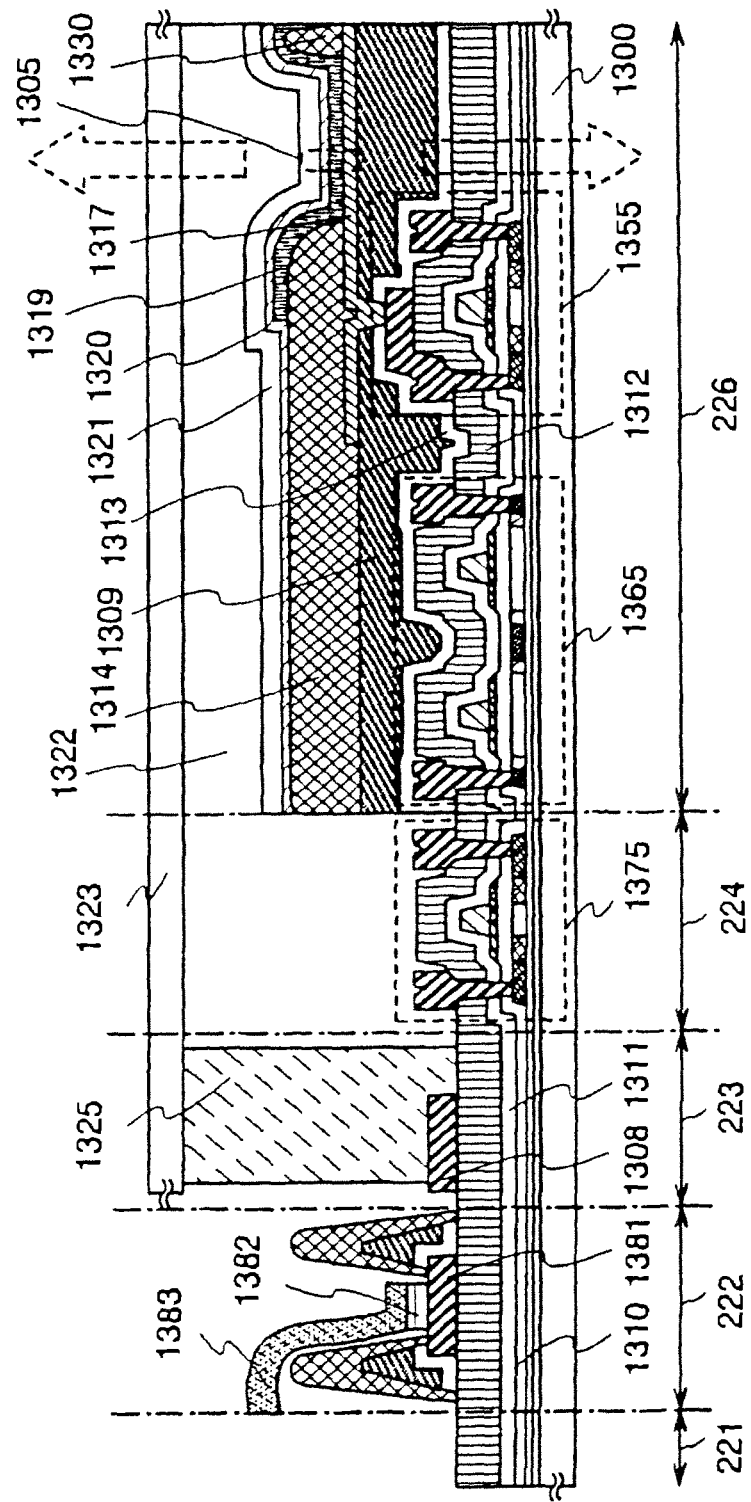
Figure 13:
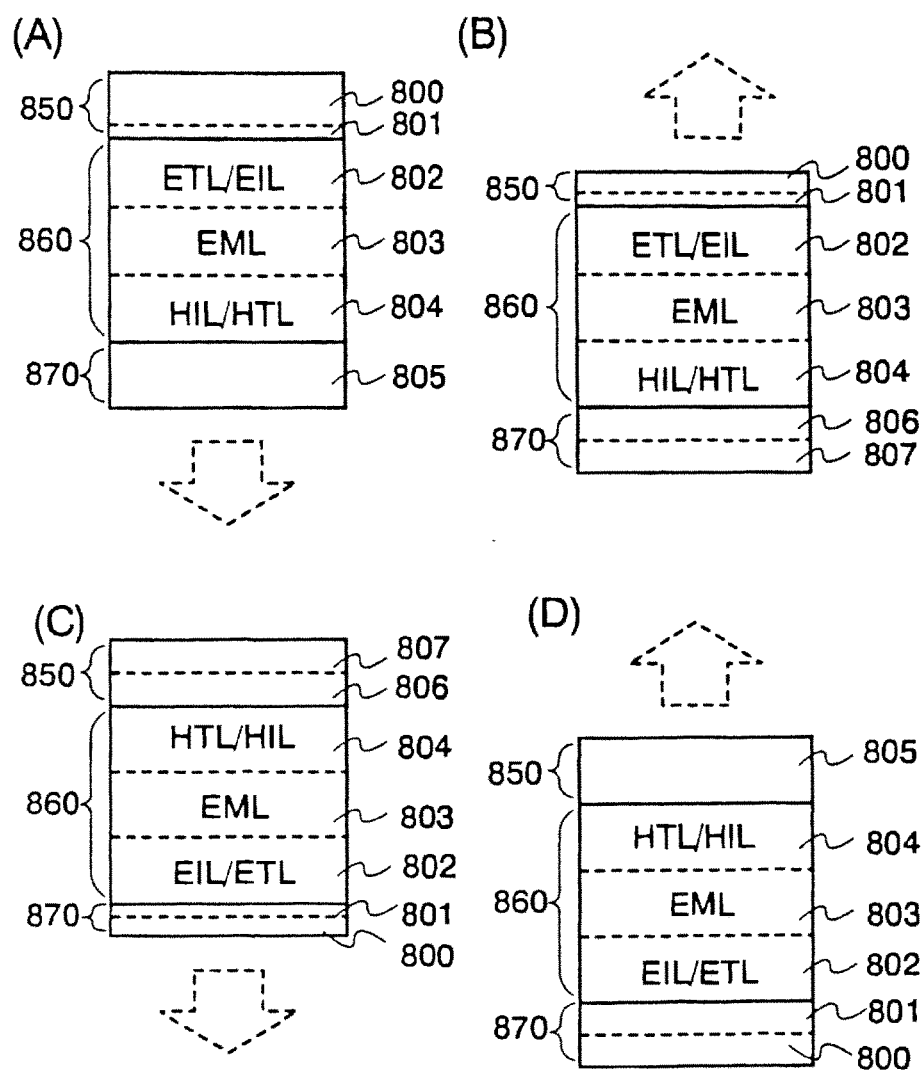
Figure 14:
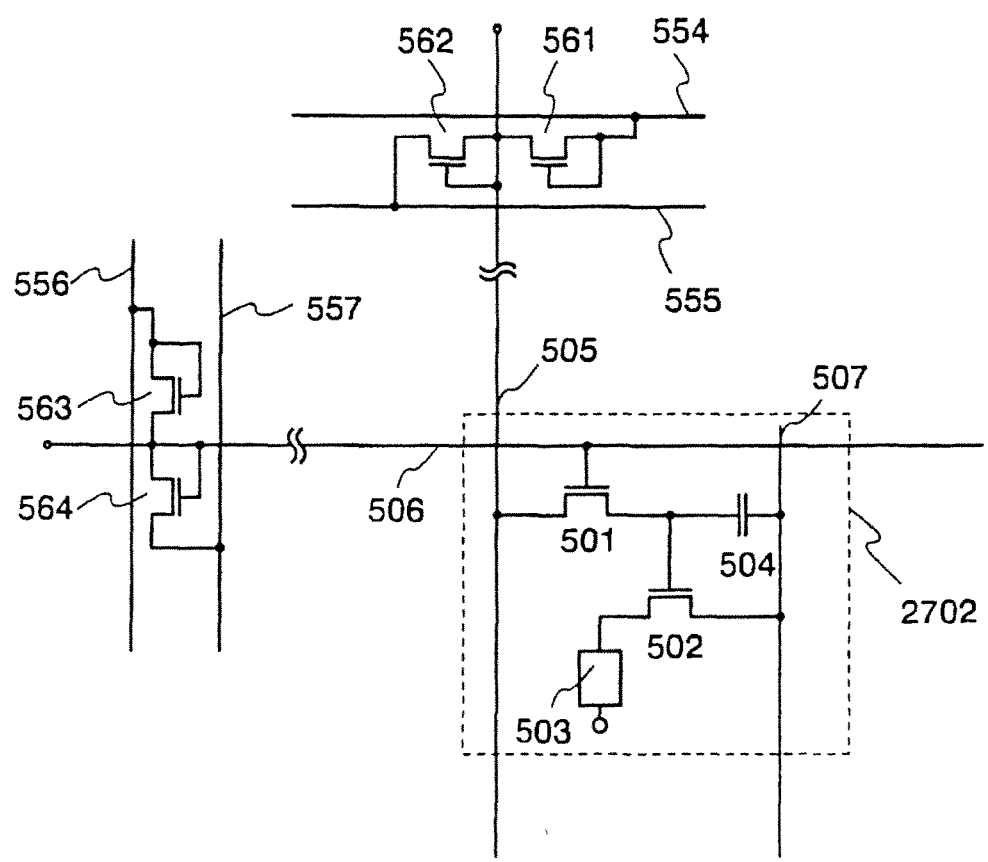
Figure 15:
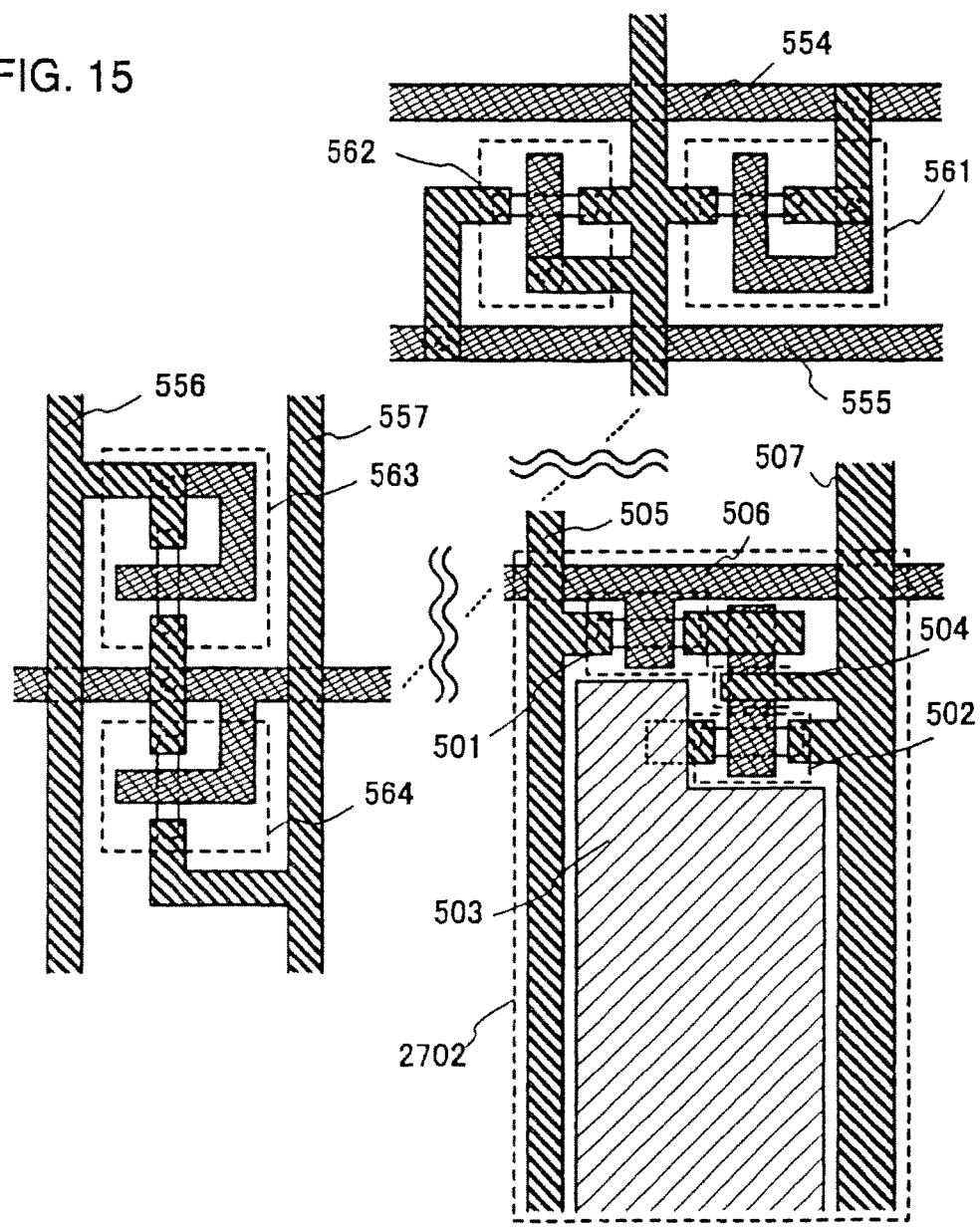
FIG. 15 Top views describing a display device of the present invention
Figure 16:
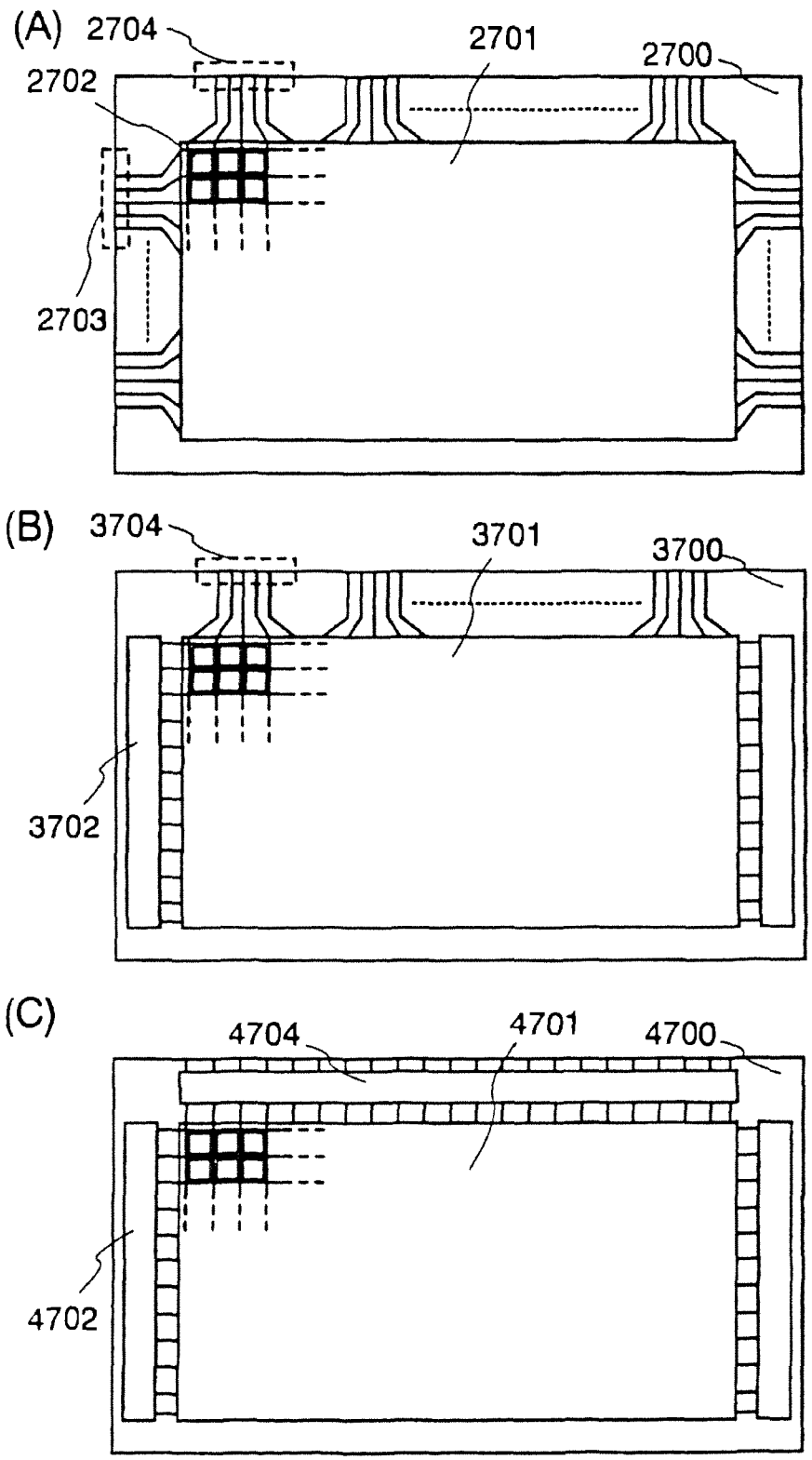
FIG. 16 Top views of a display device of the present invention
Figure 17:
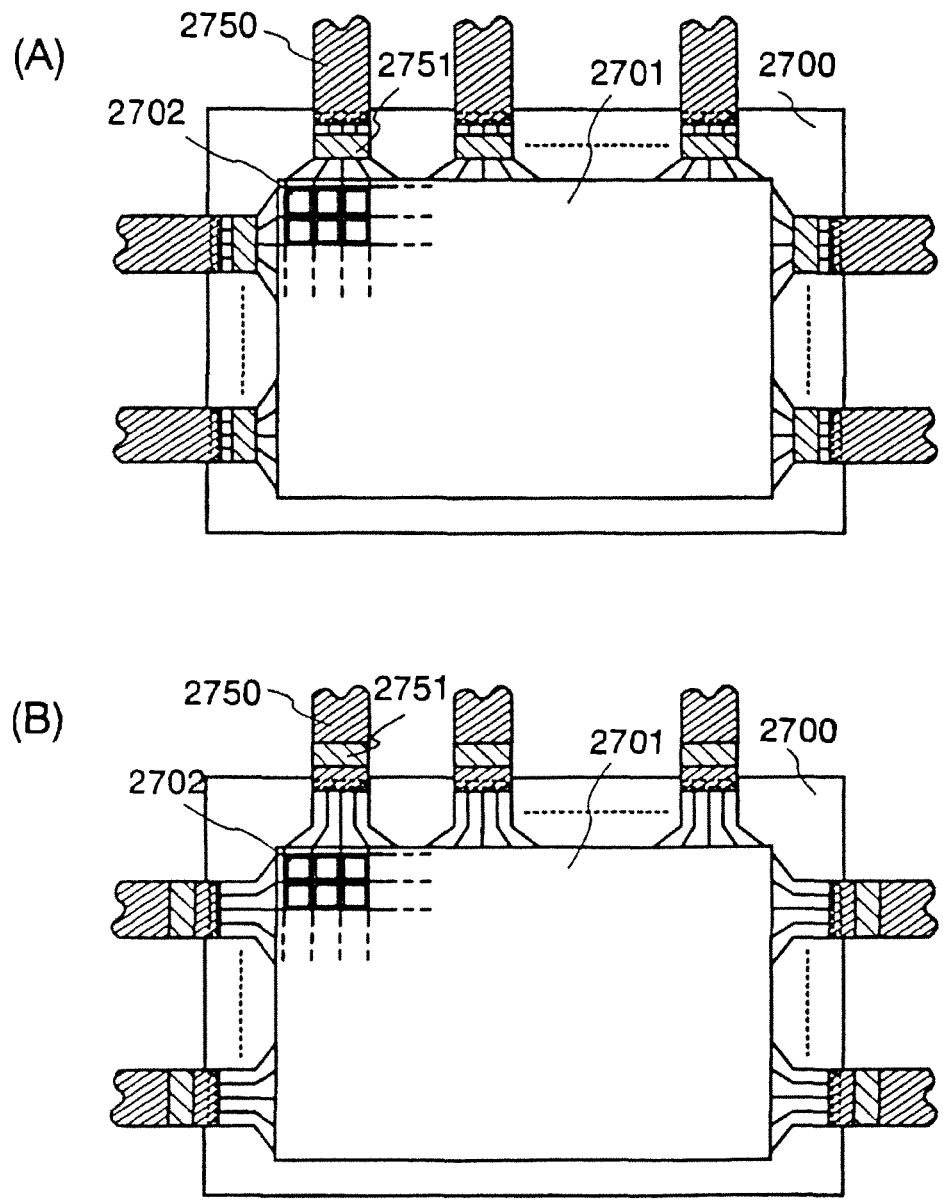
FIG. 17 Top views of a display device of the present invention
Figure 18:
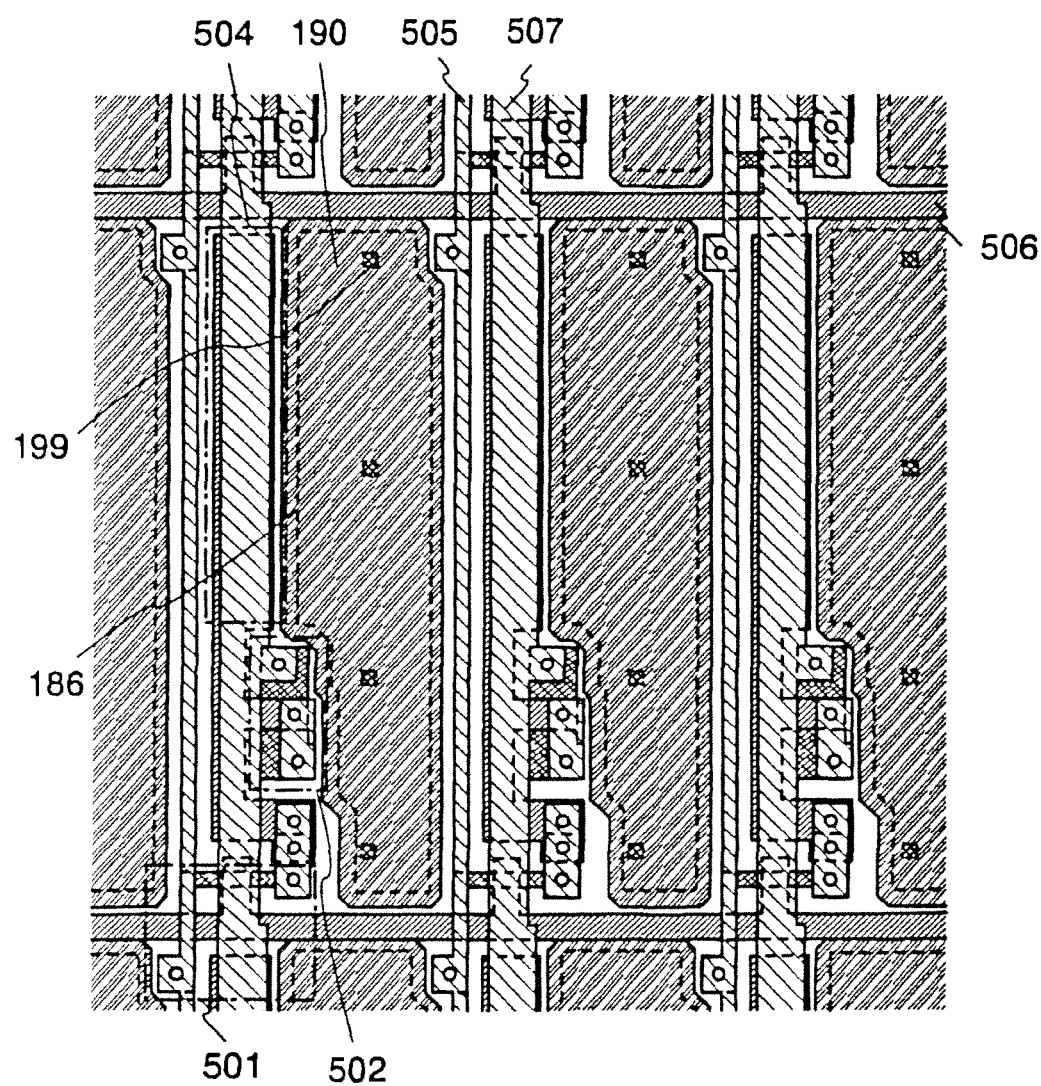
FIG. 18 A top view of a display device of the present invention
Figure 19:
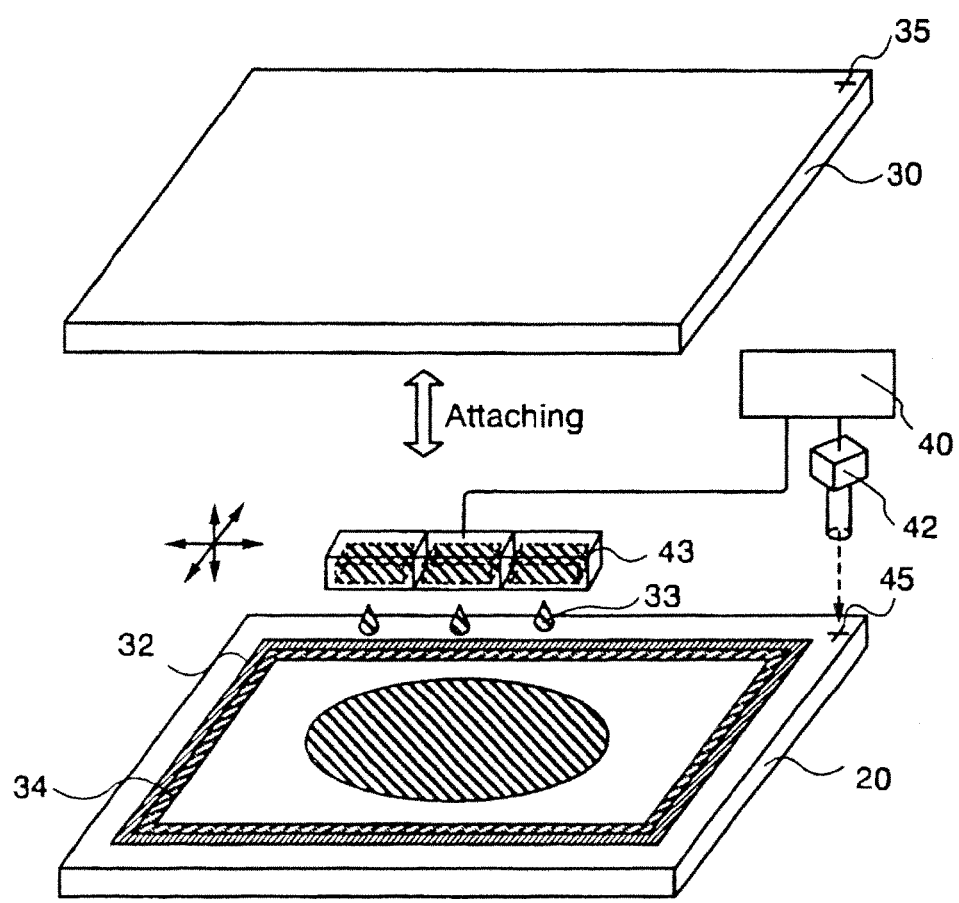
FIG. 19 A diagram illustrating a dropping injection method that can be applied to the present invention FIG. 20 Diagrams illustrating electronic devices to which the present invention can be applied FIG. 21 Diagrams illustrating electronic devices to which the present invention can be applied FIG. 22 Diagrams describing display devices of the present invention FIG. 23 A diagram describing a display device of the present invention
Figure 22:
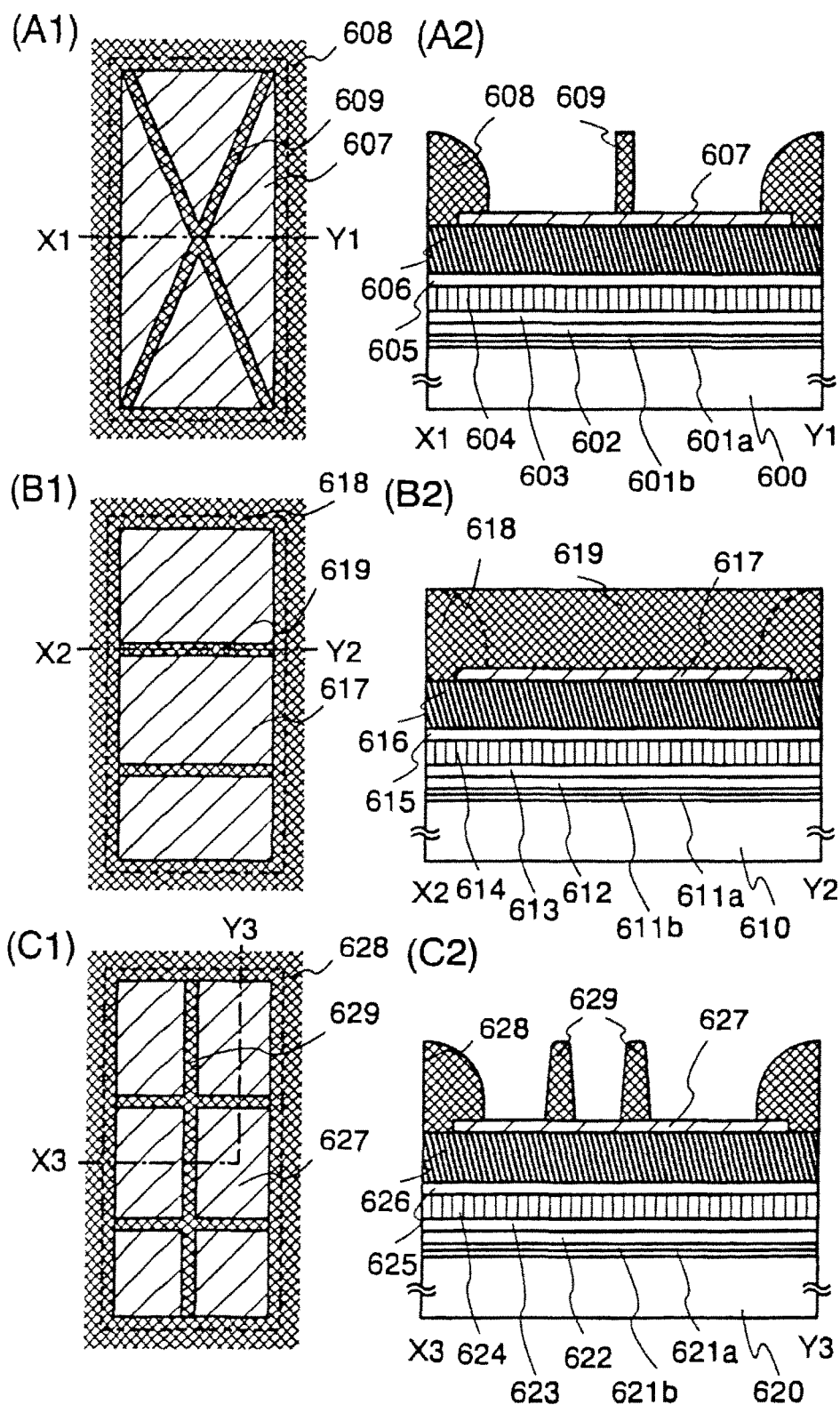
Figure 23:
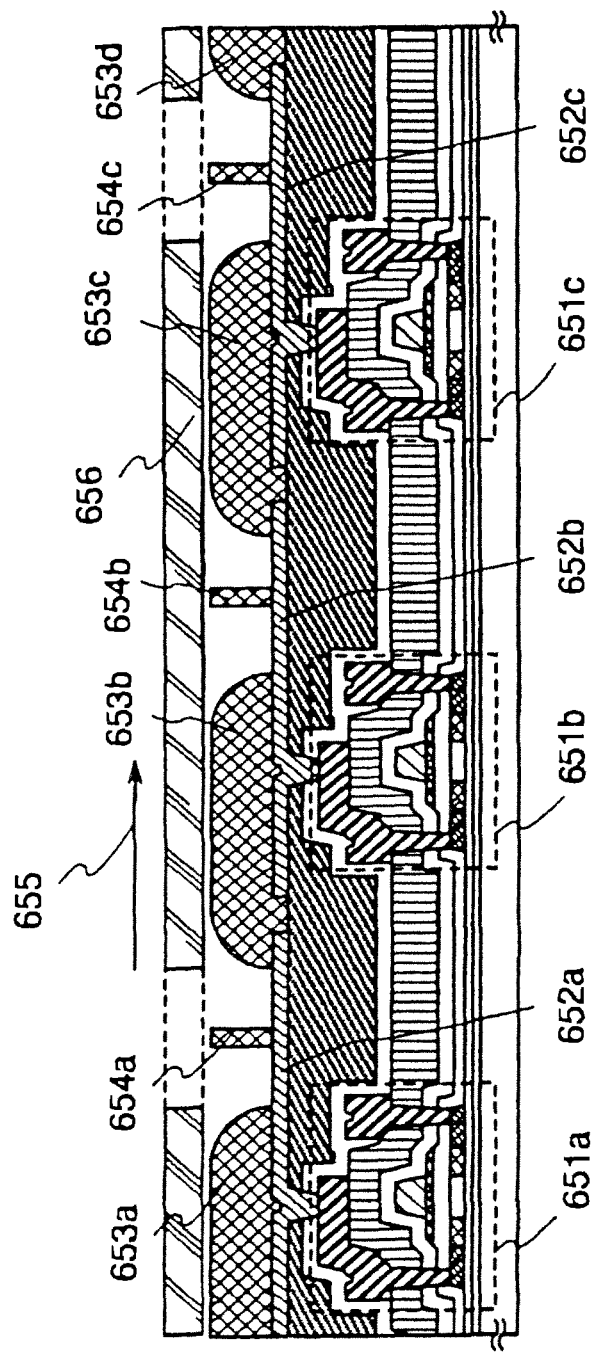

What is claimed is:

1. A display device comprising:
a first electrode having an island shape;
a first insulating layer over the first electrode, the first insulating layer having an opening overlapping with the first electrode;
a second insulating layer over the first electrode, an entirety of the second insulating layer overlapping with the first electrode,
wherein the second insulating layer is provided in the opening.

2. The display device according to claim 1, wherein the second insulating layer is in direct contact with the first electrode.

3. The display device according to claim 1, wherein an edge portion of the first electrode is covered by the first insulating layer.

4. The display device according to claim 1, wherein the first insulating layer and the second insulating layer are formed from a same layer.

5. The display device according to claim 1, wherein the second insulating layer is formed of silicon oxide, silicon nitride, silicon oxynitride, aluminum oxide, aluminum nitride, or aluminum oxynitride.

6. The display device according to claim 1, wherein the second insulating layer is formed of acrylic or polyimide.

7. The display device according to claim 1,
wherein the first electrode is a pixel electrode,
wherein the first insulating layer is a partition wall, and
wherein the second insulating layer is a spacer.

8. The display device according to claim 1, wherein the second insulating layer is in contact with the first electrode.

9. A display device comprising:
a first electrode having an island shape;
an first insulating layer over the first electrode, the first insulating layer having an opening overlapping with the first electrode;
a plurality of second insulating layers over the first electrode, the plurality of second insulating layers overlapping with the first electrode,
wherein the plurality of second insulating layers is provided in the opening, and
wherein the first electrode and an entirety of a bottom surface of the second insulating layer overlap with each other, the bottom surface being on the first electrode.

10. The display device according to claim 9, wherein the plurality of second insulating layers is in direct contact with the first electrode.

11. The display device according to claim 9, wherein an edge portion of the first electrode is covered by the first insulating layer.

12. The display device according to claim 9, wherein the first insulating layer and the second insulating layer are formed from a same layer.

13. The display device according to claim 9, wherein the plurality of second insulating layers is formed of silicon oxide, silicon nitride, silicon oxynitride, aluminum oxide, aluminum nitride, or aluminum oxynitride.

14. The display device according to claim 9, wherein the plurality of second insulating layers is formed of acrylic or polyimide.

15. The display device according to claim 9,
wherein the first electrode is a pixel electrode,
wherein the first insulating layer is a partition wall, and
wherein the plurality of second insulating layers is a plurality of spacers.

16. The display device according to claim 9, wherein the second insulating layer is in contact with the first electrode.

* * * * *